United States Patent
Choi et al.

(10) Patent No.: US 8,928,132 B2
(45) Date of Patent: Jan. 6, 2015

(54) SEMICONDUCTOR PACKAGE HAVING THROUGH SILICON VIA (TSV) INTERPOSER AND METHOD OF MANUFACTURING THE SEMICONDUCTOR PACKAGE

(75) Inventors: YunSeok Choi, Hwasung-si (KR); ChungSun Lee, Anyang-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 784 days.

(21) Appl. No.: 13/188,554

(22) Filed: Jul. 22, 2011

(65) Prior Publication Data

US 2012/0211885 A1   Aug. 23, 2012

(30) Foreign Application Priority Data

Feb. 17, 2011   (KR) .................. 10-2011-0014145

(51) Int. Cl.
*H01L 23/02*   (2006.01)
*H01L 21/56*   (2006.01)
*H01L 23/31*   (2006.01)
*H01L 25/10*   (2006.01)
*H01L 23/14*   (2006.01)
*H01L 23/498*   (2006.01)
*H01L 21/48*   (2006.01)

(52) U.S. Cl.
CPC .......... *H01L 21/563* (2013.01); *H01L 23/3128* (2013.01); *H01L 25/105* (2013.01); *H01L 2224/32225* (2013.01); *H01L 2224/73204* (2013.01); *H01L 2225/1023* (2013.01); *H01L 2225/1058* (2013.01); *H01L 23/147* (2013.01); *H01L 23/49827* (2013.01); *H01L 21/486* (2013.01); *H01L 2221/68331* (2013.01); *H01L 2224/131* (2013.01); *H01L 2224/16227* (2013.01); *H01L 2224/81815* (2013.01); *H01L 2924/15311* (2013.01); *H01L 2924/18161* (2013.01); *H01L 2224/16225* (2013.01)

USPC ............ 257/686; 257/E25.006; 257/E25.021; 257/E25.27; 257/E23.085

(58) Field of Classification Search
USPC ........... 257/686, E25.006, E25.013, E25.021, 257/E25.027, E23.085
See application file for complete search history.

(56) References Cited

U.S. PATENT DOCUMENTS

| | | |
|---|---|---|
| 5,977,640 A | 11/1999 | Bertin et al. |
| 6,297,551 B1 | 10/2001 | Dudderar et al. |
| 6,765,299 B2 | 7/2004 | Takahashi et al. |
| 7,405,477 B1 | 7/2008 | Tao et al. |
| 7,405,485 B2 | 7/2008 | Tanida et al. |
| 7,550,680 B2 | 6/2009 | Pendse |

(Continued)

FOREIGN PATENT DOCUMENTS

| | | |
|---|---|---|
| JP | 2008-016519 | 1/2008 |
| JP | 2008-071953 | 3/2008 |

(Continued)

*Primary Examiner* — Jasmine Clark
(74) *Attorney, Agent, or Firm* — Muir Patent Consulting, PLLC

(57) ABSTRACT

A semiconductor package having a reduced size by including an interposer having through substrate vias (TSVs), the semiconductor package may comprise a lower semiconductor package which includes a lower base substrate, an interposer with TSVs on the lower base substrate, and a lower semiconductor chip on the interposer and electrically connected to the interposer. The semiconductor package may include an upper semiconductor package on the lower semiconductor package including an upper semiconductor chip and package connecting members on the interposer and electrically connect the upper semiconductor package to the interposer. An exterior molding member may be provided.

39 Claims, 33 Drawing Sheets

(56) References Cited

U.S. PATENT DOCUMENTS

| | | |
|---|---|---|
| 7,777,351 B1 | 8/2010 | Berry et al. |
| 7,847,413 B2 | 12/2010 | Akiba et al. |
| 7,928,552 B1 | 4/2011 | Cho et al. |
| 8,076,184 B1 | 12/2011 | Camacho et al. |
| 8,080,445 B1 | 12/2011 | Pagaila |
| 8,093,711 B2 | 1/2012 | Zudock et al. |
| 8,143,710 B2 | 3/2012 | Cho |
| 8,426,961 B2 | 4/2013 | Shih et al. |
| 8,446,017 B2 | 5/2013 | Paek et al. |
| 8,455,995 B2 | 6/2013 | Tsai et al. |
| 2001/0028114 A1* | 10/2001 | Hosomi ................ 257/778 |
| 2001/0038151 A1 | 11/2001 | Takahashi et al. |
| 2002/0135057 A1 | 9/2002 | Kurita |
| 2006/0001179 A1 | 1/2006 | Fukase et al. |
| 2008/0017968 A1 | 1/2008 | Choi et al. |
| 2008/0128882 A1 | 6/2008 | Baek et al. |
| 2008/0251913 A1 | 10/2008 | Inomata |
| 2009/0065949 A1 | 3/2009 | Yim et al. |
| 2009/0146301 A1 | 6/2009 | Shimizu et al. |
| 2009/0286108 A1 | 11/2009 | Kim et al. |
| 2010/0019368 A1 | 1/2010 | Shin |
| 2010/0055834 A1 | 3/2010 | Ohuchi |
| 2010/0109138 A1 | 5/2010 | Cho |
| 2010/0276800 A1 | 11/2010 | Yanase et al. |
| 2011/0068427 A1 | 3/2011 | Paek et al. |
| 2011/0115081 A1 | 5/2011 | Osumi |
| 2011/0223721 A1 | 9/2011 | Cho et al. |
| 2011/0254160 A1 | 10/2011 | Tsai et al. |
| 2011/0278721 A1 | 11/2011 | Choi et al. |
| 2011/0278741 A1 | 11/2011 | Chua et al. |
| 2011/0316147 A1 | 12/2011 | Shih et al. |
| 2012/0038064 A1 | 2/2012 | Camacho et al. |
| 2012/0104623 A1 | 5/2012 | Pagaila et al. |
| 2012/0211885 A1 | 8/2012 | Choi et al. |
| 2013/0001797 A1 | 1/2013 | Choi et al. |

FOREIGN PATENT DOCUMENTS

| | | |
|---|---|---|
| JP | 2008-118152 | 5/2008 |
| JP | 2009-152253 | 7/2009 |
| JP | 2010-062292 | 3/2010 |
| JP | 2010-103129 | 5/2010 |
| JP | 2010-262992 | 11/2010 |
| KR | 10-0800478 | 1/2008 |
| KR | 2008004356 | 1/2008 |
| KR | 10-0840788 | 6/2008 |
| KR | 10-0961311 | 8/2009 |
| WO | WO 2007083351 | 7/2007 |

* cited by examiner

SEMICONDUCTOR PACKAGE HAVING THROUGH SILICON VIA (TSV) INTERPOSER AND METHOD OF MANUFACTURING THE SEMICONDUCTOR PACKAGE

CROSS-REFERENCE TO RELATED PATENT APPLICATION

This application claims the benefit under 35 U.S.C. §119 of Korean Patent Application No. 10-2011-0014145, filed on Feb. 17, 2011, in the Korean Intellectual Property Office, the disclosure of which is incorporated herein in its entirety by reference.

BACKGROUND

The disclosure relates to semiconductor packages, and more particularly, to a semiconductor package including an interposer with a through substrate via (TSV), and a method of manufacturing the semiconductor package.

With the development of electronic industry, light, small, fast, and high-performance electronic products can be provided at a low price. According to recent trends in the electronic industry, semiconductor devices in which a plurality of semiconductor chips or semiconductor packages are implemented into a single package are attracting much attention. Various research into miniaturization and high integration of such semiconductor devices have been made.

SUMMARY

A semiconductor package is disclosed herein including: a lower semiconductor package which includes a lower base substrate; an interposer which is located on the lower base substrate and includes through substrate vias (TSVs); and a lower semiconductor chip which is mounted on the interposer and electrically connected to the interposer; an upper semiconductor package which is located on the lower semiconductor package and includes an upper semiconductor chip; and package connecting members which are located on the interposer and electrically connect the upper semiconductor package to the interposer.

A method of manufacturing a semiconductor package is also disclosed, the method including: providing an interposer having TSVs; attaching first package connecting members onto the interposer; attaching a lower semiconductor chip onto the interposer substrate; forming a lower molding member that seals the lower semiconductor chip; removing the lower molding member located on the lower semiconductor chip. The method may further include attaching an auxiliary substrate onto the lower semiconductor chip; exposing the TSVs by removing a lower portion of the interposer substrate; removing the auxiliary substrate. The method may further comprise forming a plurality of interposers to which multiple ones of the lower semiconductor chip are electrically connected, by dicing an interposer wafer.

BRIEF DESCRIPTION OF THE DRAWINGS

Exemplary embodiments of will be more clearly understood from the following detailed description taken in conjunction with the accompanying drawings in which.

DETAILED DESCRIPTION OF THE EMBODIMENTS

Figure 1:
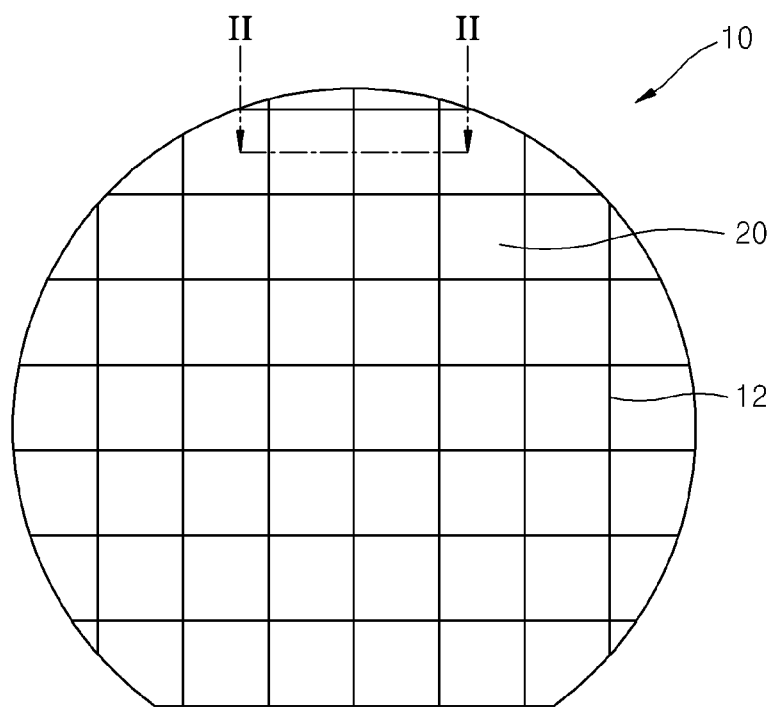
FIG. 1 is a top view of an interposer wafer according to some embodiments.

Exemplary embodiments will now be described more fully with reference to the accompanying drawings.

The invention may, however, be embodied in many different forms and should not be construed as being limited to the embodiments set forth herein; rather, these embodiments are provided so that this disclosure will be thorough and complete. In the drawings, the thicknesses or sizes of layers may be exaggerated for clarity and convenience of explanation.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification. As used herein the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "above", "upper", "below", "lower" and the like, may be used herein to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Variations from the shapes of the illustrations may result, for example, from manufacturing techniques and/or acceptable tolerances. Thus, unless explicitly claimed, the invention should not be construed as being limited to the particular shapes of regions illustrated herein but may include deviations in shapes that result, for example, from manufacturing. For example, an edge or corner region illustrated as having sharp edges may have somewhat rounded or curved features. Likewise, elements illustrated as circular or spherical may be oval in shape or may have certain straight or flattened portions. As another example, the term "same" as used herein when referring to shapes, sizes, amounts, or other measures does not necessarily mean exactly the same, but is intended to encompass nearly identical measures within acceptable variations that may occur, for example, due to manufacturing processes.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
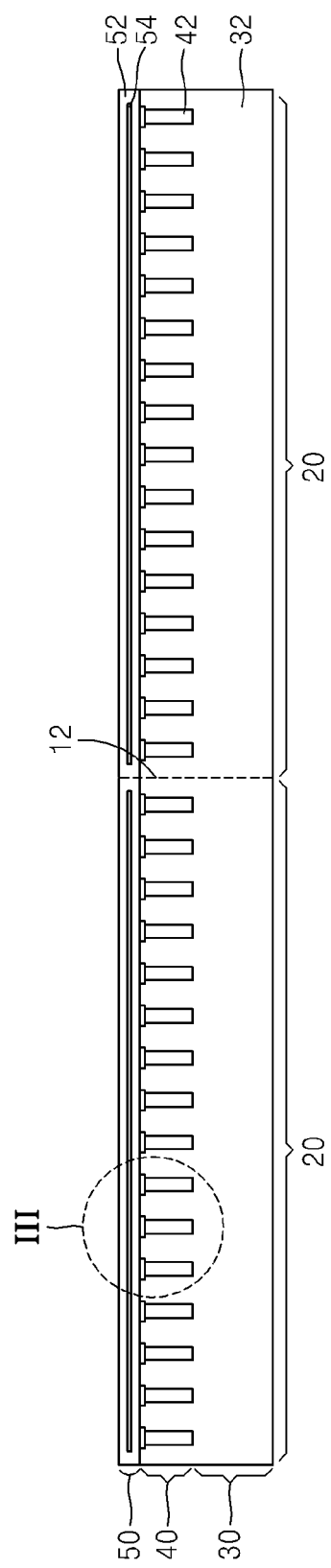
FIG. 2 is a cross-sectional view of the interposer wafer of FIG. 1, taken along line II-II of FIG. 1.

FIG. 1 is a top view of an interposer wafer 10 according to some embodiments. FIG. 2 is a cross-sectional view of the interposer wafer 10 taken along line II-II of FIG. 1.

Referring to FIGS. 1 and 2, the interposer wafer 10 may comprise a wafer amenable to standard semiconductor manufacturing processes. For example, the wafer interposer 10 may be a 200 (8 inch), 300 mm (12 inch) or 450 mm (18 inch) wafer. The wafer interposer 10 may be formed of a semiconductor, such as silicon (which may be crystalline silicon), glass, or some other such substrate (e.g., silicon on insulator, which may be amorphous, polycrystalline or crystalline silicon formed on glass). Alternatively, or in addition, the wafer interposer 10 may be formed of a rigid material, having a Young's modulus of 100 GPa or more. The interposer 10 may have a smooth and/or flat surface. As one example, the rms (root mean square) surface roughness of the wafer may be 1.5 nm or less. The interposer wafer 10 may include a plurality of interposer elements 20, which, when separated from the interposer 10 by subsequent processing, may constitute individual interposer chips 20. The plurality of interposer elements 20 may be divided and defined by scribe lines 12. Alternatively, the interposer elements/chips 20 may be replaced by semiconductor integrated circuit dies (e.g., still combined on a wafer) or semiconductor integrated circuit chips (e.g., integrated circuit dies separated from the wafer).

The interposer wafer 10 may include a lower portion 30, an upper portion 40 located on the lower portion 30, and a wiring portion 50 located on the upper portion 40. The upper portion 40 may include vias 42 buried into upper portion 40. The vias 42 may not extend into lower portion 30. The lower portion 30 may be removed during a process of manufacturing a semiconductor package 1, such as that described with respect to FIG. 7, for example, during a thinning process. With the removal of lower portion 30, vias 42 will extend through upper portion 40 and constitute through substrate vias (TSVs) 42 of interposer 10. The through-substrate vias 42 may be through silicon vias when the interposer base portion 32 is formed of silicon.

wafer 10 The thickness of the combination of the upper portion 40 and the lower portion 30, wafer 10 may be sufficient for the interposer 10 and/or interposer chips 20 to serve as a carrier substrate.

The lower portion 30 and the upper portion 40 may compose a base portion 32 which may serve as a substrate for the interposer 10. The base portion 32 may be formed of a wafer formed of a semiconductor material or an insulating material, for example, silicon, germanium, silicon-germanium, gallium-arsenic (GaAs), glass, ceramic, silicon-on-insulator, or the like. The base portion 32 may be an undoped material.

The wiring portion 50 may include an insulating layer 52 and wiring patterns 54 located within the insulating layer 52. The wiring patterns 54 may be electrically connected to the vias 42. The insulating layer 52 may include oxide, nitride, or oxynitride, for example, silicon oxide, silicon nitride, or silicon oxynitride. The wiring patterns 54 may include metal, may include at least a material used to form the vias 42 as described above, or may include the same material as the TSVs 42. The wiring patterns 54 may be re-wiring patterns. In some embodiments, some or all of the vias 42 may be formed to penetrate the wiring portion 50. The vias 42 may be exposed from the upper surface of the interposer 10.

Figure 3:
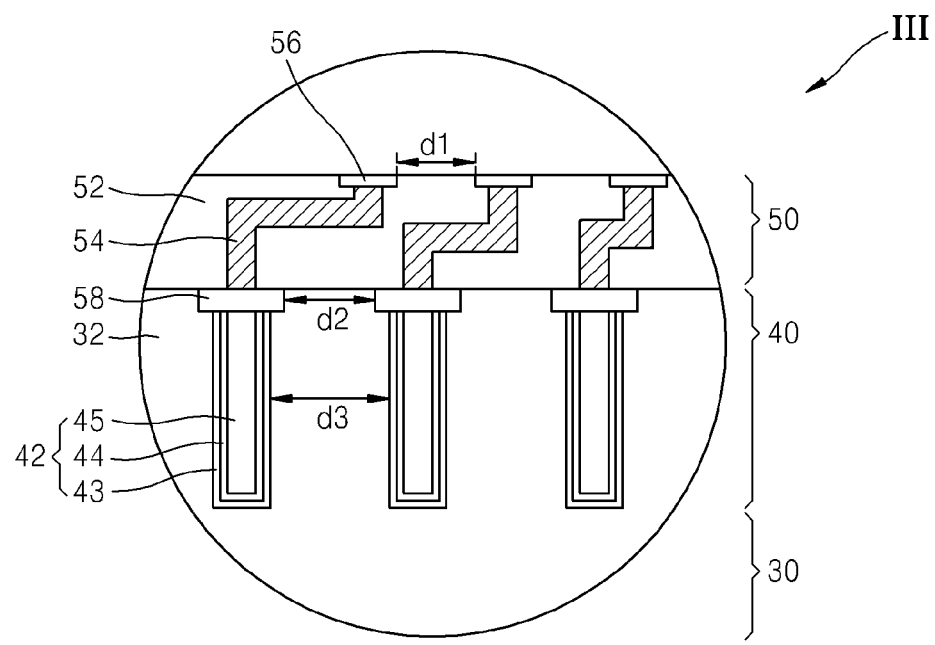
FIG. 3 is a magnified cross-sectional view of a region III of the interposer wafer illustrated in FIG. 2.
Figure 4:
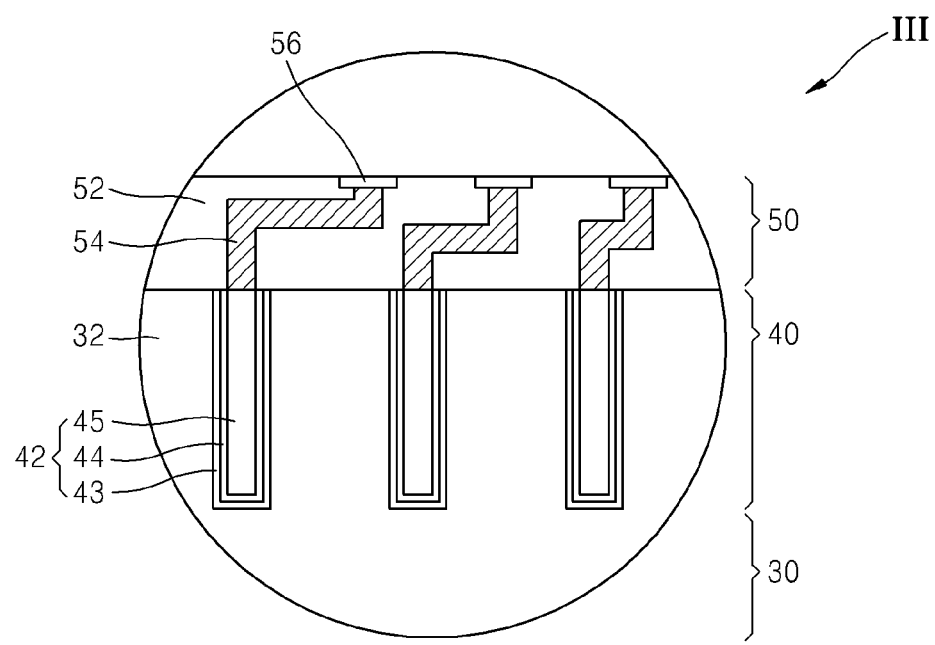
FIG. 4 is a magnified cross-sectional view of a region III of the interposer wafer illustrated in FIG. 2, according to another embodiment.

FIG. 3 is a magnified cross-sectional view of a region III of the interposer wafer 10 illustrated in FIG. 2, according to an embodiment. FIG. 4 is a magnified cross-sectional view of a region III of the interposer wafer 10 illustrated in FIG. 2, according to another embodiment.

Referring to FIG. 3, the upper portion 40 of the interposer wafer 10 may include upper pads 58 and the vias 42. The wiring portion 50 of the interposer wafer 10 may include the wiring patterns 54 and wiring pattern pads 56. The upper pads 58 may be electrically and/or physically connected to the vias 42. The wiring pattern pads 56 may also be electrically and/or physically connected to a semiconductor chip 130 (see FIG. 7) mounted on the interposer wafer 10. The wiring patterns 54 may electrically connect the wiring pattern pads 56 to the upper pads 58 or may electrically connect the wiring pattern pads 56 to the vias 42. The wiring pattern pads 56 may be more densely arranged than the upper pads 58 or the vias 42. For example, a pitch distance d1 between the wiring pattern pads 56 may be smaller than a pitch distance d2 between the upper pads 58, and may be smaller than a pitch distance d3 between the vias 42. In this case, the wiring patterns 54 may serve as re-wiring patterns.

At least some of the wiring pattern pads 56 may have smaller sizes than the upper pads 58. The wiring pattern pads 56 and the upper pads 58 may include a conductive material, or may include a material used to form the wiring patterns 54, for example, the same material as that of the wiring patterns 54.

Each of the vias 42 may have a structure in which an insulating layer 43, a seed layer 44, and a conductive layer 45 are sequentially formed. The insulating layer 43 may electrically insulate the conductive layer 45 from the base portion 32. The insulating layer 43 may include oxide, nitride, or oxynitride, for example, silicon oxide, silicon nitride, or silicon oxynitride. The conductive layer 45 may include a conductive material, for example, metal. The seed layer 44 and/or the conductive layer 45 may include, for example, at least one selected from the group consisting of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), lutetium (Ru), tantalum (Ta), tellurium (Te), titanium (Ti), tungsten (W), zinc (Zn), and zirconium (Zr). The insulating layer 43, the seed layer 44, and the conductive layer 45 constituting each via 42 may be formed by chemical vapor deposition (CVD), plasma enhanced CVD (PECVD), high-density plasma CVD (HDP-CVD), sputtering, metal organic CVD (MOCVD), or atomic layer deposition (ALD).

Referring to FIG. 4, the upper portion 40 of the interposer wafer 10 may include the vias 42 and may not include the upper pads 58. In this case, the wiring patterns 54 included in the wiring portion 50 of the interposer wafer 10 may be physically connected to the vias 42 and thus electrically connected thereto. Although the area of the upper portion of each via 42 is equal to that of the lower portion of each wiring pattern 54 contacting the upper portion of each via 42 in FIGS. 3 and 4, the invention is not limited thereto. For example, the area of the upper portion of each via 42 may be less than or greater than that of the lower portion of each wiring pattern 54 contacting the upper portion of each via 42.

Figure 5:
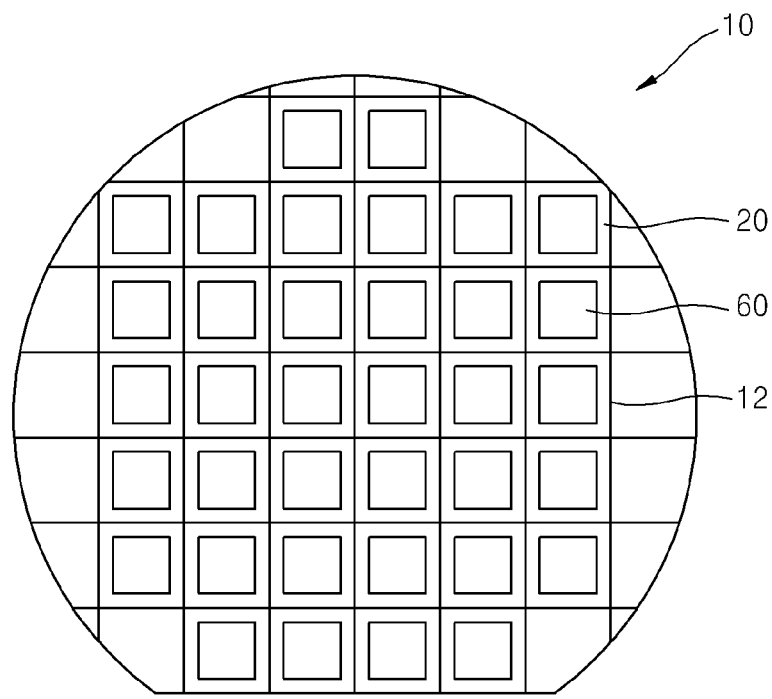
FIGS. 5 and 6 are top views of a case where semiconductor chips are mounted on the interposer wafer illustrated in FIG. 1.
Figure 6:
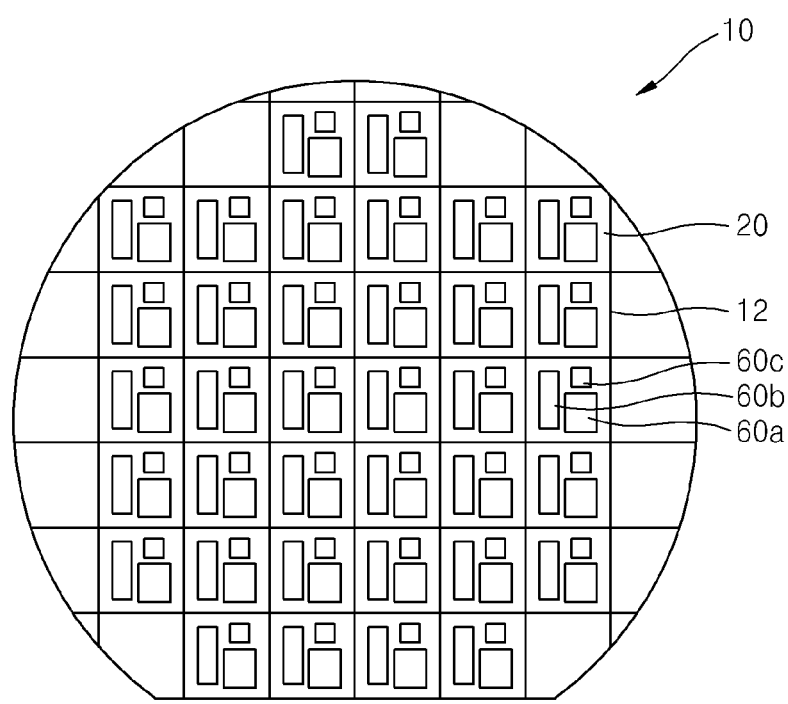

FIGS. 5 and 6 are top views illustrating the cases where semiconductor chips are mounted on the interposer wafer 10.

Referring to FIG. 5, a single semiconductor chip 60 is mounted on each of the interposer elements 20 of the interposer wafer 10. As shown in the blown-up portion of FIG. 5, a plurality of package connecting members 70 are mounted on the interposer wafer 10. The package connecting members may comprise bumps, pads, etc., and may have the various configurations as further described herein. Each package connecting member 70 may have an electrical connection to a corresponding TSV (or via to be later formed into a TSV) formed in the interposer wafer 10. Each of these electrical connections may be formed via the wiring pattern 50 of the interposer wafer 10.

Referring to FIG. 6, plural discrete devices, here, semiconductor chips 60a, 60b, and 60c are mounted on each of the interposer elements 20 of the interposer wafer 10. As shown in the blown-up portion of FIG. 6, a plurality of package connecting members 70 are mounted on the interposer wafer 10. The package connecting members may comprise bumps, pads, etc., and may have the various configurations as further described herein. Each package connecting member 70 may have an electrical connection to a corresponding TSV (or via to be later formed into a TSV) formed in the interposer wafer 10. Each of these electrical connections may be formed via the wiring pattern 50 of the interposer wafer 10.

In one example, semiconductor chips 60, 60a, 60b, and 60c may be logic semiconductor chips or memory semiconductor chips. The logic semiconductor chips may be micro-processors, for example, central processing units (CPUs), controllers, application specific integrated circuits (ASICs), or the like. The memory semiconductor chips may be volatile memories such as DRAMs (dynamic random access memories) and/or SRAMs (static random access memories), and/or nonvolatile memories such as flash memories. For example, the semiconductor chips 60a, 60b, and 60c may be a combination of at least one logic semiconductor chip and at least one DRAM chip.

Figure 7:
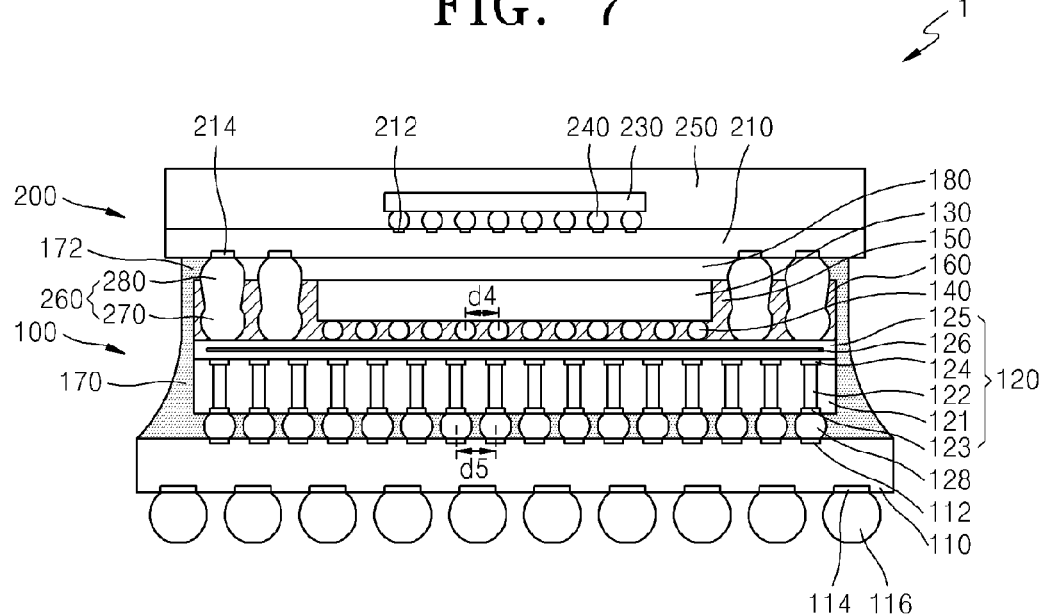
FIG. 7 is a cross-sectional view of a semiconductor package according to some embodiments.

FIG. 7 is a cross-sectional view of a semiconductor package 1 according to some embodiments.

Referring to FIG. 7, the semiconductor package 1 may include a lower semiconductor package 100, an upper semiconductor package 200, and package connecting members 260.

The lower semiconductor package 100 may include a lower base substrate 110, an interposer 120 located on the lower base substrate 110 and having TSVs 122, and a lower semiconductor chip 130 mounted on the interposer 120 and electrically connected to the interposer 120.

The upper semiconductor package 200 may be located on the lower semiconductor package 100 and may include an upper semiconductor chip 230. The upper semiconductor package 200 may include an upper molding member 250 which seals the upper semiconductor chip 230.

The package connecting members 260 may be located on the interposer 120 and may electrically connect the upper semiconductor package 200 to the interposer 120. The package connecting members 260 may be located, for example, outside of the lower semiconductor chip 130. The semiconductor package 1 may further include an exterior molding member 170 that seals the interposer 120.

The lower semiconductor package 100 will now be described in detail.

The lower base substrate 110 may comprise glass, ceramic, or plastic. The lower base substrate 110 may be a substrate for semiconductor packages, for example, a printed circuit board (e.g., polyimide, FR-4, etc.), a ceramic substrate, or a tape wiring substrate. Upper pads 112 may be located on the upper surface of the lower base substrate 110, and lower pads 114 may be located on the lower surface of the lower base substrate 110.

External connecting members 116 may be located on the lower pads 114 of the lower base substrate 110 to be electrically and/or physically connected to the lower pads 114. The lower base substrate 110 may be electrically connected to the outside via the external connecting members 116. Accordingly, the lower semiconductor package 100, the upper semiconductor package 200, and both of them may be electrically connected to the outside via the external connecting members 116. The external connecting members 116 may be, for example, solder balls. Alternatively, the external connecting members 116 may form a flipchip connection structure having a grid array such as a pin grid array, a ball grid array, or a land grid array. In some embodiments, the lower base substrate 110 and external connecting members 116 may comprise the package substrate and package terminals for the semiconductor package 1. For example, the external connecting members 116 may form the package terminals to provide all external communications for the chips within the semiconductor package 1 and a system printed circuit board on which the semiconductor package 1 is mounted (e.g., a motherboard of a computer, a printed circuit board of a portable electronic device, etc.). In one example, the lower base substrate 110 may be composed of only two PCB layers (an upper PCB layer stacked on a lower PCB layer) and only three wiring layers. The first wiring layer may be a redistribution wiring layer on a top surface of the lower base substrate 110, the second wiring layer may be a redistribution wiring layer on the lower surface of the lower base substrate and the third wiring layer may be a redistribution wiring layer formed between the two PCB layers. The two PCB layers of the lower base substrate 110 may include vias connecting wirings of the wiring layers at their opposite surfaces to form desired electrical connections, e.g., as further discussed herein.

The interposer 120 may be located on the lower base substrate 110. The interposer 120 may correspond to the interposer element 20 described with reference to FIGS. 1 and 2. The interposer 120 may include a base layer 121, TSVs 122, first pads 123, second pads 124, an insulating layer 125, and a wiring pattern layer 126.

The first pads 123 may be located on the lower surface of the base layer 121, and the second pads 124 may be located on the upper surface of the base layer 121. The second pads 124 may correspond to the upper pads 58 described with reference to FIG. 3. The base layer 121 may include an insulating material as described with reference to FIG. 2.

The TSVs 122 may penetrate a part of the base layer 121. The TSVs 122 may include a conductive material as described with reference to base portion 32 of FIG. 2. The TSVs 122 may electrically connect the first pads 123 to the second pads 124, respectively. In other words, the TSVs 122 may provide electrical connection paths between the first pads 123 to the second pads 124.

The insulating layer 125 may be located on the base layer 121. The insulating layer 125 may include a wiring pattern layer 126 having a wiring pattern. The wiring pattern layer 126 may be electrically and/or physically connected to the second pads 124 of the interposer 120. Accordingly, the wiring pattern layer 126 may be electrically connected to the TSVs 122. The wiring pattern layer 126 may also be electrically and/or physically connected to the lower semiconductor chip 130 and the package connecting members 260. The wiring pattern layer 126 may include the wiring patterns 54 described above with reference to FIG. 3. The wiring pattern layer 126 may function and/or be comprised as a re-wiring pattern as described above with reference to the wiring portion 50 of FIG. 3.

Interposer connecting members 128 may be located below the base layer 121. The interposer connecting members 128 may be electrically and/or physically connected to the first pads 123 of the interposer 120. The interposer connecting members 128 may be electrically and/or physically connected to the upper pads 112 of the lower base substrate 110. Accordingly, the TSVs 122 may be electrically connected to the lower base substrate 110 via the interposer connecting members 128. The interposer connecting members 128 may be, for example, solder balls. Alternatively, the interposer connecting members 128 may form a flipchip connection structure having a grid array such as a pin grid array, a ball grid array, or a land grid array.

The lower semiconductor chip 130 may be located on the interposer 120. The lower semiconductor chip 130 may be a logic semiconductor chip or a memory semiconductor chip as described above. Lower connecting members 140 may be located below the lower semiconductor chip 130. The lower semiconductor chip 130 may be electrically connected to the wiring pattern layer 126 of the interposer 120 via the lower connecting members 140. The lower semiconductor chip 130 may be connected in a face-down configuration to the interposer 120. The lower semiconductor chip 130 may also be electrically connected to the TSVs 122 via the lower connecting members 140. Although the lower connecting members 140 may be solder balls, the invention is not limited thereto. For example, the lower connecting members 140 may be bonding wires. Alternatively, the lower connecting members 140 may form a flipchip connection structure having a grid array such as a pin grid array, a ball grid array, or a land grid array.

The lower connecting members 140 may be arranged more densely than the interposer connecting members 128. For example, a pitch distance d4 between centers of the lower connecting members 140 may be less than a pitch distance d5 between centers of the interposer connecting members 128. The lower connecting members 140 may have smaller sizes than the interposer connecting members 128. In this case, the wiring pattern layer 126 having a wiring pattern corresponding to the wiring pattern 54 described above with reference to FIG. 3 may function as a re-wiring pattern.

The lower semiconductor chip 130 may be sealed by the lower molding member 150, and accordingly may be protected from external impacts. An upper surface of the lower semiconductor chip 130 may be exposed from the lower molding member 150.

The lower molding member 150 may include the package connecting members 260. The package connecting members 260 will now be described in detail.

The lower molding member 150 may include an underfill member 151 (see FIGS. 23 through 28) located below the lower semiconductor chip 130, that is, filling a space between the lower connecting members 140, and a lateral side molding member 152 (see FIGS. 23 through 28) which is located on the underfill member 151 and seals the lateral side of the lower semiconductor chip 130. The lower molding member 150 may be formed by a molded underfilling (MUF) technique. The lower molding member 150 may comprise an insulation material. The upper molding member 250 and the lower molding member 150 may be composed of the same material or different materials. The lower molding member 150 will be described below in detail with reference to FIGS. 23 through 28.

The interposer 120, the lower semiconductor chip 130, and the package connecting members 260 may be sealed by the exterior molding member 170, and accordingly may be protected from external impacts. The exterior molding member 170 may seal a lateral side of the interposer 120. The exterior molding member 170 may extend to fill a space below the interposer 120, that is, may fill spaces between the interposer connecting members 128. The exterior molding member 170 may also extend to seal the lateral side of the lower molding member 150 and a part of the upper portions of the package connecting members 260. The exterior molding member 170 may further extend to contact the upper semiconductor package 200. For example, the exterior molding member 170 may extend to further include a contact portion 172 contacting the lower surface of an upper base substrate 210. The exterior molding member 170 may also be formed by a MUF technique. The exterior molding member 170 may be composed of an insulation material. The exterior molding member 170 may comprise resin, or composed mainly of a combination of silica and resin. The exterior molding member 170 may be a homogenous integral material. The exterior molding member 170 and the lower molding member 150 may include the same material or different materials.

The upper semiconductor package 200 will now be described in detail. The upper semiconductor package 200 may include the upper base substrate 210 and the upper semiconductor chip 230. The upper semiconductor chip 230 may be located on the upper base substrate 210.

The upper base substrate 210 may include glass, a ceramic, or plastic. The upper base substrate 210 may be a substrate for semiconductor packages, for example, a printed circuit board, a ceramic substrate, or a tape wiring substrate. Upper pads 212 which are electrically and/or physically connected to the upper semiconductor chip 230 may be located in an upper portion of the upper base substrate 210, and lower pads 214 which are electrically and/or physically connected to the package connecting members 260 may be located in a lower portion of the upper base substrate 210.

The upper semiconductor chip 230 is located on the upper base substrate 210. The upper semiconductor chip 230 may be a logic semiconductor chip or a memory semiconductor chip as described above. Upper connecting members 240 may be located below the upper semiconductor chip 230. The upper semiconductor chip 230 may be electrically connected to the upper base substrate 210 via the upper connecting members 240. For example, the upper connecting members 240 may be electrically and/or physically connected to the upper pads 212. Although the upper connecting members 240 may be solder balls, the inventive concept is not limited thereto. For example, the upper connecting members 240 may be bonding wires. Alternatively, the upper connecting members 240 may form a flipchip connection structure having a grid array such as a pin grid array, a ball grid array, or a land grid array.

The upper semiconductor chip 230 may be sealed by the upper molding member 250, and may be protected from the external environment. The upper molding member 250 may include an underfill member located below the upper semiconductor chip 230, that is, filling spaces between the upper connecting members 240, and a cover member sealing the upper portion of the upper semiconductor chip 230. The upper molding member 250 may be formed by a MUF technique. The upper molding member 250 may include an insulation material. The upper molding member 250 and the lower molding member 150 may include the same material or different materials. The upper molding member 250 and the exterior molding member 170 may be composed of the same material or different materials. In an alternative embodiment, the upper package 200 may not include an upper molding member and the upper semiconductor chip 230 may be exposed after formation of the upper package (although subsequent processes, such as those used to form semiconductor package 1, may encapsulate upper semiconductor chip 230.

The upper semiconductor package 200 may be located on the lower semiconductor package 100. The lower semiconductor package 100 and the upper semiconductor package 200 may be electrically connected to each other via the package connecting members 260.

The package connecting members 260 will now be described in detail. The package connecting members 260 may be located on the interposer 120 and may be electrically connected to the interposer 120. An under-bump metallization layer (UBM layer—not shown) may be the only element interposed between the interposer 120 and the package connecting members 260. The package connecting members 260 may be located within openings 160, which will be described below with reference to FIG. 19, and the openings 160 may extend downward to have a uniform width or a narrowing width. The package connecting members 260 may be solder balls.

The package connecting members 260 may be a plurality of package connecting members. For example, the package connecting members 260 may include first package connecting members 270 which are electrically and/or physically connected to the interposer 120 (e.g., through a UBM layer), and second package connecting members 280 which are electrically and/or physically connected to the upper semiconductor package 200 (e.g., through a UBM layer). The first package connecting members 270 and the second package connecting members 280 may have the same shape, for example, a spherical shape. Adhered upper and lower surfaces of the spherical shape may be slightly flattened. The first package connecting members 270 and the second package connecting members 280 may have the same sizes. The first package connecting members 270 and the second package connecting members 280 may be connected to each other by using a thermal compression process and/or a reflow process and accordingly may be transformed into a one-body structure. Each of the first package connecting members 270 and the second package connecting members 280 may have a shape other than the spherical shape, and/or they may have different shapes from each other. The first package connecting members 270 and the second package connecting members 280 may have different sizes. For example, the first package connecting members 270 may have greater or smaller sizes than the second package connecting members 280. Exemplary package connecting members 260 will be described below in detail with reference to FIGS. 38 through 42.

An air gap 180 may be located between the upper semiconductor package 200 and the lower semiconductor package 100. The air gap 180 may be located above the lower semiconductor chip 130, and accordingly compensate for thermal expansion due to an operation of the lower semiconductor chip 130. A height of each package connecting member 260 with respect to the interposer 120 is greater than a sum of the heights of the lower semiconductor chip 130 and the lower connecting members 140, to extend through the air gap 180 and connect to the lower surface of the upper package 200. The height of the uppermost surface of the lower semiconductor chip 130 may be formed at a location lower than the height of the top of package connecting members 260.

The lower semiconductor chip 130 and the upper semiconductor chip 230 may have the same sizes or different sizes. For example, the lower semiconductor chip 130 may have a larger size than the upper semiconductor chip 230. The lower semiconductor chip 130 and the upper semiconductor chip 230 may have the same function or different functions. For example, the lower semiconductor chip 130 may be a logic semiconductor chip as described above, and the upper semiconductor chip 230 may be a memory semiconductor chip as described above. For example, the lower semiconductor chip 130 may be a driving chip for driving a mobile device or the like as described above, and the upper semiconductor chip 230 may be a DRAM chip which is driven by the lower semiconductor chip 130. As another example, the upper semiconductor chip 230 may be a flash memory chip capable of functioning as an external memory device of a mobile device. The lower semiconductor chip 130 may be a master chip, such as a stand-alone driver master chip (e.g., receiving, buffering and driving signals with no memory array) or a memory chip acting as a master chip, and the upper semiconductor chip 230 may be a slave chip, such as a slave memory chip.

The semiconductor package 1 may be a package on package (POP) in which a plurality of semiconductor packages are stacked and integrally formed, or the semiconductor package 1 may be a system in package (SIP) in which a logic semiconductor chip and a memory semiconductor chip are integrated into a single package.

The semiconductor package 1 may have a reduced size by including the interposer 120. For example, the semiconductor package 1 may have, for example, the air gap 180 having a thickness of about 50 μm or less, the lower semiconductor chip 130 having a thickness of about 50 μm or less, and the lower connecting members 140 having a height of about 30 μm or less, or a height of 20 μm or less. Here, the lower connecting members 140 may be connecting members which are typically referred to as μ-bumps (micro-bumps) or C4 bumps. Accordingly, a sum of the thicknesses of the air gap 180, the lower semiconductor chip 130, and each of the lower connecting members 140 may be about 0.13 mm or less, or 0.12 mm or less. Thus the height from a top surface of the interposer 120 to the lower surface of the upper package 200 is about 0.13 mm or less, or 0.12 mm or less. A distance from the upper surface of the interposer 120 to the upper surface of the lower semiconductor chip 130 is 80 μm or less, or 70 μm or less.

In addition, the overall thickness of the package may be reduced. When interposer 120 is formed from wafer interposer 10, the wiring portion 50 and vias/TSVs 42 may be made using wafer level processes (such as photolithographic processes), with fine wiring sizes. For example, a wiring pitch of at least some of the adjacent conductors of the wiring pattern layer 126 may be 10 μm or less, or 5 μm or less.

Use of the wiring portion 50 of interposer 120 allows a redistribution of the signals of the upper and lower chips 230 and 130. This may allow a designer freedom to eliminate wiring layers from lower base substrate 110 that may have been desired or needed, thus reducing the thickness of the package. For example, the lower base substrate 110 may have only two or less redistribution wiring layers and/or have a thickness of 220 μm or less.

In addition, backside grinding of the lower semiconductor chip 130 reduces the overall height of the package. When the interposer 120 is formed of a material having a CTE (coefficient of thermal expansion) the same as or close to that of the lower semiconductor chip 130, the lower semiconductor chip 130 can be made even thinner with minimal concern to subsequent cracking due to a CTE mismatch. For example, the CTE of interposer 120 and lower semiconductor chip 130 may both be less than 6 ppm/K, or less than 4 ppm/K. The CTE of the interposer 120 may be no greater than twice the CTE of the lower semiconductor chip 130. In some embodiments, the CTE of the interposer 120 may be no greater than about 1.3 times the CTE of the lower semiconductor chip 130.

In some embodiments, the interposer 120 and the lower semiconductor chip 130 may have substantially the same CTE (e.g., they may be formed from the same materials).

In addition, when the interposer 120 is formed of a material having a CTE the same as or close to that of the lower semiconductor chip 130, lower connecting members 140 may be made smaller with minimal risk of damage (e.g., cracking or detaching). For example, the lower connecting members 140 may have a height of 20 μm or less.

With a reduced height between the top surface of the interposer 120 to the lower surface of the upper package 200, the size of the package connecting members 260 may also be reduced, both vertically and horizontally. With a reduction in the horizontal size (e.g., width in FIG. 7), the pitch of the package connecting members 260 may be made smaller. For example, the pitch of the package connecting members 260 may be made less than or equal to 0.4 mm, or less than or equal to 0.3 mm. With a small pitch size, the overall area of the package may be made small. As one example, referring to the blown-up portion of FIG. 5, a small pitch distance between package connecting members 70 allows for a reduced size of each interposer 20.

On the other hand, a semiconductor package not including the interposer 120 may include an air gap having a thickness of about 50 μm, a lower semiconductor chip having a thickness of about 100 μm, and lower connecting members having a height of about 80 μm for an overall distance of 0.23 mm. In addition, a thicker package substrate may be required to accommodate desired redistribution.

Figure 8:
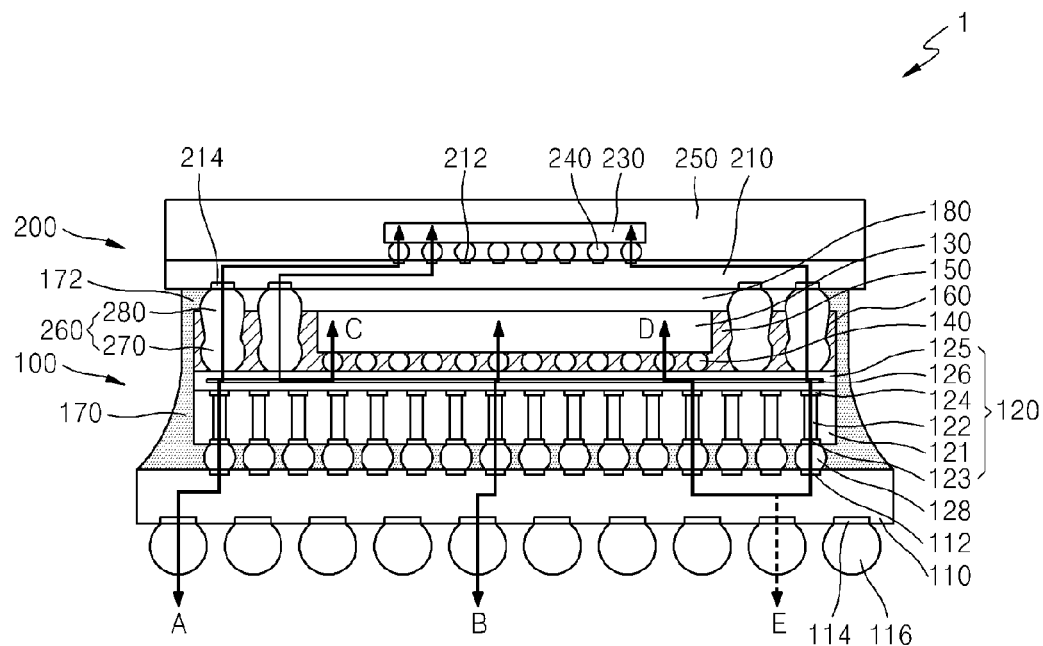
FIG. 8 is a conceptual view illustrating electrical connection of the semiconductor package of FIG. 7.

FIG. 8 is a conceptual view illustrating exemplary electrical connections within the semiconductor package 1 of FIG. 7. Referring to FIG. 8, the semiconductor package 1 may have electrical pathways along paths indicated by a first arrow A, a second arrow B, a third arrow C, a fourth arrow D, and a fifth arrow E. Each electrical pathway may provide signal communications (e.g., data, address, control, clock, etc.) and/or supply power (e.g., Vdd) and/or reference voltages (e.g., Vss, Gnd) to respective signal communication chip pads and/or power supply pads and/or reference voltage chip pads of the lower semiconductor chip 130 and/or upper semiconductor chip 230. The signal communication chip pads of the lower semiconductor chip 130 may include data pads, address pads, control pads, and/or clock pads connected respectively to a data buffer, address buffer, control buffer and clock buffer of the lower semiconductor chip 130, as is known. The signal communication chip pads of the upper semiconductor chip 230 may include data pads, address pads, control pads, and/or clock pads connected respectively to a data buffer, address buffer, control buffer and clock buffer of the upper semiconductor chip 230, as is known. The power supply chip pads and reference voltage chip pads of the lower semiconductor chip 130 may be connected to an internal power supply circuit of the lower semiconductor chip 130. The power supply chip pads and reference voltage chip pads of the upper semiconductor chip 230 may be connected to an internal power supply circuit of the upper semiconductor chip 230.

Along the path indicated by the first arrow A, the upper semiconductor chip 230 may be electrically connected to the outside of the semiconductor package 1. For example, the upper semiconductor chip 230 may be electrically connected to the outside of the semiconductor package 1 via the upper connecting members 240, the upper base substrate 210, the package connecting members 260, the wiring pattern layer 126, the TSVs 122, the interposer connecting members 128, the lower base substrate 110, and the external connecting members 116. The electrical pathway indicated by first arrow A may be dedicated to the upper semiconductor chip 230. The electrical pathway indicated by first arrow A may be electrically isolated and/or may not be electrically connected to the lower semiconductor chip 130. The electrical pathway indicated by arrow A may connect to data, address, control and/or clock pads of the upper semiconductor chip 230.

Along the path indicated by the second arrow B, the lower semiconductor chip 130 may be electrically connected to the outside of the semiconductor package 1. For example, the lower semiconductor chip 130 may be electrically connected to the outside of the semiconductor package 1 via the lower connecting members 140, the wiring pattern layer 126, the TSVs 122, the interposer connecting members 128, the lower base substrate 110, and the external connecting members 116. The electrical pathway indicated by second arrow B may be dedicated to the lower semiconductor chip 130. The electrical pathway indicated by second arrow B may be electrically isolated and/or may not be electrically connected to the upper semiconductor chip 230. The electrical pathway indicated by arrow B may connect to data, address, control and/or clock pads of the lower semiconductor chip 130.

Along the path indicated by the third arrow C, the upper semiconductor chip 230 may be electrically connected to the lower semiconductor package 130. For example, the upper semiconductor chip 230 may be electrically connected to the lower semiconductor chip 130 via the interposer 120. For example, the upper semiconductor chip 230 may be electrically connected to the lower semiconductor chip 130 via the upper connecting members 240, the upper base substrate 210, the package connecting members 260, the wiring pattern layer 126, and the interposer connecting members 140. The electrical pathway indicated by the third arrow C may extend through a wiring of wiring pattern 126 of the interposer 120 without connecting to any TSV of the interposer 120 (or otherwise including a connection extending through the interposer substrate 120 and/or to a lower side of the interposer substrate 120). The electrical pathway indicated by the third arrow C may not be electrically connected to any electrical path external to the semiconductor package 1. The electrical pathway indicated by the third arrow C may be dedicated to provide an electrical path (e.g., communications path) between lower semiconductor chip 130 and upper semiconductor chip 230. The electrical pathway indicated by arrow C may connect data, address, control and/or clock pads of the upper semiconductor chip 230 and respective ones of data, address, control and/or clock pads of the lower semiconductor chip 130. Along the path indicated by the fourth arrow D, the upper semiconductor chip 230 may be electrically connected to the lower semiconductor package 130. For example, the upper semiconductor chip 230 may be electrically connected to the lower semiconductor chip 130 via the TSVs 122 of the interposer 120. For example, the upper semiconductor chip 230 may be electrically connected to the lower semiconductor chip 130 via the upper connecting members 240, the upper base substrate 210, the package connecting members 260, the wiring pattern layer 126, the TSVs 122, the interposer connecting members 128, the lower base substrate 110, the interposer connecting members 128, the TSVs 122, the wiring pattern layer 126, and the lower connecting members 140. The electrical pathway indicated by the fourth arrow D may not be electrically connected to any electrical path external to the semiconductor package 1. The electrical pathway indicated by the fourth arrow D may be dedicated to provide an electrical path (e.g, a communications path) between lower semiconductor chip 130 and upper semiconductor chip 230. In a further example, the electrical pathway indicated by the fourth arrow D may not extend to and/or past a lower surface of the lower base substrate 110. The electrical pathway indicated by arrow D may connect data, address, control and/or clock pads of the upper semiconductor chip 230 and respective ones of data, address, control and/or clock pads of the lower semiconductor chip 130. Alternatively, the path indicated by the fourth arrow D may further include a path indicated by the fifth arrow E (shown in a dotted line). In other words, along a combination of the path indicated by the fourth arrow D and the path indicated by the fifth arrow E, the upper semiconductor chip 230 may be electrically connected to the lower semiconductor package 130, and at the same time the upper semiconductor chip 230 and the lower semiconductor chip 130 may be electrically connected to the outside of the semiconductor package 1. The electrical pathway indicated by arrow E may connect data, address, control and/or clock pads of the upper semiconductor chip 230, respective ones of data, address, control and/or clock pads of the lower semiconductor chip 130, and respective ones of data, address, control and/or clock terminals (embodied by corresponding external connecting members 116) of the lower base substrate 110.

Hereinafter, the semiconductor package 1 having the following exemplary electrical connections is described with reference to FIG. 8. It should be noted that each of the electrical pathways indicated by a first arrow A, a second arrow B, a third arrow C, a fourth arrow D, and a fifth arrow E referenced in the description may constitute on or plural paths having the corresponding characteristics described above. First, the lower semiconductor chip 130 may be a logic chip, and the upper semiconductor chip 230 may be a memory chip, for example, a DRAM chip or a flash memory chip. For example, the lower semiconductor chip 130 may be electrically connected to the upper semiconductor chip 230 and may be constructed to transmit and receive signals to and from the upper semiconductor chip 230.

One or more power paths, such as a Vdd path, may be provided along the path indicated by the first arrow A to the upper semiconductor chip 230. This power signal path is not electrically connected to the lower semiconductor chip 130.

A signal path for transmitting a command from an external interface or the like may be provided via one or more paths indicated by the second arrow B. In other words, the lower semiconductor chip 130 may receive a command from an external source. Power, such as Vdd, may also be provided to the lower semiconductor chip 130 along one or more paths indicated by the second arrow B.

Along one or more paths indicated by the third arrow C, a command may be provided to the upper semiconductor chip 230 from the lower semiconductor chip 130. This command may be a command received externally by the lower semiconductor chip 130 and retransmitted to the upper semiconductor chip. Alternatively, or in addition, this command may be generated by the lower semiconductor chip 130. A signal may be transmitted from the upper semiconductor chip 230 to the lower semiconductor chip 130 along one or more paths indicated by the third arrow C. In other words, an input/output signal path between the lower semiconductor chip 130 and the upper semiconductor chip 230 may be provided along one or more paths indicated by the third arrow C.

A function similar to the path indicated by the third arrow C may be provided via the path indicated by the fourth arrow D. For example, an input/output signal path between the lower semiconductor chip 130 and the upper semiconductor chip 230 may be provided via the path indicated by the fourth arrow D. In particular, since a wiring formed in the interposer 120 is finer than that formed in the lower base substrate 110, it may be advantageous that a signal sensitive to RC delay may be transmitted through the wiring formed in the lower base substrate 110 instead of the wiring formed in the interposer 120. The wiring formed in the lower base substrate 110 may have a thicker width and/or lower higher conductance than the wiring formed in the interposer 120. Thus, an electrical path indicated by the fourth arrow D may have a higher conductance than an electrical path indicated by the third arrow C.

Through a combination of the paths indicated by the fourth and fifth arrows D and E, Vss path and/or a ground path may be provided to each of the lower and upper semiconductor chips 130 and 230. In other words, when Vss and/or ground is provided from an external source, the Vss and/or the ground path may be separated in the interposer 120 and thus may be provided to each of the lower and upper semiconductor chips 130 and 230. Alternatively, when Vss and/or ground signal is provided from an external source, the Vss and/or the ground path may be separated in the lower base substrate 110 and transmitted to each of the lower and upper semiconductor chips 130 and 230. In one example, the lower and upper chips 130 and 230 share one, plural or all Vss and/or ground connections to an external source (e.g. through path(s) E) and each of the lower and upper chips 130 and 230 have at least one, plural and/or all dedicated Vdd connections (e.g., through paths B and A, respectively).

In one example, the upper semiconductor chip 230 may be, for example, a flash memory, such as NAND flash memory. In another example, the lower semiconductor chip 130 may be replaced by separate devices, such as multiple chips. In a further example, the one or more lower semiconductor chips 130 may not transmit and receive signals to and from the upper semiconductor chip 230. In a further example, the upper semiconductor chip 230 may receive commands only directly from external sources.

FIGS. 9 through 22 are cross-sectional views illustrating a method of forming the semiconductor package 1 of FIG. 7, according to some embodiments. According to these embodiments, plural semiconductor packages 1 may be formed concurrently using the same wafer as an interposer 10 with multiple lower chips 130, upper chips 230 and their connectios formed at respective multiple locations on the wafer (e.g., on each interposer element 20 of interposer 10 of FIG. 1). However, for the purpose of clarity, only the fabrication of only one semiconductor package 1 is referenced below, but it will be recognized that the description is relevant for the other semiconductor packages 1 being manufactured from the wafer.

Figure 9:
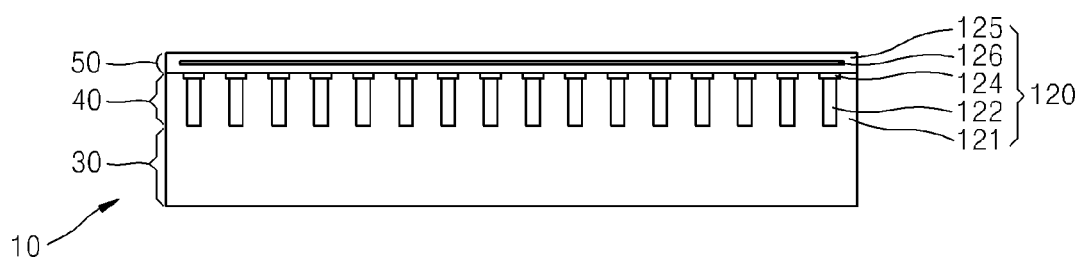
FIGS. 9 through 22 are cross-sectional views illustrating a method of forming the semiconductor package of FIG. 7, according to some embodiments.

Referring to FIG. 9, the interposer wafer 10 comprises a plurality of interposers 120 (only one interposer 120 shown) having the vias 122 is provided. The interposer wafer 10 may include a lower portion 30, an upper portion 40 located on the lower portion 30, and a wiring portion 50 located on the upper portion 40. In the interposer wafer 10 shown in FIGS. 9 through 17, only a region corresponding to the a single semiconductor package 1 is illustrated.

The lower portion 30 and the upper portion 40 may compose the base portion 121. The upper portion 40 may include the vias 122 that penetrate a part of the base portion 121. The upper portion 40 may include the second pads 124 electrically and/or physically connected to the vias 122, and the second pads 124 may correspond to the upper pads 58 (see FIG. 3). As described above with reference to FIG. 4, the upper portion 40 may not include the second pads 124. Although the lower portion 30 may not include the vias 42, this is only an example, and the vias may instead penetrate through the entire interposer base portion 121. For example, the vias 42 may be located to penetrate through both the upper portion 40 and the lower portion 30. The wiring portion 50 may include the insulating layer 125 and the wiring pattern layer 126 located within the insulating layer 125. The wiring pattern layer 126 may correspond to the aforementioned wiring patterns 54 (see FIG. 3). The wiring pattern layer 126 may be a re-wiring pattern.

Figure 10:
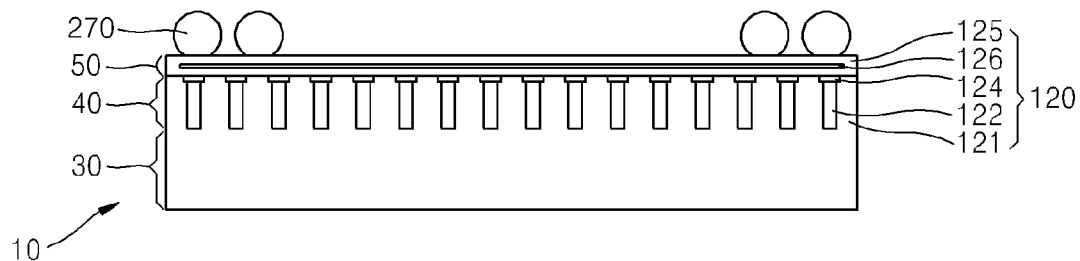

Referring to FIG. 10, the first package connecting members 270 are attached onto the interposer wafer 10. The first package connecting members 270 may be attached to an upper external portion of each of the interposers 120 included in the interposer wafer 10. The first package connecting members 270 may be electrically connected to the wiring pattern layer 126. The first package connecting members 270 may be solder balls, and may be attached to the wiring pattern layer 126 by using a thermal compression process and/or a reflow process.

Figure 11:
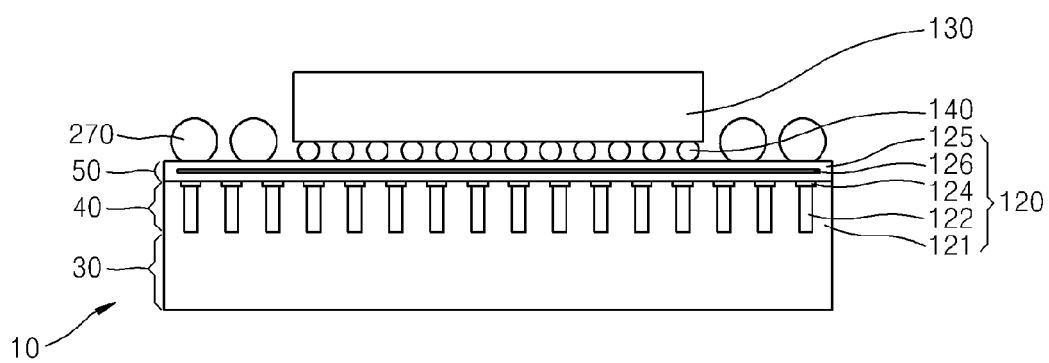

Referring to FIG. 11, the lower semiconductor chip 130 is attached onto the interposer wafer 10. The lower semiconductor chip 130 may be attached to a center portion of each of the interposers 120 of the interposer wafer 10. The lower connecting members 140 may be located below the lower semiconductor chip 130. The lower semiconductor chip 130 may be electrically connected to the wiring pattern layer 126 of the interposer 120 via the lower connecting members 140. The lower semiconductor chip 130 may also be electrically connected to the TSVs 122 via the lower connecting members 140. The lower connecting members 140 may be solder balls, and may be attached to the wiring pattern layer 126 by using a thermal compression process and/or a reflow process. A plurality of lower semiconductor chips 130 may be included.

A process of attaching the first package connecting members 270 and a process of attaching the lower semiconductor chip 130 may be performed in an order reverse to the above-described order, or may be performed simultaneously.

Figure 12:
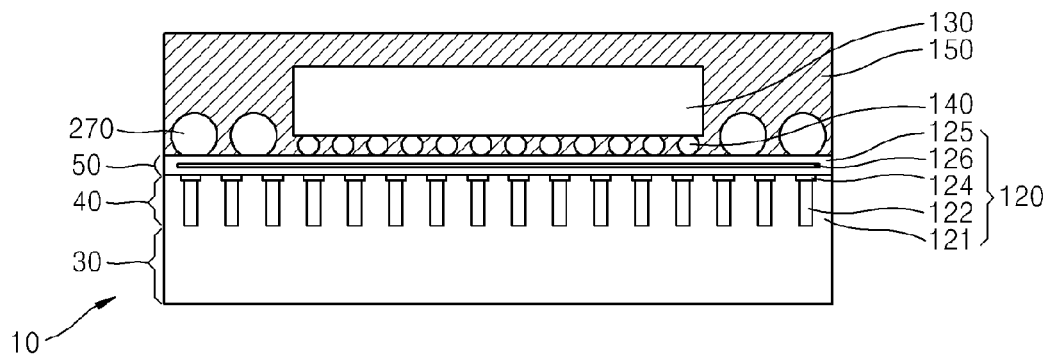

Referring to FIG. 12, the lower molding member 150 sealing the lower semiconductor chip 130 is formed. The lower molding member 150 may include the underfill member 151 (see FIGS. 23 through 28) which is located below the lower semiconductor chip 130 and fills a space between the lower connecting members 140, and the lateral side molding member 152 (see FIGS. 23 through 28) which is located on the underfill member 151 (see FIGS. 23 through 28) and seals the lateral side of the lower semiconductor chip 130. The lower molding member 150 may completely seal the lower semiconductor chip 130. The underfill member and the lateral side molding member may include the same material or different materials.

Figure 13:
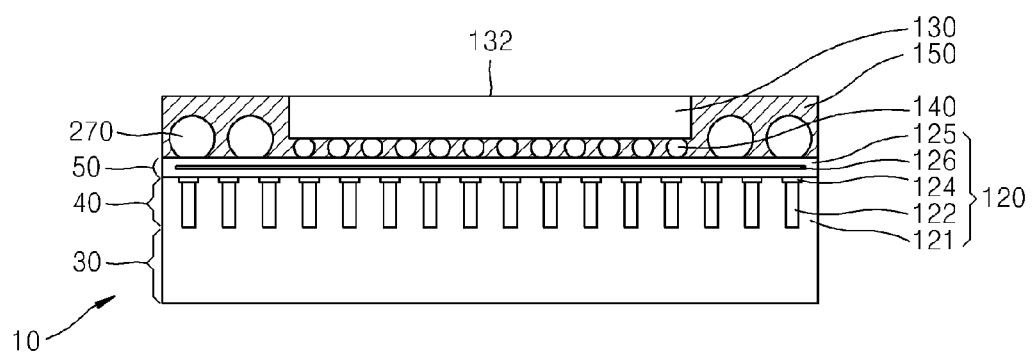

Referring to FIG. 13, the lower molding member 150 located on the lower semiconductor chip 130 is partially removed. In the removal, an upper surface 132 of the lower semiconductor chip 130 may be exposed. In addition, the removal may include an operation of thinning the lower semiconductor chip 130 by removing an upper portion of the lower semiconductor chip 130, and the lower semiconductor chip 130 may be thin. For example, the thickness of the lower semiconductor chip 130 may be 50 μm or less. The removal may be performed by, for example, chemical mechanical polishing (CMP). The uppermost surface of the lower semiconductor chip 130 may be flush and/or coplanar with the uppermost surface of the lower molding member 150 in some examples. Alternatively, the uppermost surface of the lower semiconductor chip 130 and the uppermost surface of the lower molding member may lie a distance no more than 5 μm from a first plane. The uppermost surface of the lower molding member 150 may have various configurations with respect to the uppermost surface of the lower semiconductor chip 130. This will be described below in detail with reference to FIGS. 23 through 28.

Figure 14:
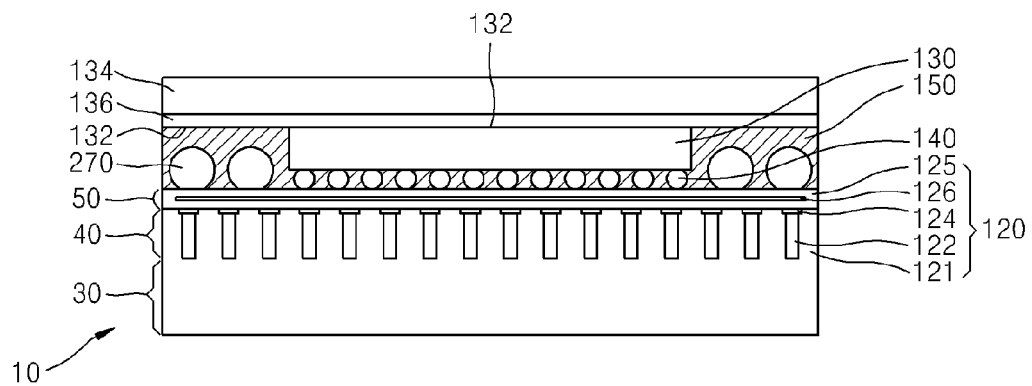

Referring to FIG. 14, an auxiliary substrate 134 is attached onto the lower semiconductor chip 130. The attachment may include an operation of forming an adhesion layer 136 on the upper surface 132 of the lower semiconductor chip 130, and an operation of attaching an auxiliary substrate 134 onto the adhesion layer 136. The auxiliary substrate 134 may have a size extending over the lower molding member 150. The auxiliary substrate 134 may be formed of a rigid material, and include metal, glass, ceramic, or the like. The adhesion layer 136 may be an adhesive tape or an adhesive solution.

Figure 15:
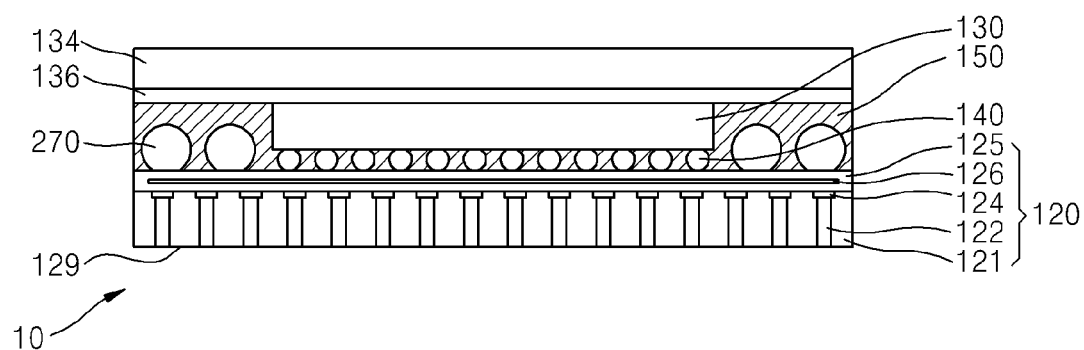

Referring to FIG. 15, the lower portion 30 of the interposer wafer 10 is removed so that the vias/TSVs 122 are exposed. Accordingly, the TSVs 122 may be exposed from a lower surface 129 of the interposer wafer 10, which is located in the upper portion 40. Each of the interposers 120 may include the penetrated TSVs 122. The removal may be performed by, for example, mechanical polishing, CMP, or a method of forming and separating a weak layer within the interposer wafer 10, for example, a Smart Cut method. In the present operation, the auxiliary substrate 134 may have such a sufficient thickness that the thinned interposer wafer 10 is not deformed, and the interposer wafer 10 may function as a carrier substrate for movement to a subsequent processing equipment.

Figure 16:
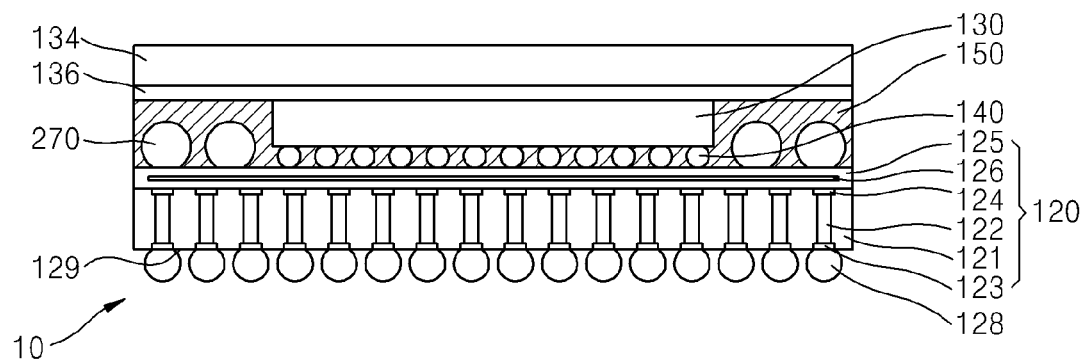

Referring to FIG. 16, the interposer connecting members 128 are attached to the interposer 120 to be electrically connected to the TSVs 122. For example, the first pads 123 of the interposer 120 electrically and/or physically connected to the TSVs 122 are formed on the lower surface 129 of the interposer 120. Then, the interposer connecting members 128 electrically connected to the TSVs 122 are attached to the first pads 123 of the interposer 120 formed on the lower surface 129 of the interposer wafer 10. The interposer connecting members 128 may be solder balls, and may be attached to the first patterns 123 by using a thermal compression process and/or a reflow process. In the present operation, the auxiliary substrate 134 may have such a sufficient thickness that the thinned interposer wafer 10 is not deformed, and the interposer wafer 10 may function as a carrier substrate for movement to a subsequent processing equipment.

Figure 17:
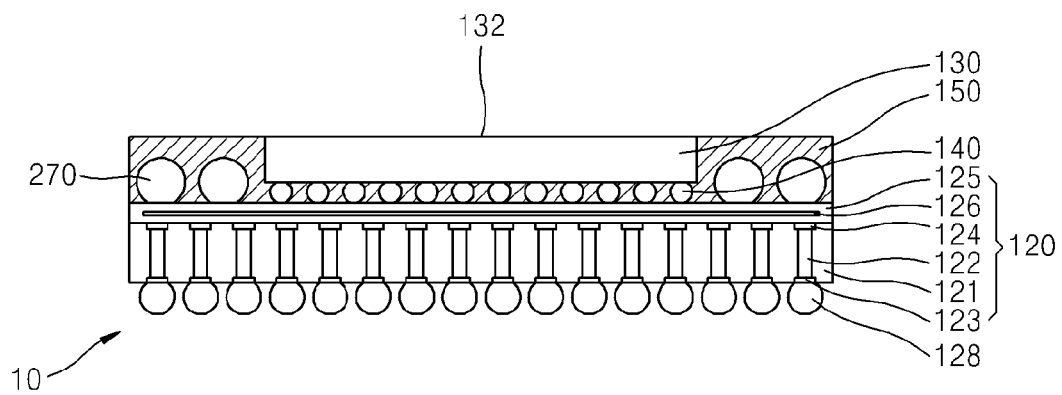

Referring to FIG. 17, the auxiliary substrate 134 attached onto the upper surface 132 of the lower semiconductor chip 130 is removed. At this time, the adhesion layer 136 may also be removed. Thereafter, the interposer wafer 10 is diced along the scribing lines 12 as shown in FIGS. 1 and 2, thereby forming a plurality of separate interposers 120 to which the lower semiconductor chip 130 is electrically connected.

Figure 18:
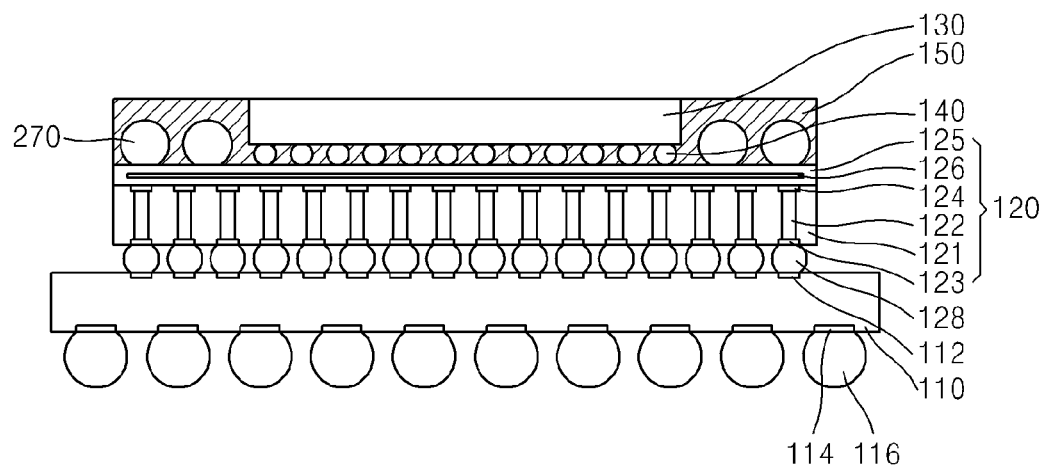

Referring to FIG. 18, the interposer 120 is attached onto the lower base substrate 110. The upper pads 112 may be located on the upper surface of the lower base substrate 110, and the lower pads 114 may be located on the lower surface of the lower base substrate 110. The lower base substrate 110 and the interposer 120 may be electrically connected to each other via the interposer connecting members 128. The interposer connecting members 128 may be attached to the first patterns 112 of the lower base substrate 110 by using a thermal compression process and/or a reflow process. The external connecting members 116 may be located on the lower surface of the lower base substrate 110. The external connecting members 116 may be, for example, solder balls. Alternatively, the external connecting members 116 may form a flipchip connection structure having a grid array such as a pin grid array, a ball grid array, or a land grid array. Accordingly, the lower semiconductor package 100 may be formed.

It may be understood by one of ordinary skill in the art that a case where the external connecting members 116 are attached to the lower base substrate 110 after the upper semiconductor package 200 is attached onto the lower semiconductor package 100 or a case where the external connecting members 116 are attached to the lower base substrate 110 after the exterior molding member 170 are alternative embodiments. Other sequences not detailed herein will be apparent to those of ordinary skill in the art.

Figure 19:
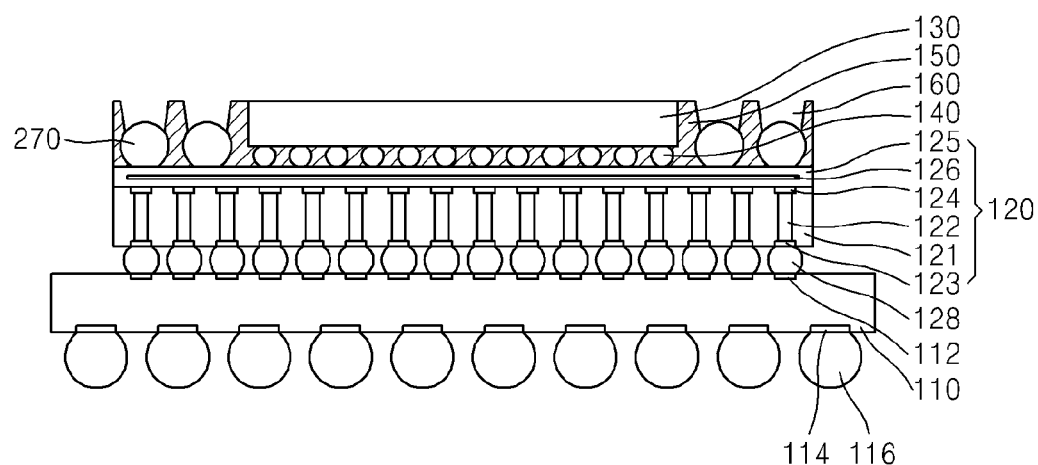
Figure 20:
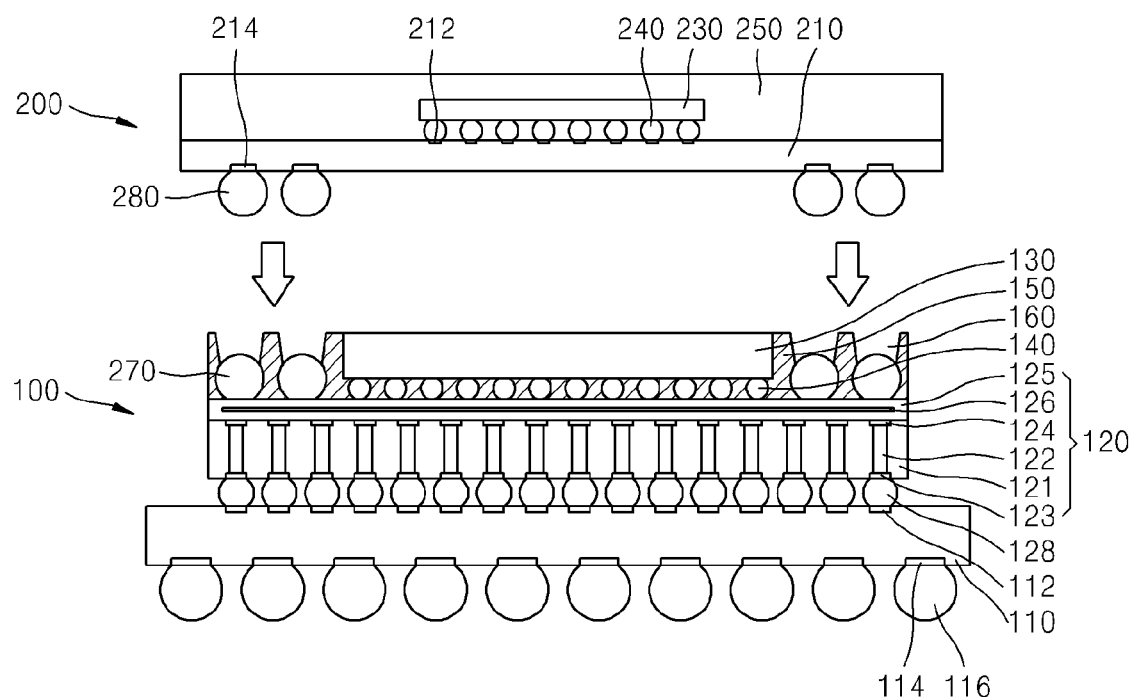
Figure 21:
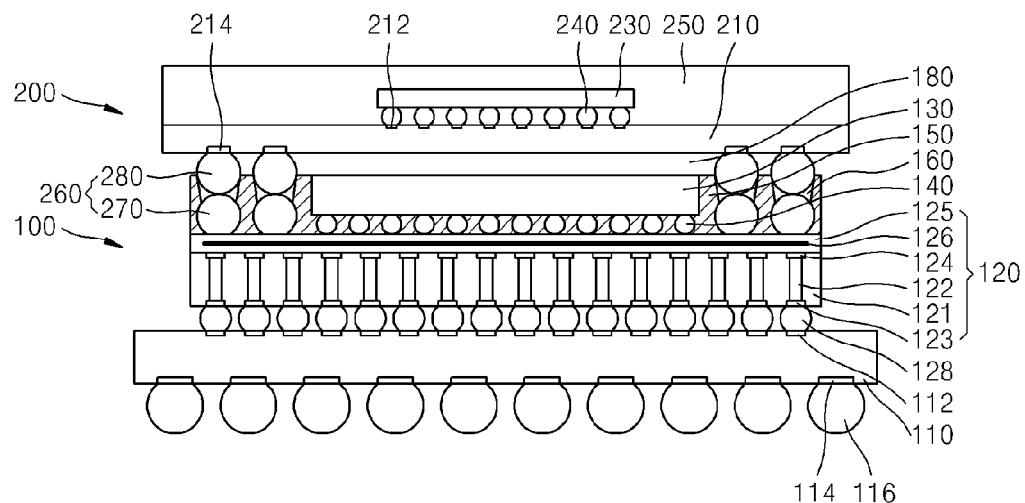

Referring to FIGS. 19 through 21, the upper semiconductor package 200 including the upper semiconductor chip 230 is attached onto the interposer 120. The attachment may include the following operations.

Referring to FIG. 19, the lower molding member 150 is selectively removed to form the openings 160 respectively exposing the first package connecting members 270. The openings 160 may be formed by lithography etching or by using laser. Each of the openings 160 may extend downward to have the uniform width or to have a narrowing width.

Referring to FIGS. 20 and 21, the upper semiconductor package 200 including the second package connecting members 280 corresponding to the first package connecting members 270 is provided. The second package connecting members 280 are located below the upper base substrate 210 of the upper semiconductor package 200. The upper semiconductor package 200 is located on the lower semiconductor package 100. Then, the second package connecting members 280 are inserted into the openings 160 so that the first package connecting members 270 are respectively electrically and/or physically connected to the second package connecting members 280. Accordingly, a structure shown in FIG. 21 is formed. Air gap 180 may be formed between the lower semiconductor package 100 and the upper semiconductor package 200.

Figure 22:
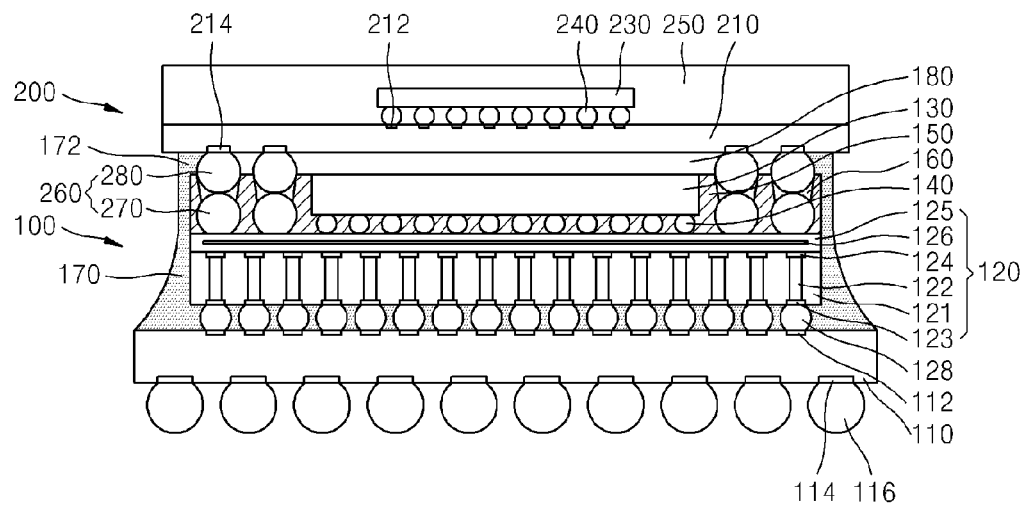

Referring to FIG. 22, the exterior molding member 170 sealing the interposer 120 and the lower semiconductor chip 130 is formed. The exterior molding member 170 may fill the spaces between the interposer connecting members 128 and may seal the lateral side of the interposer 120. For example, the formation of the exterior molding member 170 may include an operation of underfilling the interposer 120 to fill the spaces between the interposer connecting members 128, and an operation of sealing the lateral side of the interposer 120 and/or the lateral side of the package connecting members 260. The exterior molding member 170 may extend to contact an upper surface of lower base substrate 110. The exterior molding member 170 may further include the contact portion 172 contacting the lower surface of the upper base substrate 210. The contact portion 172 may extend toward the inner side of the package connecting members 260 and may contact the lower semiconductor chip 130. Accordingly, the air gap 180 may be located in an inner region between the package connecting members 260. Air gap 180 may not have any exposure to atmosphere external to the package after forming the exterior molding member 170.

Then, electrical connections between the lower semiconductor package 100 is to the upper semiconductor package 200 are made and/or enhanced to complete the formation of the semiconductor package 1 of FIG. 7. This electrical connection may be achieved by electrically and/or physically connecting the first package connecting members 270 to the second package connecting members 280. The first package connecting members 270 and the second package connecting members 280 have be connected to each other by using the thermal compression process and/or the reflow process. The air gap 180 may be located between the upper semiconductor package 200 and the lower semiconductor package 100.

The formation of the exterior molding member 170 and the electrical connection between the lower semiconductor package 100 and the upper semiconductor package 200 may be performed in an order reverse to the above-described order.

FIGS. 23 through 28 are magnified views illustrating cases where the lower molding member 150 included in the semiconductor package 1 of FIG. 7 vary. Accordingly, duplicated descriptions between the embodiment of FIG. 7 and the embodiments 23 through 28 will now be omitted.

Figure 23:
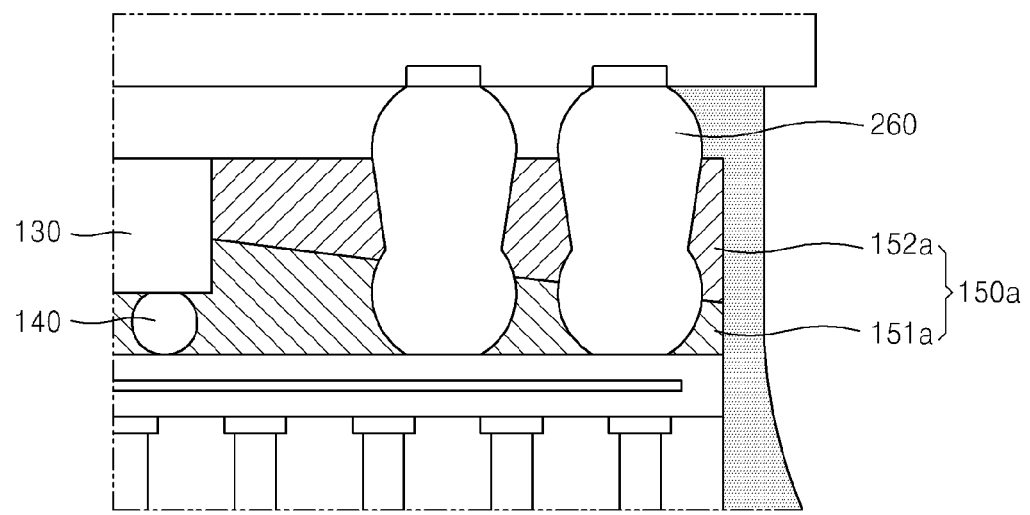
FIGS. 23 through 28 are magnified views illustrating cases where a lower molding member included in the semiconductor package of FIG. 7 vary.

Referring to FIG. 23, a lower molding member 150a may include a underfill member 151a filling a space between the lower connecting members 140, and a lateral side molding member 152a which is located on the underfill member 151a and seals the lower semiconductor chip 130. The underfill member 151a may fill a space between of the lower connecting members 140 and may seal a portion of the lateral surface (e.g., side surface) of the lower semiconductor chip 130. The underfill member 151a may contact the package connecting members 260 and may seal a portion of a region between the lower semiconductor chip 130 and the package connecting members 260 and/or a portion of a region between the package connecting members 260. The lateral side molding member 152a may be located on the underfill member 151a and may seal the lateral side of the lower semiconductor chip 130. The lateral side molding member 152a may seal a portion of the region between the lower semiconductor chip 130 and the package connecting members 260 and/or a portion of the region between the package connecting members 260.

The uppermost surface of the lower semiconductor chip 130 may be coplanar with the uppermost surface of the lateral molding member 152a. Alternatively, the uppermost surface of the lower semiconductor chip 130 may lie a distance no more than 5 μm from a first plane. In the removal described above with reference to FIG. 13, the lower molding member 150 may be partially removed so that the lower semiconductor chip 130 and the lower molding member 150a have the uppermost surfaces on the same level.

The underfill member 151a and the lateral side molding member 152a may be formed of different materials. For example, the underfill member 151a may be formed of a highly flowable material to enhance the flow of the underfill material 151a to surround lower connecting members 140 under semiconductor chip 130. The lateral side molding member 152a may by comparison be less flowable. The lateral side molding member 152a may be made from a material with a higher CTE than the underfill material 151a. The same qualities may also be applied to the underfill materials 151 and lateral side molding members 152 described elsewhere in this disclosure. Alternatively, the underfill member 151a and the lateral side molding member 152a may be formed of the same material, and may be formed using the same process or different processes. The underfill member 151a and the lateral side molding member 152a may be formed by a MUF technique.

Figure 24:
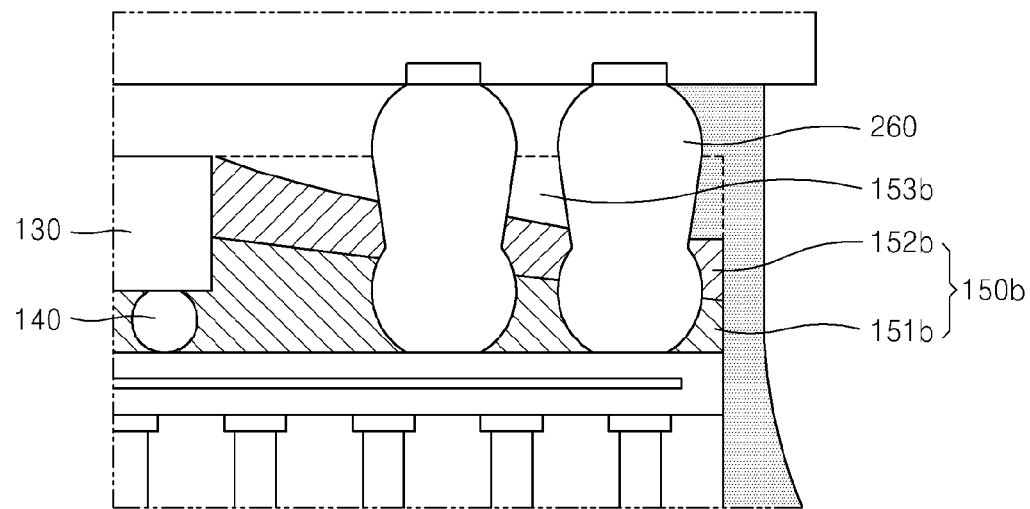

Referring to FIG. 24, a lower molding member 150b may include an underfill member 151b filling a space between the lower connecting members 140, and a lateral side molding member 152b which is located on the underfill member 151b and seals the lower semiconductor chip 130. The underfill member 151b may fill a space between of the lower connecting members 140 and may seal a portion of the lateral surface of the lower semiconductor chip 130. The underfill member 151b may contact the package connecting members 260 and may seal a portion of the region between the lower semiconductor chip 130 and the package connecting members 260 and/or a portion of the region between the package connecting members 260. The lateral side molding member 152b may be located on the underfill member 151b and may seal the lateral surface of the lower semiconductor chip 130. The lateral side molding member 152b may seal a portion of the region between the lower semiconductor chip 130 and the package connecting members 260 and/or a portion of the region between the package connecting members 260.

The uppermost surface of the lateral molding member 152b may be recessed with respect to the uppermost surface of the lower semiconductor chip 130, and thus a recess 153b may be formed. For example, the top surface of the lateral molding member 152b may become lower and lower in a direction away from the top surface of the lower semiconductor chip 130 (e.g., to the right in FIG. 24). This recess may be formed during the removal described above with reference to FIG. 13. For example, when a material used to form the lower semiconductor chip 130 has high abrasion-resistance and/or high chemical-resistance as compared to a material used to form the lateral side molding member 152b, the rate of removal of the lateral side molding member 152b may be higher than that of lower semiconductor chip 130, and the recess 153b may be formed. The recessed lateral side molding member 152b may perform an buffering operation with respect to heat generation (e.g., distributing heat more evenly to avoid hot spots) and/or with respect to stress (e.g., to prevent or reduce the ability of the lower semiconductor chip 130 to crack).

Figure 25:
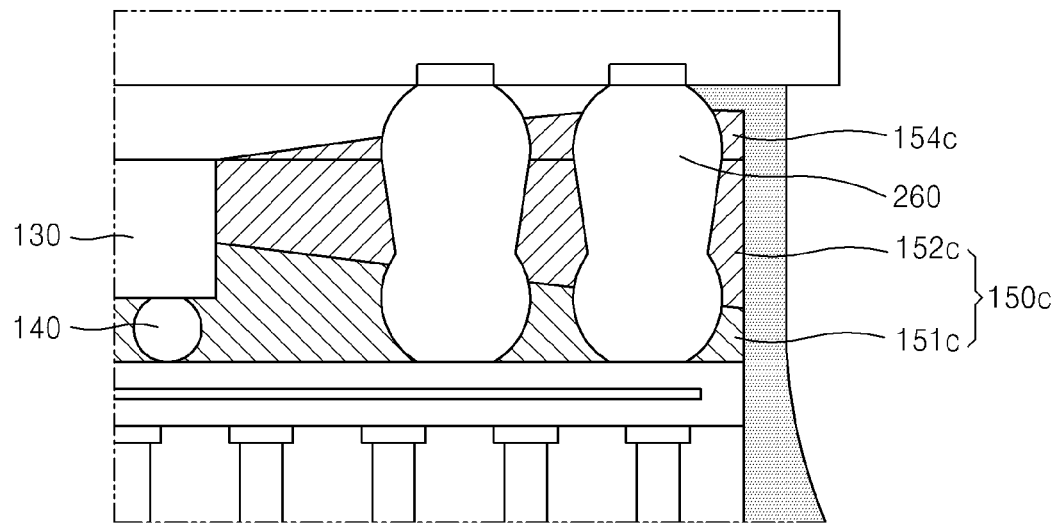

Referring to FIG. 25, a lower molding member 150c may include an underfill member 151c filling a space between the lower connecting members 140, and a lateral side molding member 152c which is located on the underfill member 151c and seals the lower semiconductor chip 130. The underfill member 151c may fill a space between of the lower connecting members 140 and may seal a portion of the lateral surface of the lower semiconductor chip 130. The underfill member 151c may contact the package connecting members 260 and may seal a portion of the region between the lower semiconductor chip 130 and the package connecting members 260 and/or a portion of the region between the package connecting members 260. The lateral side molding member 152c may be located on the underfill member 151c and may seal the lateral surface of the lower semiconductor chip 130. The lateral side molding member 152c may also seal a portion of the region between the lower semiconductor chip 130 and the package connecting members 260 and/or a portion of the region between the package connecting members 260.

The uppermost surface of the lateral molding member 152c may protrude with respect to the uppermost surface of the lower semiconductor chip 130, and thus a protrusion 154c may be formed. For example, the top surface of the lateral molding member 152c (which may also be the top surface of protrusion 154c) may become higher and higher in a direction away from the top surface of the lower semiconductor chip 130 (e.g., to the right in FIG. 25). This protrusion may be formed during the removal described above with reference to FIG. 13. For example, when a material used to form the lower semiconductor chip 130 has low abrasion-resistance and/or low chemical resistance a compared to a material used to form the lateral side molding member 152c, the rate of removal of the lateral side molding member 152c may be lower than that of lower semiconductor chip 130, and the protrusion 154c may be formed. The lateral side molding member 152c including the protrusion 154c may more reliably maintain the air gap 180 that spaces the lower semiconductor chip 130 apart from the upper semiconductor package 200.

Figure 26:
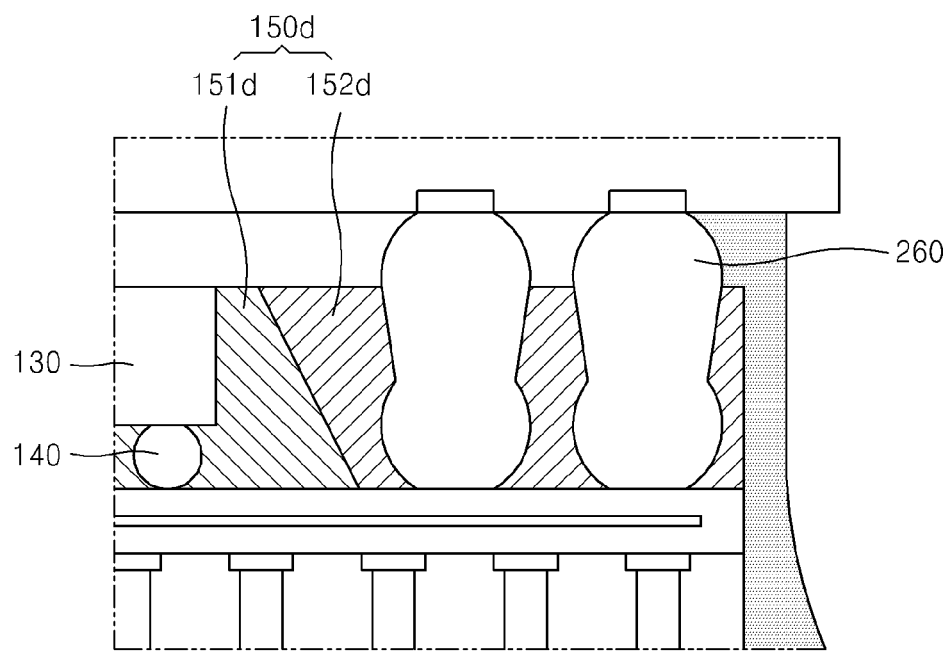

Referring to FIG. 26, a lower molding member 150d may include an underfill member 151d filling a space between the lower connecting members 140 and sealing the lower semiconductor chip 130, and a lateral side molding member 152d which is located on the outer side of the underfill member 151d and seals the underfill member 151d. The underfill member 151d may fill a space between of the lower connecting members 140 and may seal the entire lateral surface of the lower semiconductor chip 130. The underfill member 151d may be spaced apart from the package connecting members 260 by the lateral side molding member 152d. The lateral side molding member 152d may be located on the outer side of the underfill member 151d and may seal the entire lateral surface of the underfill member 151d. The lateral side molding member 152d may also seal a region between the underfill member 151d and the package connecting members 260 and/or a region between the package connecting members 260.

As the underfill member 151d is spaced apart from the package connecting members 260 by the lateral side molding member 152d, a difference between the thermal expansion coefficients of the underfill member 151d and the lateral side molding member 152d may be decreased, and thermal destruction of the package connecting members 260 may be reduced. Since the package connecting members 260 is surrounded by only the lateral side molding member 152d, the reliability of adhesion between the package connecting members 260 and the lateral side molding member 152d may be increased. In an etching operation of forming openings for the package connecting members 260, only the lateral side molding member 152d may be etched. Thus, etching reliability may be increased.

The uppermost surface of the underfill member 151d and/or the uppermost surface of the lateral side molding member 152d may be coplanar with the uppermost surface of the lower semiconductor chip 130. The uppermost surface of the underfill member 151d and/or the uppermost surface of the lateral side molding member 152d may lie a distance no more than 5 μm from a first plane. In the removal described above with reference to FIG. 13, the lower molding member 150 may be partially removed so that the lower semiconductor chip 130 and the lower molding member 150d have the uppermost surfaces on the same level.

Figure 27:
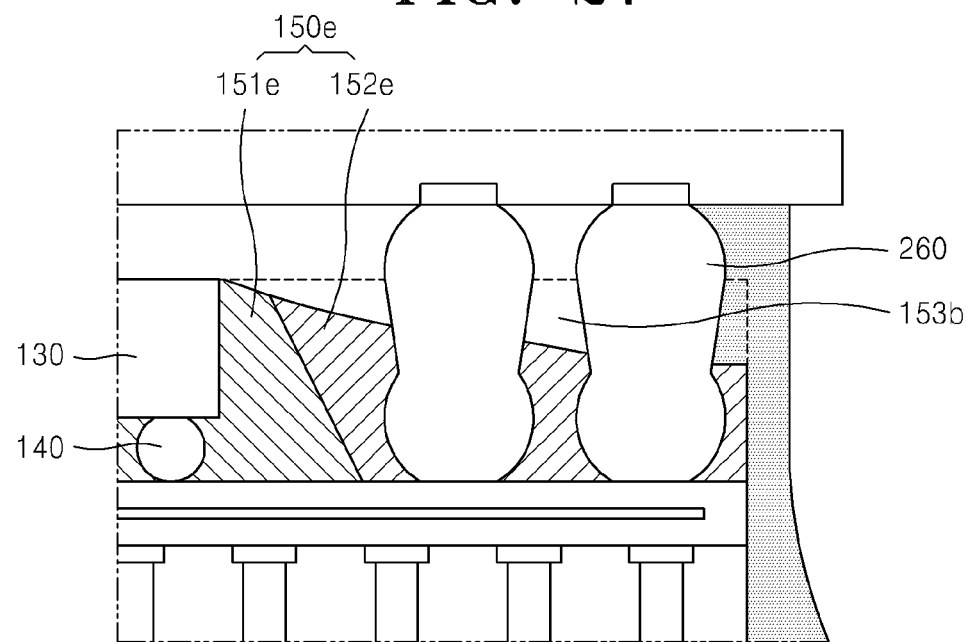

Referring to FIG. 27, a lower molding member 150e may include an underfill member 151e filling a space between the lower connecting members 140 and sealing the lower semiconductor chip 130, and a lateral side molding member 152e which is located on the outer side of the underfill member 151e and seals the underfill member 151e. The underfill member 151e may fill a space between of the lower connecting members 140 and may seal the entire lateral surface of the lower semiconductor chip 130. The underfill member 151e may be spaced apart from the package connecting members 260 by the lateral side molding member 152e. The lateral side molding member 152e may be located on the outer side of the underfill member 151e and may seal the entire lateral surface of the underfill member 151e. The lateral side molding member 152e may also seal a region between the underfill member 151e and the package connecting members 260 and/or a region between the package connecting members 260.

The uppermost surface of the underfill member 151e and/or the uppermost surface of the lateral molding member 152e may be recessed with respect to the uppermost surface of the lower semiconductor chip 130, and thus a recess 153e may be formed. For example, the uppermost surface of the underfill member 151e and/or the uppermost surface of the lateral side molding member 152e may slope downwardly in a direction away from the lower semiconductor chip 130. This recess may be formed during the removal described above with reference to FIG. 13. For example, when a material used to form the lower semiconductor chip 130 has high abrasion-resistance and/or high chemical resistance compared to materials used to form the underfill member 151e and/or the lateral side molding member 152e, the recess 153e may be formed. The recessed underfill member 151e and/or the recessed lateral side molding member 152e may perform a heat concentration buffering operation and/or a stress buffering operation for the lower semiconductor chip 130.

Figure 28:
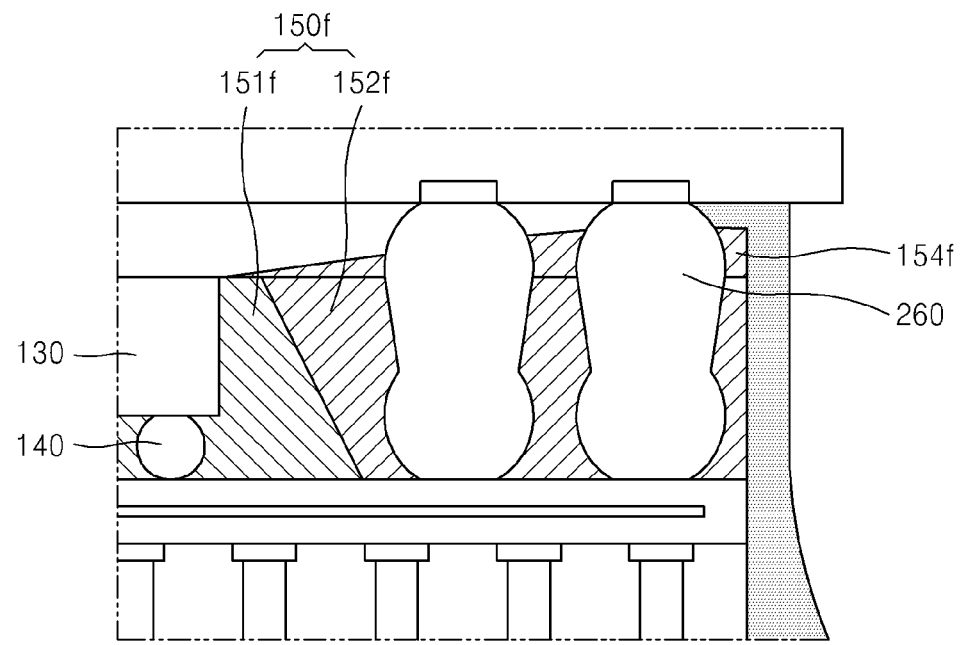

Referring to FIG. 28, a lower molding member 150f may include an underfill member 151f filling a space between the lower connecting members 140 and sealing the lower semiconductor chip 130, and a lateral side molding member 152f which is located on the outer side of the underfill member 151f and seals the underfill member 151f. The underfill member 151f may fill a space between of the lower connecting members 140 and may seal the entire lateral surface of the lower semiconductor chip 130. The underfill member 151f may be spaced apart from the package connecting members 260 by the lateral side molding member 152f. The lateral side molding member 152f may be located on the outer side of the underfill member 151f and may seal the entire lateral surface of the underfill member 151f. The lateral side molding member 152f may also seal a region between the underfill member 151f and the package connecting members 260 and/or a region between the package connecting members 260.

The uppermost surface of the underfill member 151f and/or the uppermost surface of the lateral molding member 152e may protrude with respect to the uppermost surface of the lower semiconductor chip 130, and thus a protrusion 154f may be formed. For example, the uppermost surface of the underfill member 151f and/or the uppermost surface of the lateral molding member 152f may slope upwardly with respect to a direction away from the lower semiconductor chip 130. This protrusion may be formed during the removal described above with reference to FIG. 13. For example, when a material used to form the lower semiconductor chip 130 has low abrasion-resistance and/or low chemical resistance as compared to materials used to form the underfill member 151f and/or the lateral side molding member 152f, the protrusion 154f may be formed. The underfill member 151f and/or the lateral side molding member 152f including the protrusion 154f may perform a heat concentration buffering operation and/or a stress buffering operation for the lower semiconductor chip 130.

Figure 29:
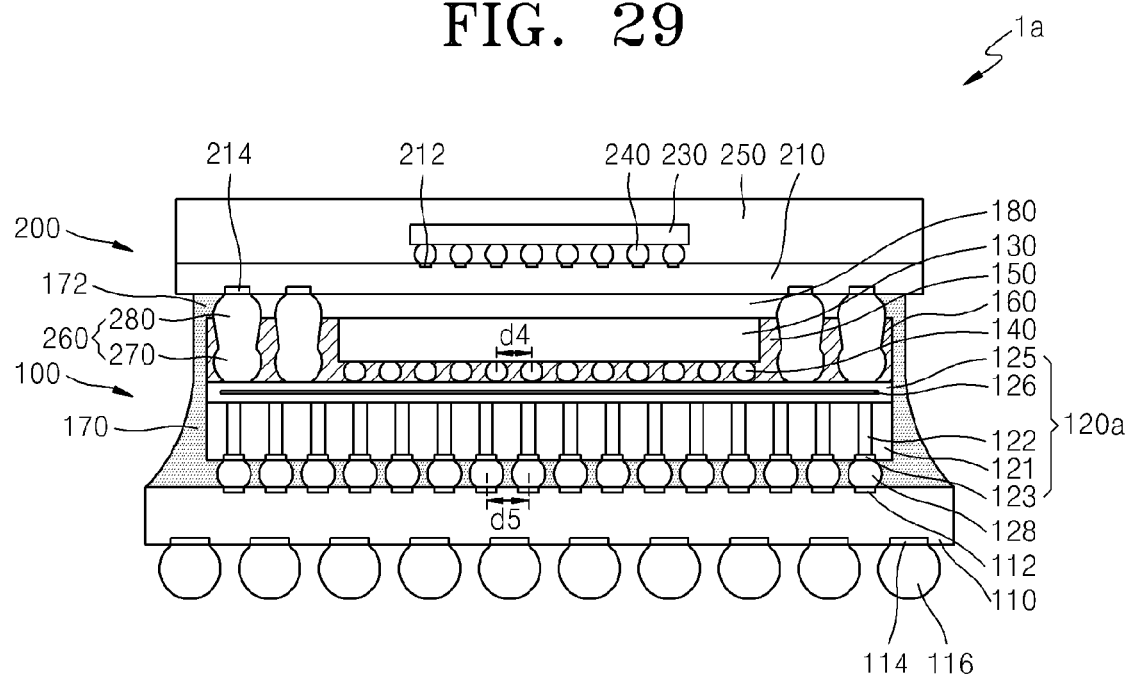
FIG. 29 is a cross-sectional view of a semiconductor package according to some embodiments.

FIG. 29 is a cross-sectional view of a semiconductor package 1a according to some embodiments of the inventive concept. Compared with the embodiment shown in FIG. 7, the embodiment shown in FIG. 29 relates to a case where the interposer 120 does not include the second pads 124. Accordingly, duplicated descriptions between the embodiments of FIGS. 7 and 29 will now be omitted.

Referring to FIG. 29, the semiconductor package 1a includes a lower semiconductor package 100 including an interposer 120a, and an upper semiconductor package 200. As described above with reference to FIG. 4, the interposer 120a may include the TSVs 122 and may not include the second pads 124. In this case, wiring patterns included in the wiring pattern layer 126 of the interposer 120a may be physically connected to the TSVs 122 and thus electrically connected thereto.

Figure 30:
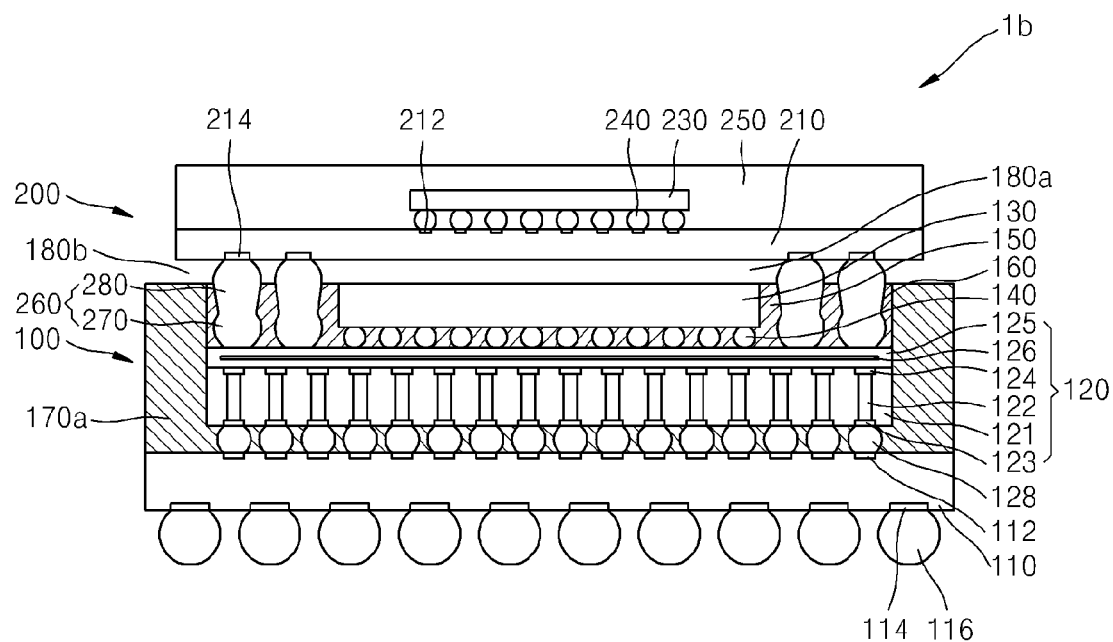
FIG. 30 is a cross-sectional view of a semiconductor package according to some embodiments.

FIG. 30 is a cross-sectional view of a semiconductor package 1b according to some embodiments of the inventive concept. Compared with the embodiment shown in FIG. 7, the embodiment shown in FIG. 30 relates to an alternative exterior molding member 170a. Accordingly, duplicated descriptions between the embodiments of FIGS. 7 and 30 will now be omitted.

Referring to FIG. 30, the semiconductor package 1b includes a lower semiconductor package 100 including an interposer 120, and an upper semiconductor package 200. The interposer 120, the lower semiconductor chip 130, and portions of the package connecting members 260 may be sealed by the exterior molding member 170a, and accordingly may be protected from external impacts. The exterior molding member 170a may seal a lateral side of the interposer 120. The exterior molding member 170a may extend to fill a space below the interposer 120, that is, it may fill spaces between the interposer connecting members 128, surrounding and encapsulating interposer connecting members 128.

The exterior molding member 170a may be formed by a MUF technique. The exterior molding member 170a may contact and extend to seal the lower molding member 150 and a part of the lateral sides of the package connecting members 260. The exterior molding member 170a may extend to and contact the upper surface of the lower base substrate 110. The exterior molding member 170a may be spaced apart from the upper semiconductor package 200. The uppermost surface of the lower molding member 150 may be coplanar with the uppermost surface of the exterior molding member 170a. Alternatively, the uppermost surface of the lower semiconductor chip 130 may be coplanar with the uppermost surface of the exterior molding member 170a. The uppermost surfaces of the lower molding member 150, the exterior molding member 170a and the lower semiconductor chip 130 may all lie a distance no more than 5 µm from a first plane.

The semiconductor package 1b may further include first and second air gaps 180a and 180b located between the lower semiconductor package 100 and the upper semiconductor package 200. In other words, the semiconductor package 1b may include the first air gap 180a located in an inside region between the package connecting members 260, and the second air gap 180b located outside the package connecting members 260. The first and second air gaps 180a and 180b may form a larger continuous air gap.

Figure 31:
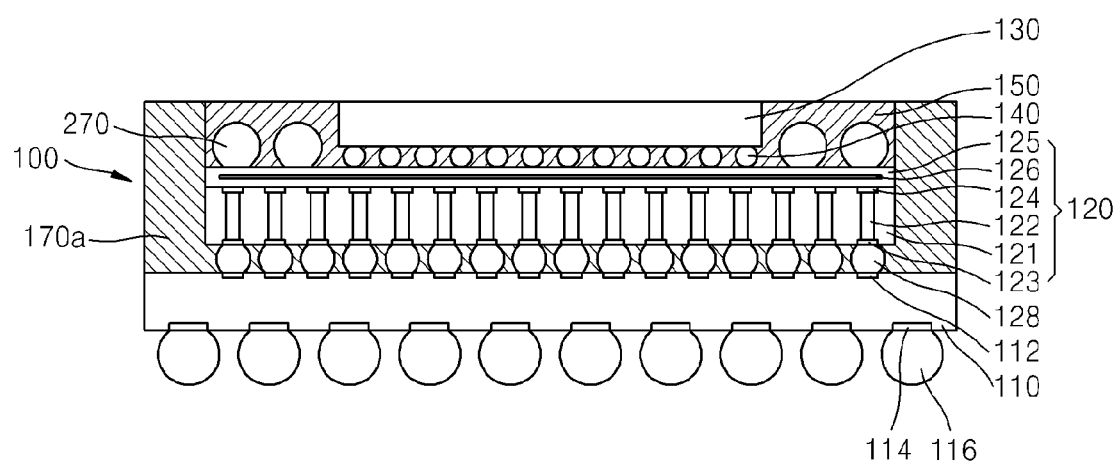
FIGS. 31 through 33 are cross-sectional views illustrating a method of forming the semiconductor package of FIG. 30, according to some embodiments.
Figure 32:
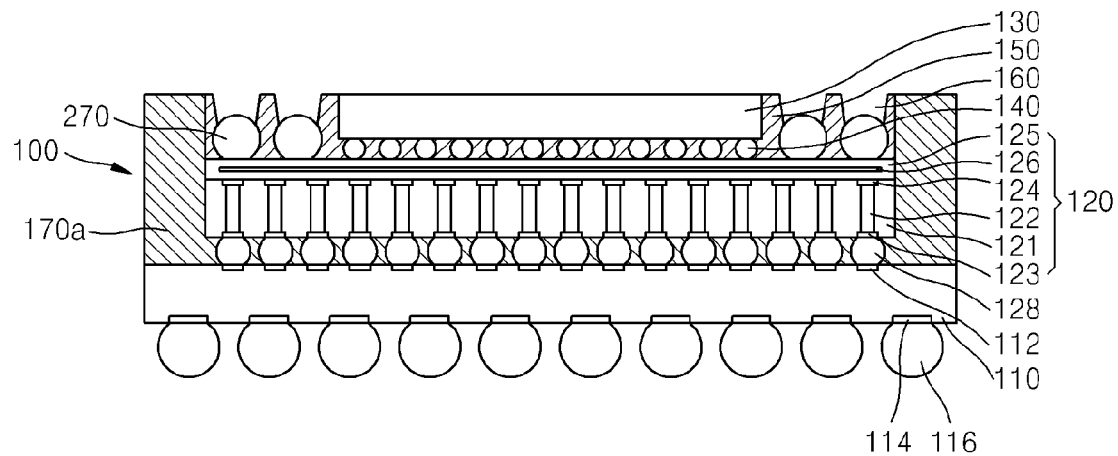
Figure 33:
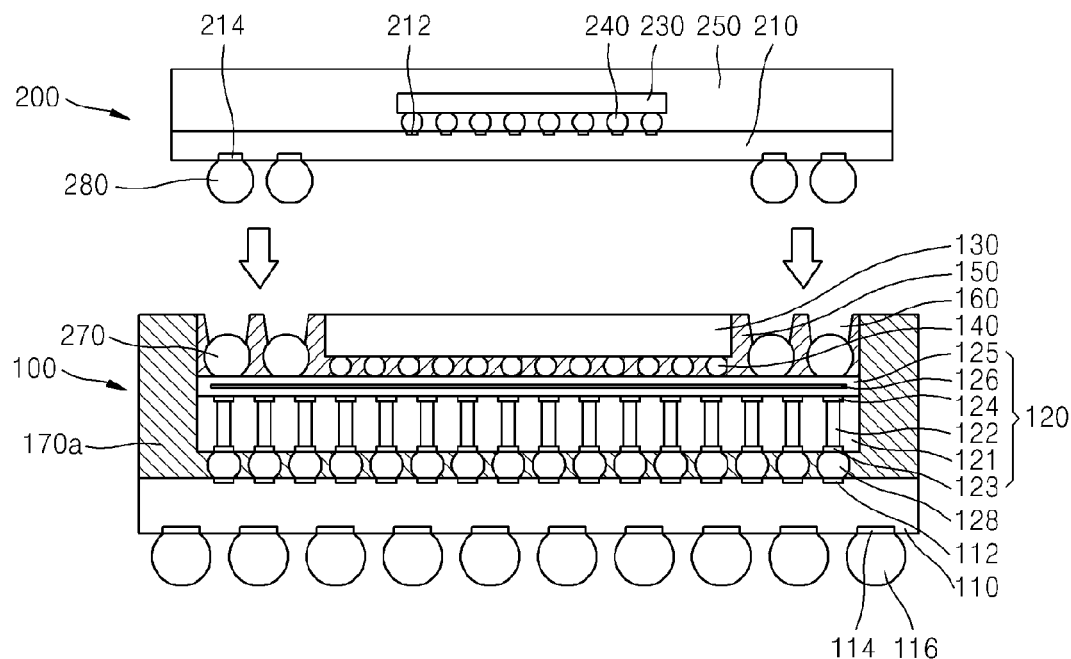

FIGS. 31 through 33 are cross-sectional views illustrating a method of forming the semiconductor package 1b of FIG. 30, according to some embodiments of the inventive concept. In these examples, the processes described with reference to FIGS. 9 through 18 may be performed in advance, and descriptions thereof will be omitted for simplicity.

Referring FIG. 31, the exterior molding member 170a is formed on a structure formed as illustrated in FIG. 18. The exterior molding member 170a may fill a space between the interposer connecting members 128, surrounding and encapsulating interposer connecting members 128, and may seal the lateral side of the interposer 120. The exterior molding member 170a may also seal a lateral side of the lower molding member 150. The exterior molding member 170a may be formed by a MUF technique. The uppermost surface of the lower semiconductor chip 130 may be coplanar with the uppermost surface of the exterior molding member 170a. The uppermost surface of the lower semiconductor chip 130 and the uppermost surface of the exterior molding member 17a may lie a distance no more than 5 µm from a first plane.

Referring to FIG. 32, the lower molding member 150 is partially removed to form the openings 160 respectively exposing the first package connecting members 270. The openings 160 may be formed by lithography etching or by using laser. Each of the openings 160 may extend downward to have the uniform width or to have a narrowing width.

Referring to FIG. 33, the upper semiconductor package 200 including the second package connecting members 280 located to correspond to the first package connecting members 270 is provided. The second package connecting members 280 are located below the upper base substrate 210 of the upper semiconductor package 200. The upper semiconductor package 200 is located on the lower semiconductor package 100. Then, the second package connecting members 280 are respectively inserted into the openings 160 so that the first package connecting members 270 are respectively electrically and/or physically connected to the second package connecting members 280.

Then, the lower semiconductor package 100 is electrically connected to the upper semiconductor package 200. This electrical connection may be achieved by electrically and/or physically connecting the first package connecting members 270 to the second package connecting members 280. The first package connecting members 270 and the second package connecting members 280 may be connected to each other by using the thermal compression process and/or the reflow process. Accordingly, the formation of the semiconductor package 1b shown in FIG. 30 is completed.

Figure 34:
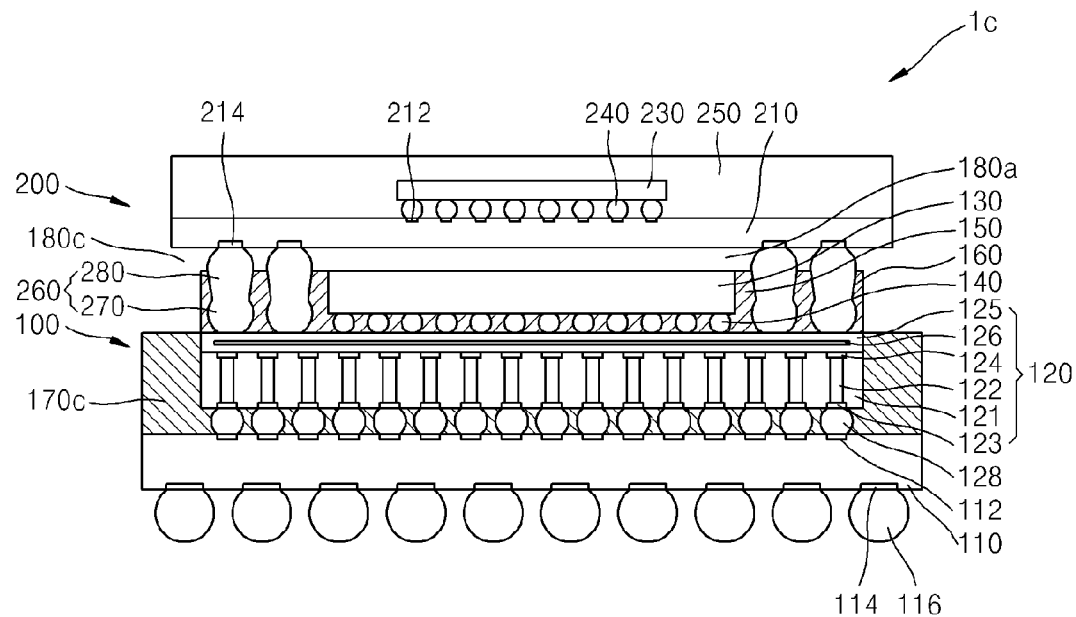
FIG. 34 is a cross-sectional view of a semiconductor package according to some embodiments.

FIG. 34 is a cross-sectional view of a semiconductor package 1c according to some embodiments of the inventive concept. Compared with the embodiment shown in FIG. 7, the embodiment shown in FIG. 34 relates to a case where an exterior molding member 170c different from the exterior molding member 170 is included. Accordingly, duplicated descriptions between the embodiments of FIGS. 7 and 34 will now be omitted.

Referring to FIG. 34, the semiconductor package 1c includes a lower semiconductor package 100 including an interposer 120, and an upper semiconductor package 200. The exterior molding member 170c may fill a space between the interposer connecting members 128 and may seal the lateral side of the interposer 120. The lateral side of the lower molding member 150 may be exposed without being sealed by the exterior molding member 170c. Accordingly, a third air gap 180c may be larger than the second air gap 180b in the above-described embodiment. The first, second and third air gaps 180a, 180b and 180c may form a larger continuous air gap.

Figure 35:
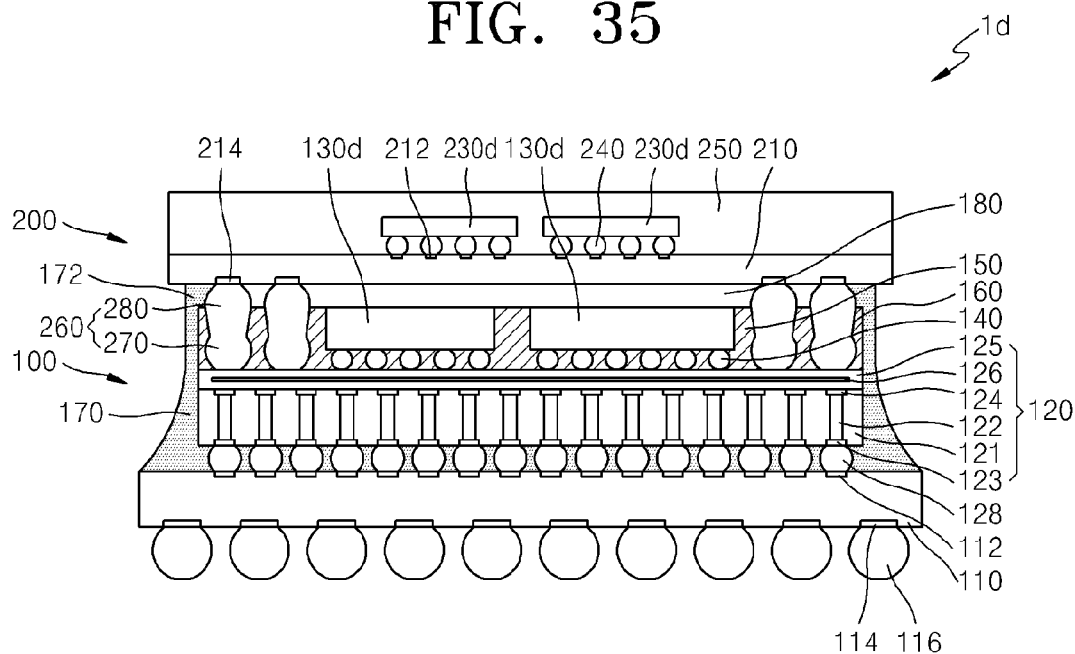
FIGS. 35 and 36 are cross-sectional views of semiconductor packages according to some embodiments.
Figure 36:
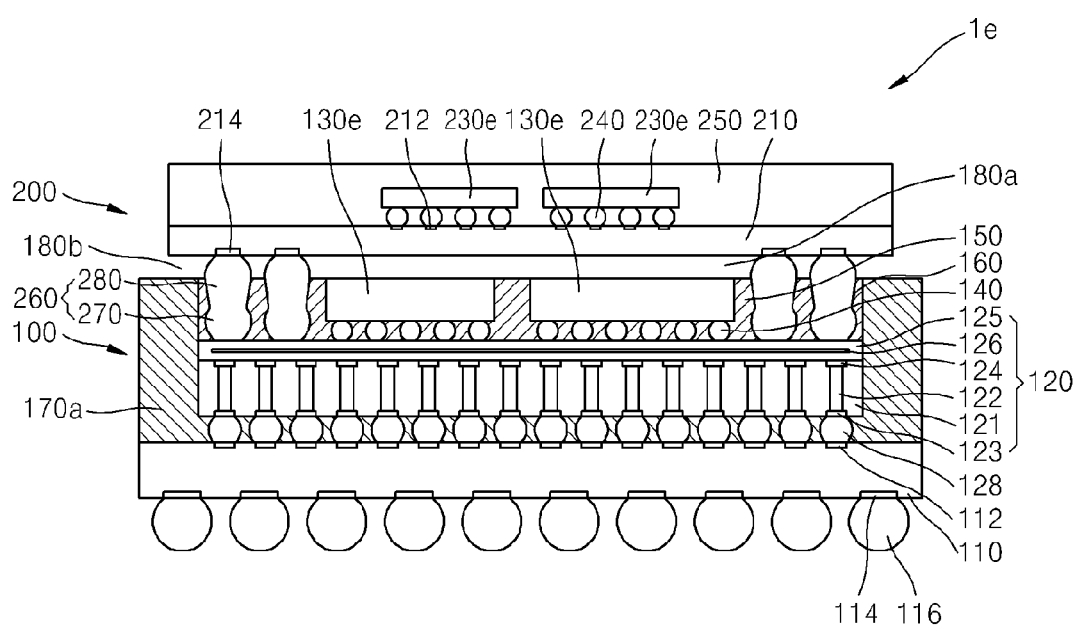

FIGS. 35 and 36 are cross-sectional views of semiconductor packages 1d and 1e according to further embodiments. The embodiments of FIGS. 35 and 36 include a plurality of lower semiconductor chips 130, as compared with the embodiments of FIGS. 7 and 30. Accordingly, duplicated descriptions between the embodiments 35 and 36 and the embodiments of FIGS. 7 and 30 will be omitted.

Referring to FIG. 35, the semiconductor package 1d includes a plurality of lower semiconductor chips 130d located on the interposer 120. The semiconductor package 1d includes a plurality of upper semiconductor chips 230d included in the upper semiconductor package 200. The semiconductor package 1d may include the exterior molding member 170 described with reference to FIG. 7. The lower semiconductor chips 130d may be a logic semiconductor chip, a memory semiconductor chip, or a combination of the logic semiconductor chip and the memory semiconductor chip. The upper semiconductor chips 230d may be a logic semiconductor chip, a memory semiconductor chip, or a combination of the logic semiconductor chip and the memory semiconductor chip. Alternatively, a single lower semiconductor chip 130 (see FIG. 7) or more than two lower semiconductor chips 130d may be used instead of the two lower semiconductor chips 130d. Alternatively or in addition, a single upper semiconductor chip 230 (see FIG. 7) or more than two upper semiconductor chips 230 may be used instead of the upper semiconductor chips 230d. Implementing multiple chips as described with respect to FIG. 35 may also be implemented in other alternative embodiments described herein.

Figure 37:
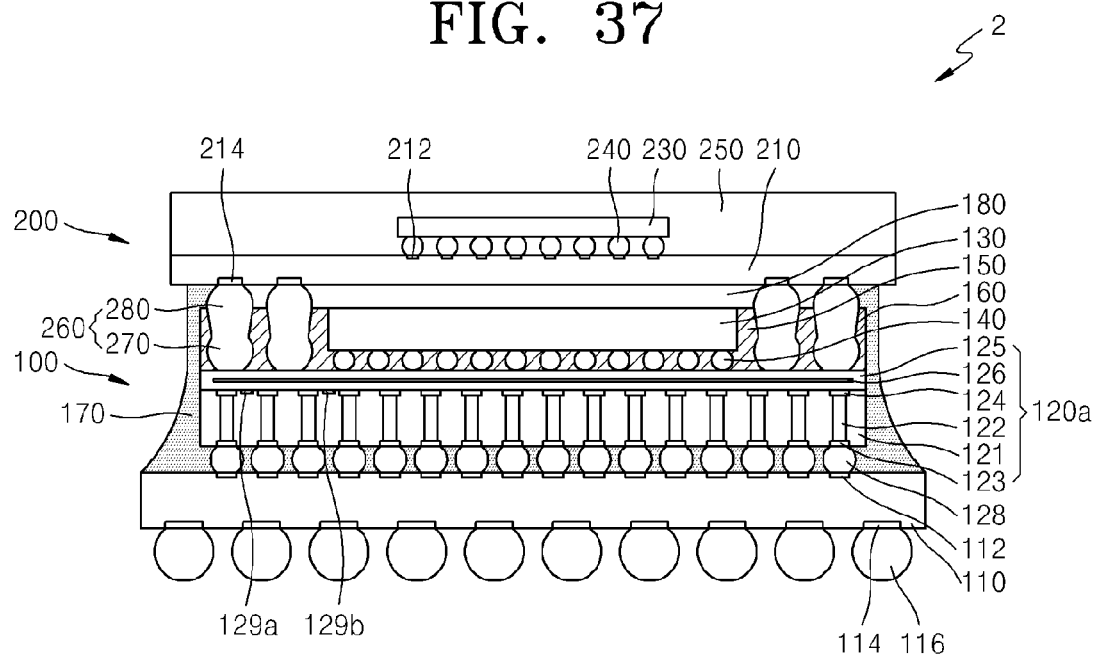
FIG. 37 is a cross-sectional view of a semiconductor package according to some embodiments.

For example, referring to FIG. 36, the semiconductor package 1e includes a plurality of lower semiconductor chips 130e located on the interposer 120. The semiconductor package 1e includes a plurality of upper semiconductor chips 230e included in the upper semiconductor package 200. The semiconductor package 1e may include the exterior molding member 170a described with reference to FIG. 30. The lower semiconductor chips 130e may be a logic semiconductor chip, a memory semiconductor chip, or a combination of the logic semiconductor chip and the memory semiconductor chip. The upper semiconductor chips 230e may be a logic semiconductor chip, a memory semiconductor chip, or a combination of the logic semiconductor chip and the memory semiconductor chip. Alternatively, a single lower semiconductor chip 130 (see FIG. 7) or more than two lower semiconductor chips 130e may be used instead of the two lower semiconductor chips 130e. Alternatively or in addition, a single upper semiconductor chip 230 (see FIG. 7) or more than two upper semiconductor chips 230e may be used instead of the upper semiconductor chips 230e. FIG. 37 is a cross-sectional view of a semiconductor package 2 according to some alternative embodiments. Compared with the embodiment shown in FIG. 7, the embodiment shown in FIG. 37 includes an alternative interposer 120a as compared to the interposer 120 of FIG. 7. Accordingly, duplicated descriptions between the embodiments of FIGS. 7 and 37 will be omitted. It may be understood by one of ordinary skill in the art that a combination of the present embodiment of FIG. 37 and any of the features of alternative embodiments described here in are also contemplated.

Referring to FIG. 37, the semiconductor package 2 may include the interposer 120a. The interposer 120a may include a passive component 129a, an active component 129b, or both of them. The passive component 129a may comprise a passive electronic device and comprise a resistor, an inductor, a capacitor, or a switch, for example. The active component 129b may include an operational amplifier, a diode, or a transistor, for example. The passive component 129a and/or the active component 129b may be located on, below, or within the interposer 120.

FIGS. 38 through 42 are cross-sectional views of semiconductor packages 3a, 3b, 3c, 3d and 3e according to some alternative embodiments. The embodiments shown in FIGS. 38 through 42 are different from the embodiment shown in FIG. 7 regarding package connecting members 260a, 260b, 260c, 260d, and 260e. Accordingly, duplicated descriptions between the embodiments of FIGS. 38 through 42 and the embodiments of FIG. 7 will be omitted. The package connecting members 260a, 260b, 260c, 270d, and 270e shown in FIGS. 38 through 42 may be deformed by the thermal compression process and/or a reflow process and filled within the openings 160.

Figure 38:
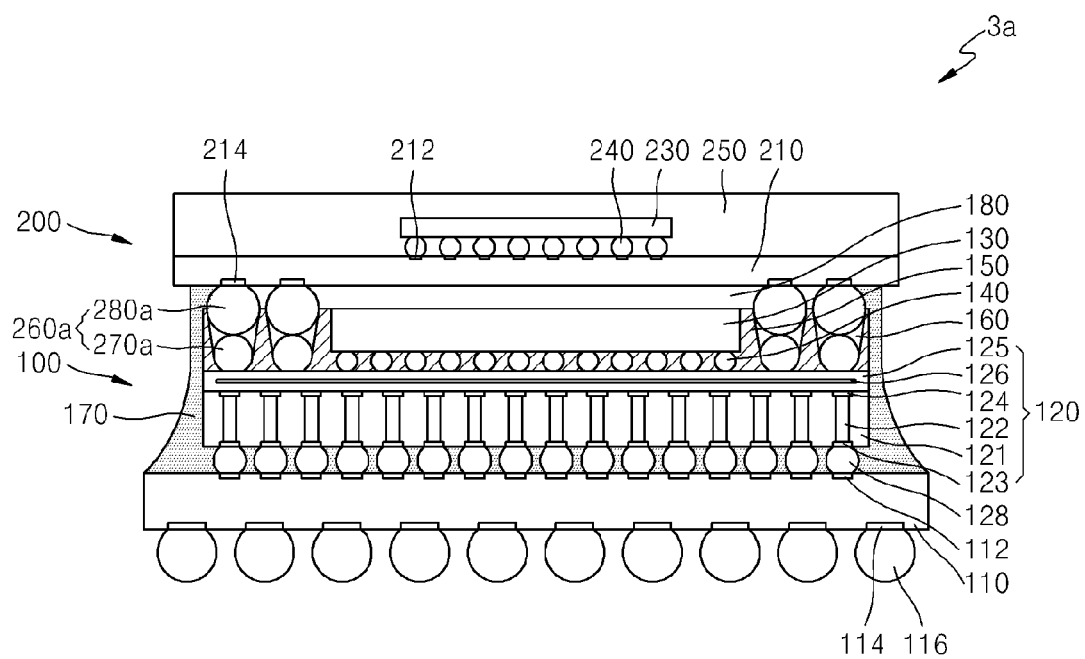
FIGS. 38 through 42 are cross-sectional views of semiconductor packages according to some embodiments.

Referring to FIG. 38, the semiconductor package 3a may include package connecting members 260a that connect the interposer 120 to the upper semiconductor package 200. The package connecting members 260a may include first package connecting members 270a which are electrically connected to the interposer 120, and second package connecting members 280a which are electrically connected to the upper semiconductor package 200. The first package connecting members 270a and the second package connecting members 280a may all have spherical shapes. The adhered upper and lower surfaces of the spherical shape may be slightly flattened. The first package connecting members 270a and the second package connecting members 280a may be connected to each other using a thermal compression process and/or a reflow process and accordingly may be transformed into a single-body structure. The first package connecting members 270a and the second package connecting members 280a may have different sizes. For example, the first package connecting members 270a may have smaller sizes than the second package connecting members 280a.

Figure 39:
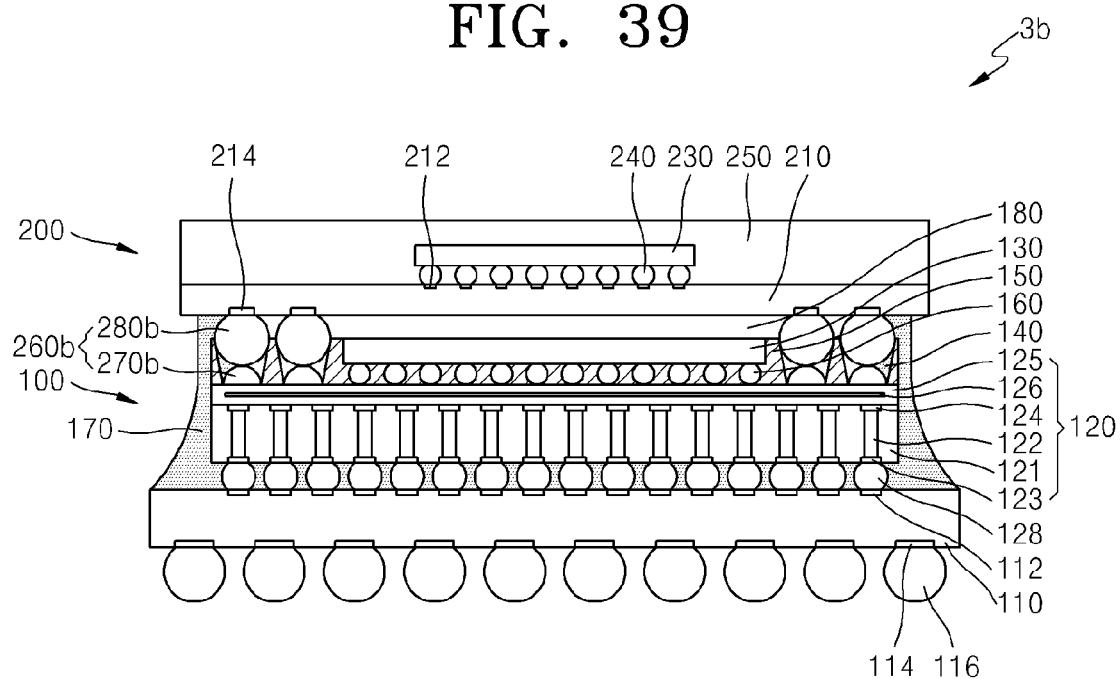

Referring to FIG. 39, the semiconductor package 3b may include the package connecting members 260b that connect the interposer 120 to the upper semiconductor package 200. The package connecting members 260b may include first package connecting members 270b which are electrically connected to the interposer 120, and second package connecting members 280b which are electrically connected to the upper semiconductor package 200. The first package connecting members 270b, the second package connecting members 280b, or both of them may have spherical or hemispherical shapes. For example, the first package connecting members 270b may have hemispherical shapes and the second package connecting members 280b may have spherical shapes. Alternatively, the adhered upper and lower surfaces of the hemispherical and spherical shapes may be slightly flattened. The first package connecting members 270b and the second package connecting members 280b may be connected to each other by using a thermal compression process and/or a reflow process and accordingly may be transformed into a single-body structure. The first package connecting members 270b and the second package connecting members 280b may have different sizes. For example, the first package connecting members 270b may have smaller sizes than the second package connecting members 280b. Alternatively, the first package connecting members 270b may have larger sizes than the second package connecting members.

Figure 40:
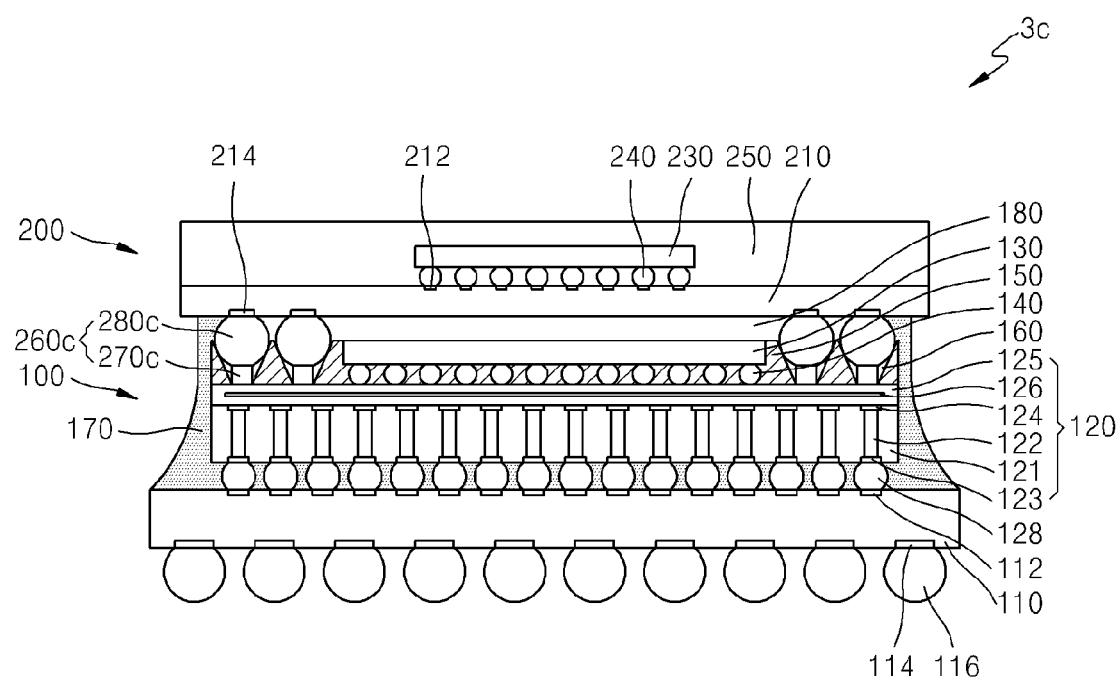

Referring to FIG. 40, the semiconductor package 3c may include the package connecting members 260c that connect the interposer 120 to the upper semiconductor package 200. The package connecting members 260c may include first package connecting members 270c which are electrically connected to the interposer 120, and second package connecting members 280c which are electrically connected to the upper semiconductor package 200. The first package connecting members 270c, the second package connecting members 280c, or both of them may have cylindrical or polyprism shapes. The first package connecting members 270c and the second package connecting members 280c may be connected to each other by using a thermal compression process and/or a reflow process and accordingly may be transformed into a single-body structure. The first package connecting members 270c may have smaller sizes than the second package connecting members 280c. Alternatively, the first package connecting members 270c may have larger sizes than the second package connecting members 280c.

Figure 41:
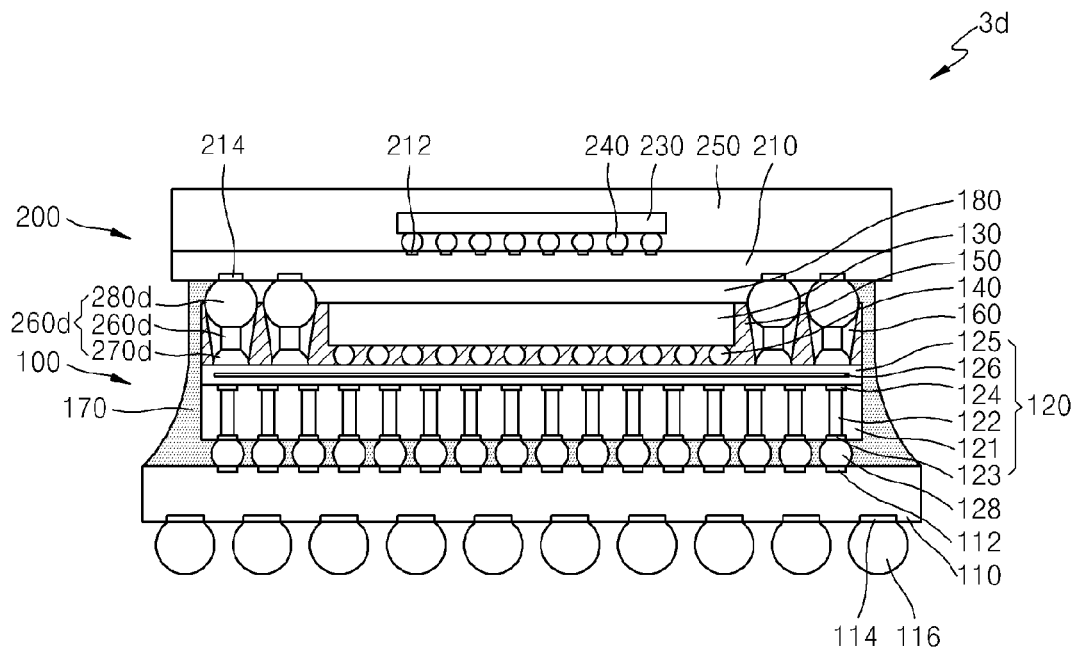

Referring to FIG. 41, the semiconductor package 3d may include the package connecting members 260d that connect the interposer 120 to the upper semiconductor package 200. The package connecting members 260d may include first package connecting members 270d which are electrically connected to the interposer 120, second package connecting members 280d which are electrically connected to the upper semiconductor package 200, and third package connecting members 290d which are located between the first package connecting members 270d and the second package connecting members 280d. The first package connecting members 270d, the second package connecting members 280d, or both of them may have spherical or hemispherical shapes. The third package connecting members 290d may have spherical shapes, hemispherical shapes, cylindrical shapes, or polyprism shapes. The first package connecting members 270d and the second package connecting members 280d may be connected to each other by using a thermal compression process and/or a reflow process and accordingly may be transformed into a one-body structure. The first package connecting members 270*d* may have smaller sizes than the second package connecting members 280*d*. The third package connecting members 290*d* may have smaller sizes than the first package connecting members 270*d*, the second package connecting members 280*d*, or both of them. Alternatively, the first, second, and third package connecting members 270*d*, 280*d*, and 290*d* have a size relationship other than that described herein.

Figure 42:
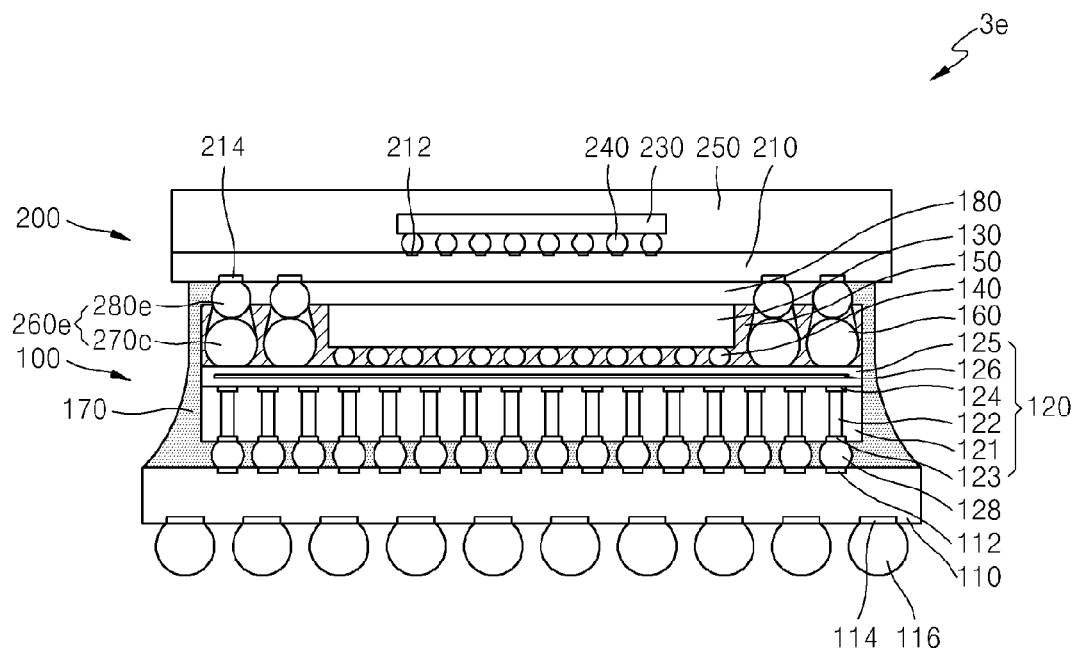

Referring to FIG. 42, the semiconductor package 3*e* may include the package connecting members 260*e* that connect the interposer 120 to the upper semiconductor package 200. The package connecting members 260*e* may include first package connecting members 270*e* which are electrically connected to the interposer 120, and second package connecting members 280*e* which are electrically connected to the upper semiconductor package 200. The first package connecting members 270*e* and the second package connecting members 280*e* may all have spherical shapes. The adhered upper and lower surfaces of the spherical shape may be slightly flattened. The first package connecting members 270*e* and the second package connecting members 280*e* may be connected to each other by using a thermal compression process and/or a reflow process and accordingly may be transformed into a single-body structure. The first package connecting members 270*e* and the second package connecting members 280*e* may have different sizes. For example, the first package connecting members 270*e* may have larger sizes than the second package connecting members 280*e*.

FIGS. 43 through 46 are cross-sectional views illustrating a method of forming a semiconductor package 4 according to some embodiments. In the present embodiment, the processes described with reference to FIGS. 9 through 12 may be performed in advance, and descriptions thereof will be omitted for simplicity.

Figure 43:
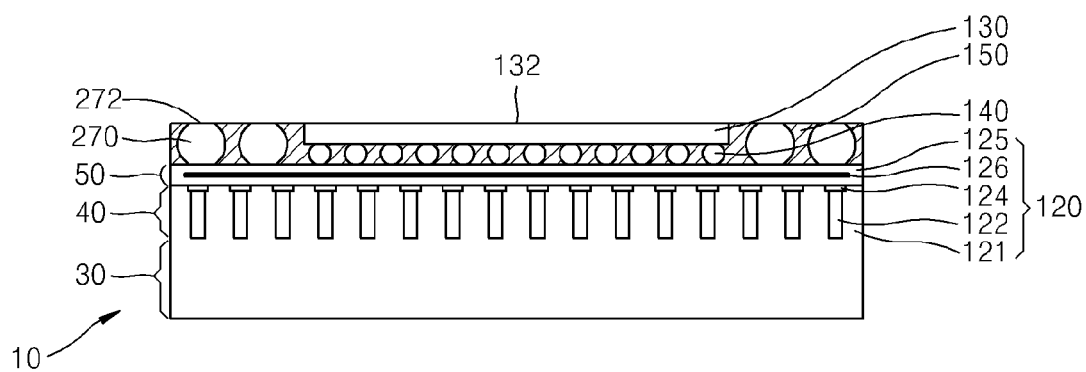
FIGS. 43 through 46 are cross-sectional views illustrating a method of forming a semiconductor package according to some embodiments.

Referring to FIG. 43, the lower molding member 150 located on the lower semiconductor chip 130 is partially removed after the lower molding member 150 sealing the lower semiconductor chip 130 is formed. In the removal, the upper surface 132 of the lower semiconductor chip 130 may be exposed. In addition, the removal may include an operation of thinning the lower semiconductor chip 130 by removing an upper portion of the lower semiconductor chip 130. In the removal, an upper surface 272 of the first package connecting member 270 may be exposed. The removal may be performed by, for example, CMP. Then, the processes described with reference to FIGS. 14 through 16 are performed, and descriptions thereof will be omitted for simplicity. Accordingly, the interposer wafer 10 is thinned, the TSVs 122 penetrating through the interposer wafer 10 are formed, and the interposer connecting members 128 attached to the interposer 120 are formed to be electrically connected to the TSVs 122.

Figure 44:
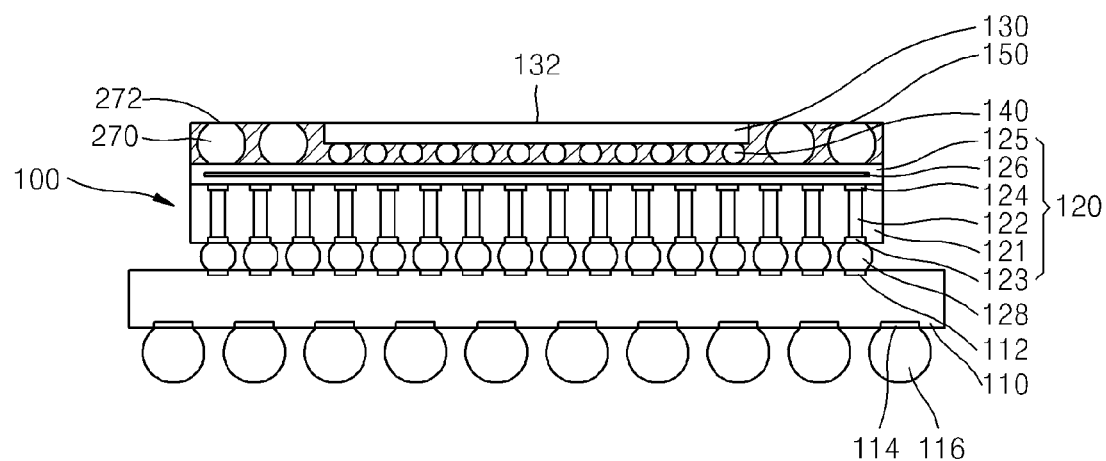

Referring to FIG. 44, the interposer wafer 10 is diced into a plurality of interposers 120 to which the lower semiconductor chip 130 is electrically connected. Then, the process described with reference to FIG. 18 is performed. Accordingly, the interposer 120 may be attached onto the lower base substrate 110, and the lower base substrate 110 and the interposer 120 may be electrically connected to each other via the interposer connecting members 128. The external connecting members 116 may be formed on the lower surface of the lower base substrate 110. Accordingly, the lower semiconductor package 100 may be formed.

Figure 45:
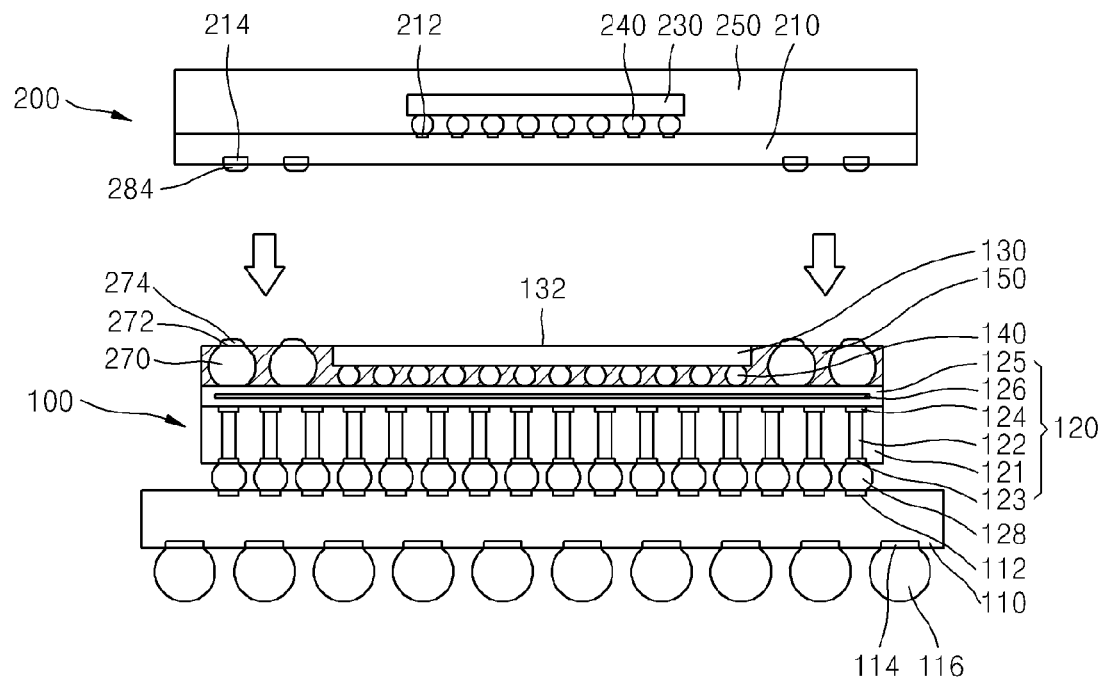

Referring to FIG. 45, the upper semiconductor package 200 is provided. First conductive protrusions 274 may be further formed on upper surfaces 272 of the first package connecting members 270, respectively, of the lower semiconductor package 100. The first conductive protrusions 274 may protrude with respect to the upper surface 132 of the lower semiconductor chip 130. The first conductive protrusions 274 may include a conductive material, and may be formed by using, for example, solder balls, a plating method, or solder paste.

The upper semiconductor package 200 may include second conductive protrusions 284 located to correspond to the first package connecting member 270. The second conductive protrusions 284 are located below the upper base substrate 210 of the upper semiconductor package 200. The second conductive protrusions 284 may protrude with respect to the lower pads 214 of the upper semiconductor chip 230. The second conductive protrusions 284 may include a conductive material, and may be formed by using, for example, solder balls, a plating method, or solder paste.

The upper semiconductor package 200 is located on the lower semiconductor package 100. Then, the lower semiconductor package 100 is electrically connected to the upper semiconductor package 200. For example, the first conductive protrusions 274 are electrically and/or physically connected to the second conductive protrusions 284, respectively. The first conductive protrusions 274 may be connected to the second conductive protrusions 284 by using the thermal compression process and/or the reflow process, and thus package connecting members 260 (see FIG. 46) may be formed. An air gap 180 (see FIG. 46) may be formed between the lower semiconductor package 100 and the upper semiconductor package 200.

Figure 46:
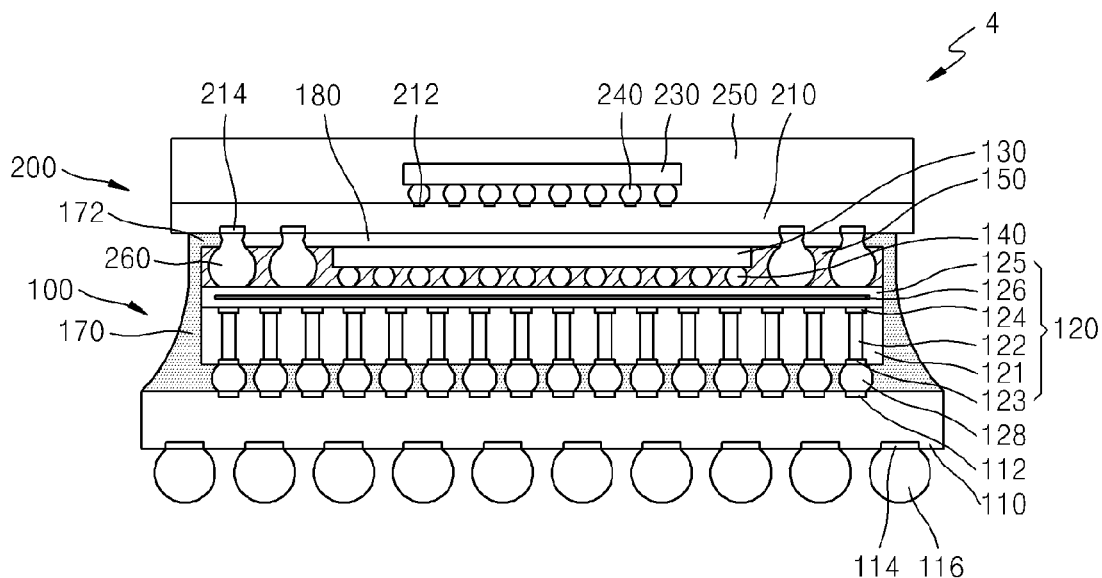

Referring to FIG. 46, the exterior molding member 170 sealing the interposer 120 and the lower semiconductor chip 130 is formed, and thus the formation of the semiconductor package 4 is completed. The process of forming the exterior molding member 170 may be similar to that described with reference to FIG. 22, and description thereof will be omitted for simplicity. The formation of the exterior molding member 170 and the electrical connection between the lower semiconductor package 100 and the upper semiconductor package 200 may be performed in an order reverse to the above-described order.

FIGS. 47 through 53 are cross-sectional views illustrating a method of forming a semiconductor package 5 according to some embodiments. Duplicated descriptions between the embodiments of FIGS. 47 through 53 and the embodiments of FIGS. 9 through 22 will be omitted.

Figure 47:
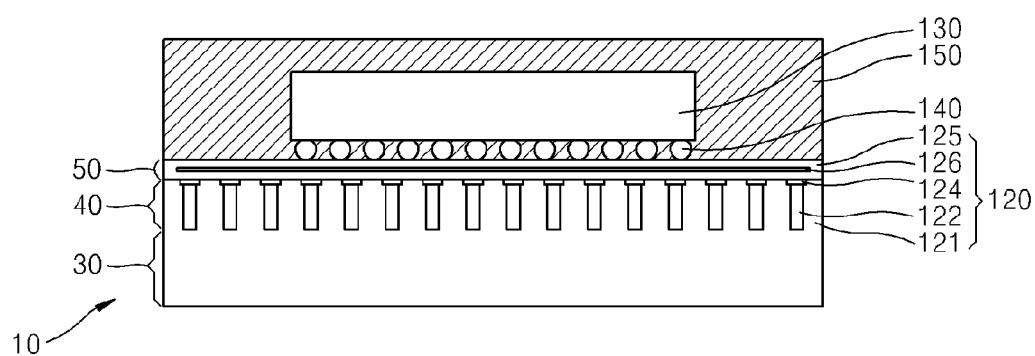
FIGS. 47 through 53 are cross-sectional views illustrating a method of forming a semiconductor package according to some embodiments.

Referring to FIG. 47, the interposer wafer 10 including a plurality of interposers 120 having the TSVs 122 is provided. The lower semiconductor chip 130 is attached onto the interposer wafer 10. The lower connecting members 140 may be located below the lower semiconductor chip 130. The lower semiconductor chip 130 may be electrically connected to the wiring pattern layer 126 of the interposer 120 via the lower connecting members 140. The lower semiconductor chip 130 may also be electrically connected to the TSVs 122 via the lower connecting members 140. Then, the lower molding member 150 sealing the lower semiconductor chip 130 is formed.

Figure 48:
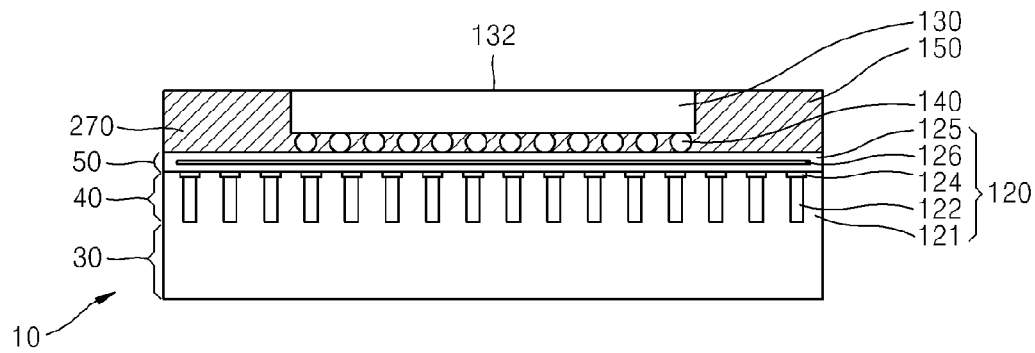

Referring to FIG. 48, the lower molding member 150 located on the lower semiconductor chip 130 is partially removed. In the removal, the upper surface 132 of the lower semiconductor chip 130 may be exposed. In addition, the removal may include an operation of thinning the lower semiconductor chip 130 by removing an upper portion of the lower semiconductor chip 130, and the lower semiconductor chip 130 may be made thin. Then, the processes described with reference to FIGS. 14 through 16 are performed, and descriptions thereof will be omitted for simplicity. Accordingly, the interposer wafer 10 is thinned, the TSVs 122 penetrating through the interposer wafer 10 are formed, and the interposer connecting members 128 attached to the interposer 120 are formed to be electrically connected to the TSVs 122.

Figure 49:
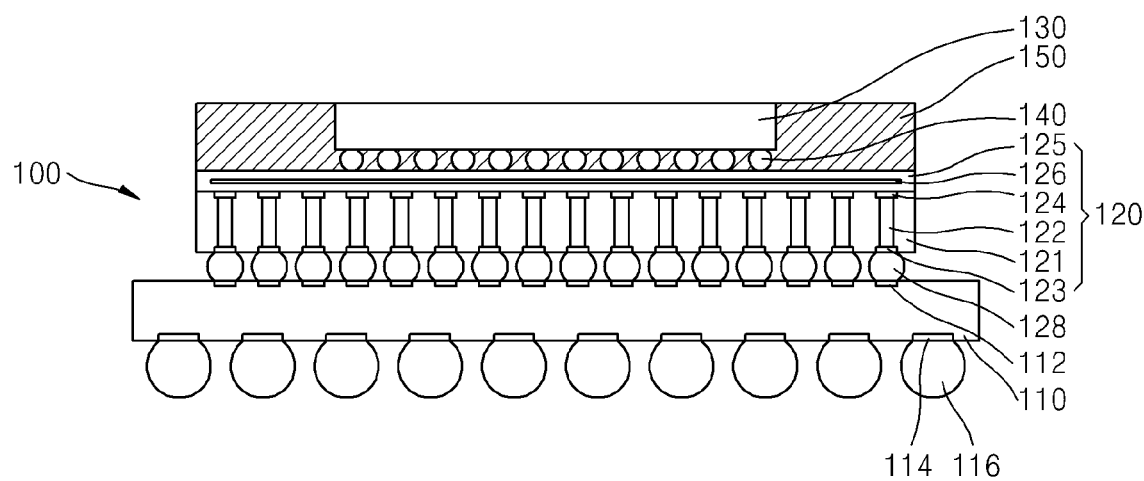

Referring to FIG. 49, the interposer wafer 10 is diced into a plurality of interposers 120. Each interposer 120 may have one or more lower semiconductor chips 130 attached and electrically connected (one shown in FIG. 49). Then, the process described with reference to FIG. 18 is performed. Accordingly, the interposer 120 may be attached onto the lower base substrate 110, and the lower base substrate 110 and the interposer 120 may be electrically connected to each other via the interposer connecting members 128. The external connecting members 116 may be formed on the lower surface of the lower base substrate 110. Accordingly, the lower semiconductor package 100 may be formed.

Figure 50:
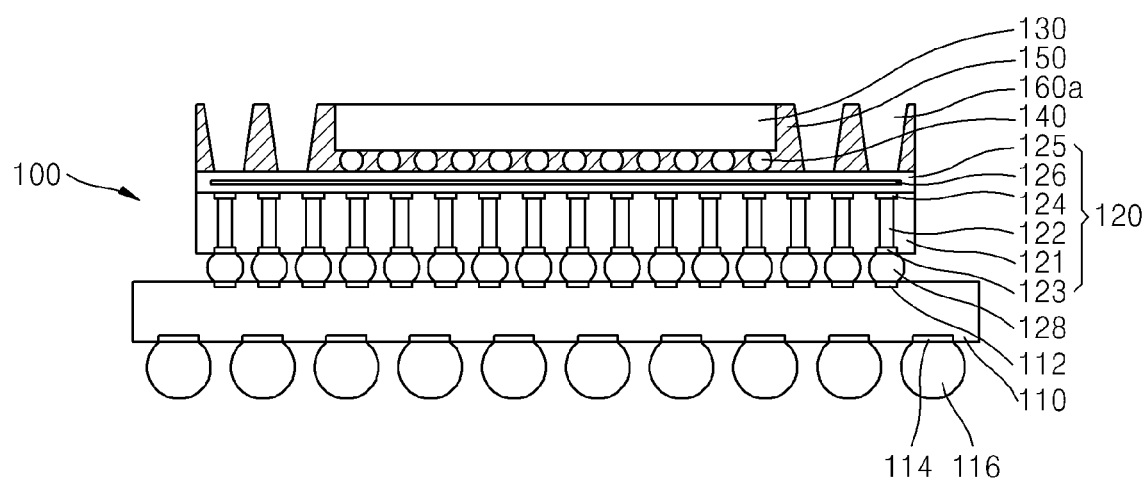

Referring to FIG. 50, the lower molding member 150 is partially removed to form openings 160a exposing the interposer 120. The openings 160a may be formed by lithography etching or by using laser. Each of the openings 160a may extend downward to have the uniform width or to have a narrowing width in the downward direction.

Figure 51:
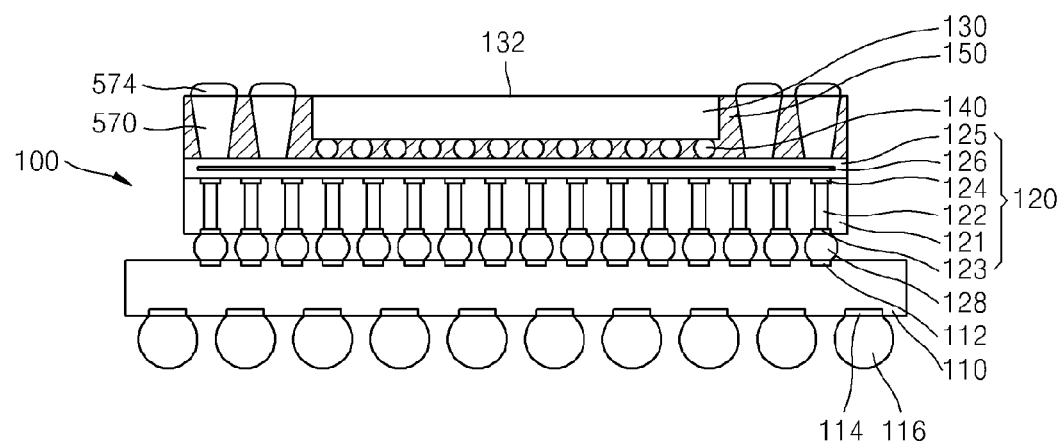

Referring to FIG. 51, the openings 160a are filled with a conductive material, thereby forming first package connecting members 570. First conductive protrusions 574 may be formed on the first package connecting members 570. The first conductive protrusions 574 may protrude with respect to the upper surface 132 of the lower semiconductor chip 130. The first conductive protrusions 574 may include a conductive material, and may be formed by using, for example, solder balls, a plating method, or solder paste.

Figure 52:
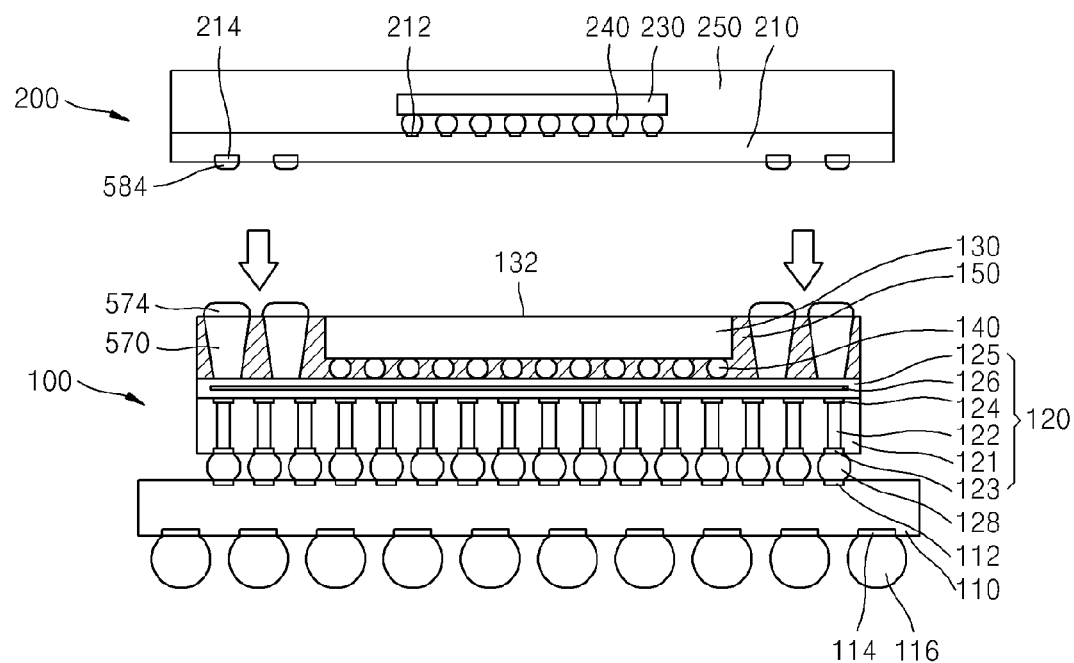

Referring to FIG. 52, the upper semiconductor package 200 is provided. The upper semiconductor package 200 may include second conductive protrusions 584 located to correspond to the first package connecting member 570. The second conductive protrusions 584 are located below the upper base substrate 210 of the upper semiconductor package 200. The second conductive protrusions 584 may protrude with respect to the lower pads 214 of the upper semiconductor chip 230. The second conductive protrusions 584 may include a conductive material, and may be formed by using, for example, solder balls, a plating method, or solder paste.

The upper semiconductor package 200 is located on the lower semiconductor package 100. Then, the lower semiconductor package 100 is electrically connected to the upper semiconductor package 200. For example, the first conductive protrusions 574 are electrically and/or physically connected to the second conductive protrusions 584, respectively. The first conductive protrusions 574 may be connected to the second conductive protrusions 584 by using the thermal compression process and/or the reflow process, and thus package connecting members 560 (see FIG. 53) may be formed. The air gap 180 (see FIG. 53) may be formed between the lower semiconductor package 100 and the upper semiconductor package 200.

Figure 53:
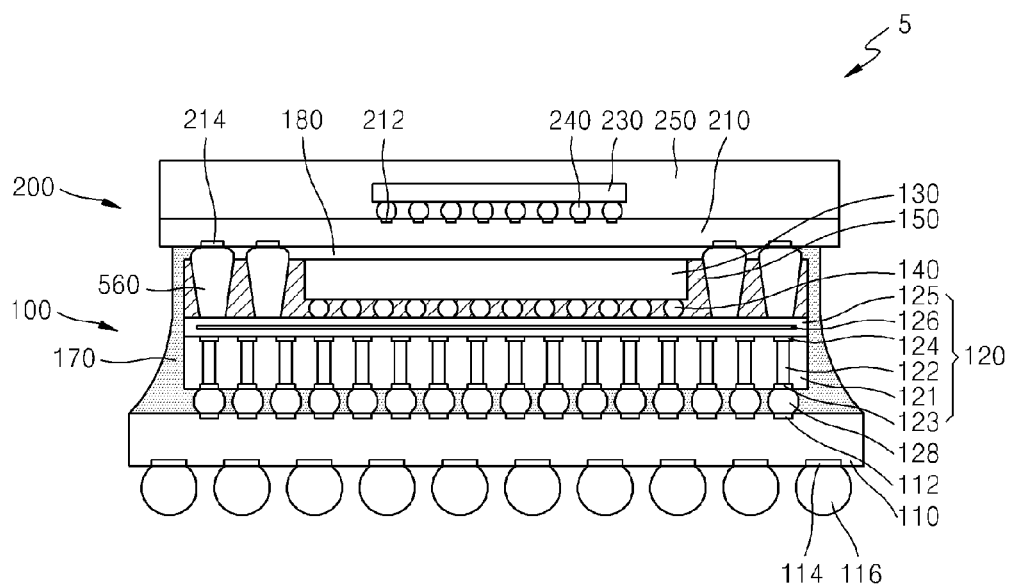

Referring to FIG. 53, the exterior molding member 170 sealing the interposer 120 and the lower semiconductor chip 130 is formed, and thus the formation of the semiconductor package 5 is completed. The process of forming the exterior molding member 170 may be similar to that described with reference to FIG. 22, and description thereof will be omitted for simplicity. The formation of the exterior molding member 170 and the electrical connection between the lower semiconductor package 100 and the upper semiconductor package 200 may be performed in an order reverse to the above-described order.

FIGS. 54 through 57 are cross-sectional views of semiconductor packages 6a, 6b, 6c, and 6d according to further embodiments. Duplicated descriptions between the embodiments 54 through 57 and the embodiment of FIG. 7 will be omitted.

Figure 54:
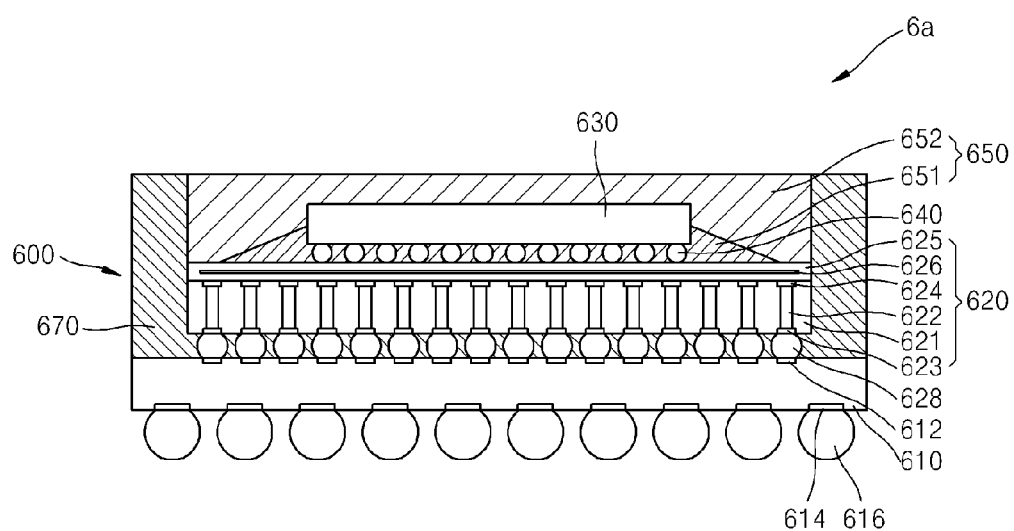
FIGS. 54 through 57 are cross-sectional views of semiconductor packages according to some embodiments.

Referring to FIG. 54, the semiconductor package 6a may include a base substrate 610, an interposer 620, and a semiconductor chip 630. The semiconductor package 6a may include the base substrate 610, the interposer 620 located on the base substrate 610 and having TSVs 622, and the semiconductor chip 630 mounted on the interposer 620 and electrically connected to the interposer 620. The semiconductor package 6a may further include a molding member 670 which seals the interposer 620.

The base substrate 610 may include glass, a ceramic, or plastic. The base substrate 610 may be a substrate for semiconductor packages, for example, a printed circuit board, a ceramic substrate, or a tape wiring substrate. Upper pads 612 may be located on the upper surface of the base substrate 610, and lower pads 614 may be located on the lower surface of the base substrate 610.

External connecting members 616 may be located on the lower pads 614 of the base substrate 610 to be electrically and/or physically connected to the lower pads 114. The lower base substrate 610 may be electrically connected to the outside via the external connecting members 616. The external connecting members 616 may be, for example, solder balls. Alternatively, the external connecting members 616 may form a flipchip connection structure having a grid array such as a pin grid array, a ball grid array, or a land grid array. The external connecting members 616 may not be included.

The interposer 620 may be located on the base substrate 610. The interposer 620 may include a base layer 621, the TSVs 622, first pads 623, second pads 624, an insulating layer 625, and a wiring pattern layer 626. The interposer 620 may correspond to the interposer 20 described with reference to FIG. 7.

The first pads 623 may be located on the lower surface of the base layer 621, and the second pads 624 may be located on the upper surface of the base layer 621. The TSVs 622 may penetrate a part of the base layer 621. The TSVs 622 may electrically connect the first pads 623 to the second pads 624, respectively.

The insulating layer 625 may be located on the base layer 621. The insulating layer 625 may include the wiring pattern layer 626. The wiring pattern layer 626 may be electrically and/or physically connected to the second pads 624 of the interposer 620. Accordingly, the wiring pattern layer 626 may be electrically connected to the TSVs 622.

Interposer connecting members 628 may be located below the base layer 621. The interposer connecting members 628 may be electrically and/or physically connected to the first pads 623 of the interposer 620, and electrically and/or physically connected to the second pads 612 of the base substrate 610. Accordingly, the TSVs 622 may be electrically connected to the base substrate 610 via the interposer connecting members 628. The interposer connecting members 628 may be, for example, solder balls. Alternatively, the interposer connecting members 628 may form a flipchip connection structure having a grid array such as a pin grid array, a ball grid array, or a land grid array.

The semiconductor chip 630 may be located on the interposer 620. The semiconductor chip 630 may be a logic semiconductor chip or a memory semiconductor chip as described above. Lower connecting members 640 may be located below the semiconductor chip 630. The semiconductor chip 630 may be electrically connected to the wiring pattern layer 626 of the interposer 620 via the lower connecting members 640. The semiconductor chip 630 may also be electrically connected to the TSVs 622 via the lower connecting members 640. The lower connecting members 640 may be solder balls, or other types of connecting members, such as alternative connecting members describe elsewhere in this disclosure. For example, the lower connecting members 640 may be bonding wires. Alternatively, the lower connecting members 640 may form a flipchip connection structure having a grid array such as a pin grid array, a ball grid array, or a land grid array.

The lower connecting members 640 may be arranged more densely than the interposer connecting members 628. The lower connecting members 640 may have smaller sizes than the interposer connecting members 628. In this case, the wiring patterns 626 may serve as re-wiring patterns. Relative arrangements and sizes of the lower connecting members 640 and the interposer connecting members 628 should be recognized as exemplary.

The semiconductor chip 630 may be molded by a first molding member 650, and accordingly may be protected from external impacts. The first molding member 650 may extend to seal the lateral side and uppermost side of the semiconductor chip 630. The first molding member 650 may include a first underfill member 651 which is located below the semiconductor chip 630, that is, fills spaces between the lower connecting members 640, surrounding and encapsulating lower connecting members 640, and a first cover member 652 which is located on the first underfill member 651 and seals a lateral surface and uppermost surface of the semiconductor chip 630. The first molding member 650 may be formed by a MUF technique. The first molding member 650 be an insulation material.

The interposer 620 may be sealed by the second molding member 670, and accordingly may be protected from external impacts. The second molding member 670 may extend to fill a space below the interposer 620. The second molding member 670 may fill spaces between the interposer connecting members 628 and may surround and encapsulate interposer connecting members 628. The second molding member 670 may extend to contact and/or seal the lateral side of the first molding member 650. The semiconductor chip 630 may be provided extra packaging protection by the second molding member 670. The second molding member 670 may be formed by a MUF technique. The second molding member 670 be an insulation material. The first molding member 650 and the second molding member 670 may include the same material or different materials.

Figure 55:
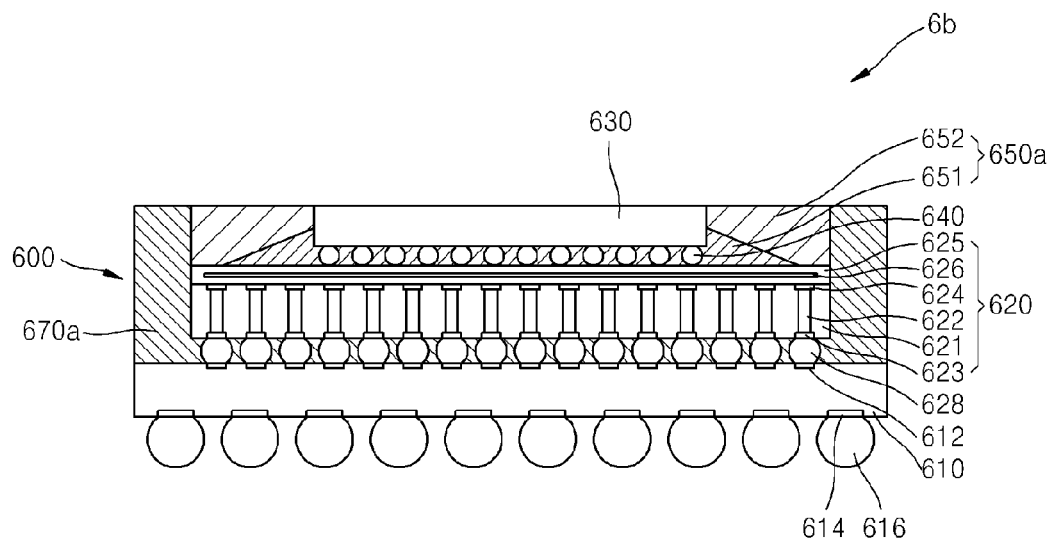

As an alternative to the embodiment shown in FIG. 54, the embodiment shown in FIG. 55 provides first and second molding members 650a and 670a.

Referring to FIG. 55, the semiconductor package 6b may include a base substrate 610, an interposer 620, and a semiconductor chip 630. The semiconductor package 6b may include the base substrate 610, the interposer 620 located on the base substrate 610 and having TSVs 622, and the semiconductor chip 630 mounted on the interposer 620 and electrically connected to the interposer 620. The semiconductor package 6b may further include the molding member 670a which encapsulates and/or seals the interposer 620 and interposer connecting members 628.

The semiconductor chip 630 may be protected by a first molding member 650a, and accordingly may be protected from external impacts and/or the external environment. The first molding member 650a may extend to contact and/or seal the lateral side of the semiconductor chip 630. The uppermost surface of the semiconductor chip 630 may not be sealed by the first molding member 650a and may be exposed with respect to the first molding member 650a. The uppermost surface of the semiconductor chip 630 may be coplanar with the uppermost surface of the first molding member 650a. Alternatively, the uppermost surface of the semiconductor chip 630 and the uppermost surface of the first molding member 650a may lie a distance no more than 5 μm from a first plane. The interposer 620 and interposer connecting members may be sealed by the second molding member 670a, and accordingly may be protected from external impacts and/or the external environment. The second molding member 670a may extend to fill a space below the interposer 620, that is, may fill spaces between the interposer connecting members 628. The second molding member 670a may extend to contact and/or seal the lateral side of the first molding member 650a, and thus the semiconductor chip 630 may be provided additional protection by the second molding member 670a. The second molding member 670a may also be formed by a MUF technique. The uppermost surface of the semiconductor chip 630 may not be sealed by the second molding member 670a and thus may be exposed with respect to the second molding member 670a. The uppermost surfaces of the semiconductor chips 630 may be coplanar with the uppermost surface of the second molding member 670a. Alternatively, the uppermost surface of the semiconductor chip 630 and the uppermost surface of the second molding member 670a may lie a distance no more than 5 μm from a first plane.

Figure 56:
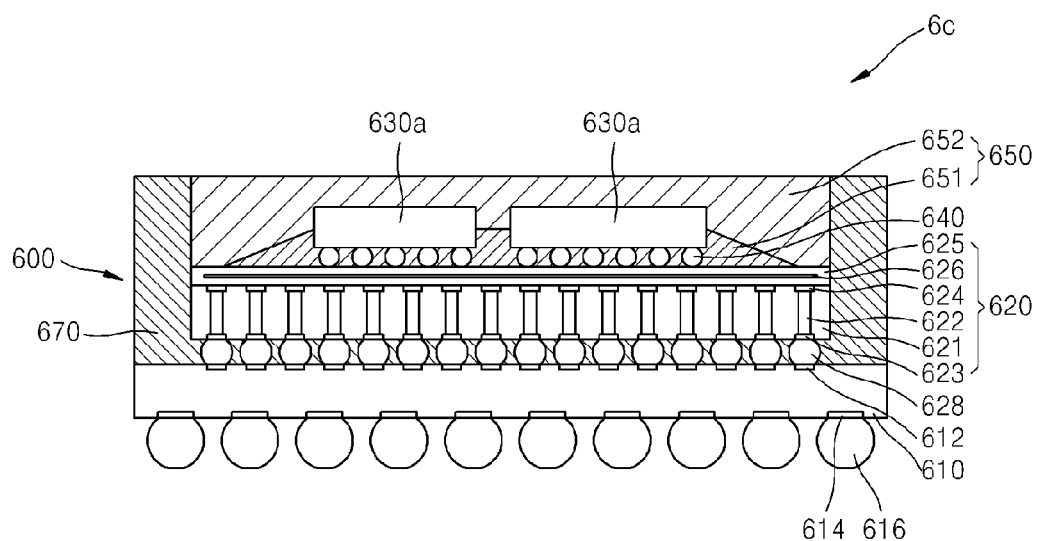
Figure 57:
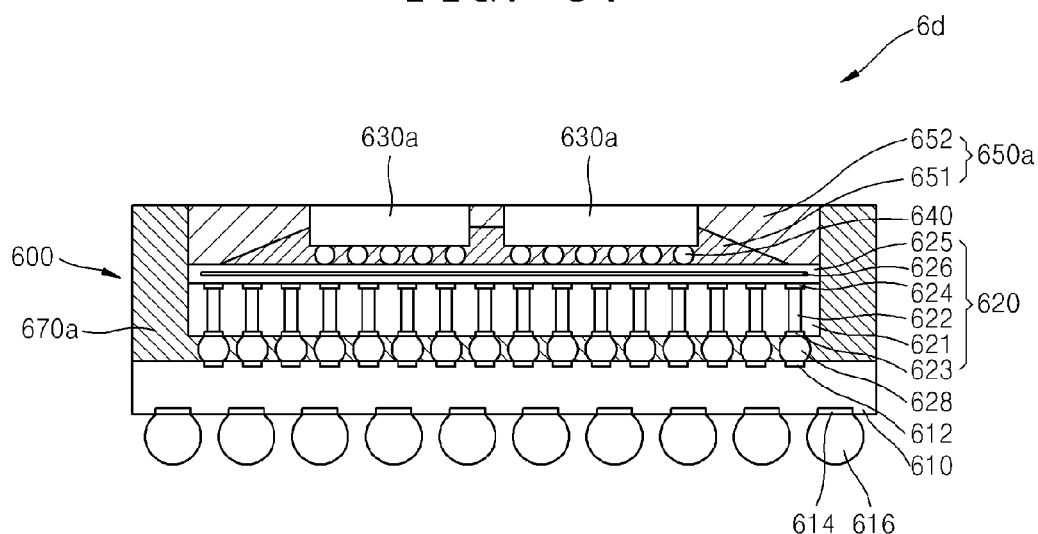
Figure 58:
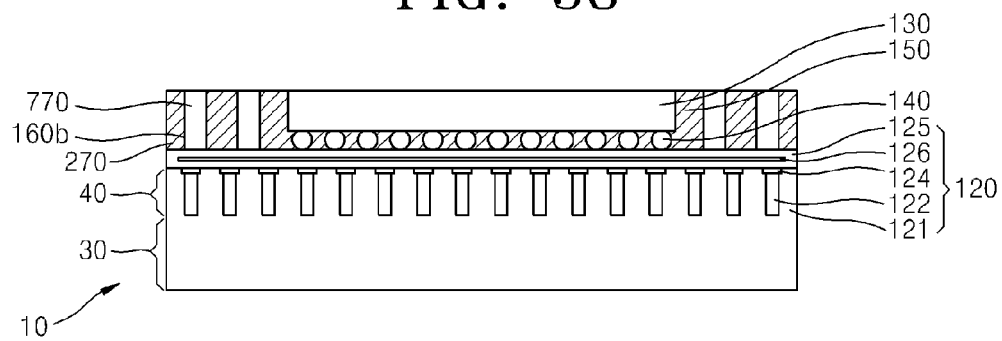
FIGS. 58 through 62 are cross-sectional views illustrating a method of forming semiconductor packages according to some embodiments.

The embodiments of FIGS. 56 and 57 relate to a case where a plurality of semiconductor chips 630 are included, as compared with the embodiments of FIGS. 54 and 55. Accordingly, duplicated descriptions between the embodiments 56 and 57 and the embodiments of FIGS. 54 and 55 will be omitted.

Referring to FIG. 56, the semiconductor package 6c includes a plurality of lower semiconductor chips 630a located on the interposer 620. The semiconductor package 6c includes the first and second molding members 650 and 670 described above with reference to FIG. 54. In other words, the semiconductor chips 630a may be sealed by the first molding member 650 and/or the second molding member 670. The first molding member 670 may extend to contact and/or seal the lateral sides and uppermost sides of the semiconductor chips 630a. The semiconductor chips 630a may be a logic semiconductor chip, a memory semiconductor chip, or a combination of the logic semiconductor chip and the memory semiconductor chip.

Referring to FIG. 57, the semiconductor package 6d includes the plurality of lower semiconductor chips 630a located on the interposer 620. The semiconductor package 6d includes the first and second molding members 650a and 670a described above with reference to FIG. 55. In other words, the semiconductor chips 630a may be sealed by the first molding member 650a and/or the second molding member 670a. The first molding member 670a may extend to seal the lateral sides of the semiconductor chips 630a. The semiconductor chips 630a may be a logic semiconductor chip, a memory semiconductor chip, or a combination of the logic semiconductor chip and the memory semiconductor chip. The uppermost surfaces of the semiconductor chips 630a may not be sealed by the first molding member 650a and thus may be exposed with respect to the first molding member 650a. The uppermost surfaces of the semiconductor chips 630a may be coplanar with the uppermost surface of the first molding member 650a. Alternatively, the uppermost surface of the semiconductor chips 630a and the uppermost surface of the first molding member 650a may lie a distance no more than 5 μm from a first plane. The uppermost surfaces of the semiconductor chip 630a may not be sealed by the second molding member 670a and thus may be exposed with respect to the second molding member 670a. The uppermost surfaces of the semiconductor chips 630a may be coplanar with the uppermost surface of the second molding member 670a. Alternatively, the uppermost surface of the semiconductor chips 630a and the uppermost surface of the second molding member 670a may lie a distance no more than 5 μm from a first plane. The semiconductor chips 630a may be a logic semiconductor chip, a memory semiconductor chip, or a combination of the logic semiconductor chip and the memory semiconductor chip.

FIGS. 58 through 62 are cross-sectional views illustrating a method of forming a semiconductor package 7 according to some embodiments. Duplicated descriptions between the embodiments of FIG. 58 and the embodiments of FIGS. 9 through 22 and FIGS. 47 and 48 will be omitted.

In manufacturing semiconductor package 7, the process steps described above with respect to FIGS. 47 and 48 may have been completed previously. Thus, referring to FIG. 58, starting with a structure shown in FIG. 48, openings 160b may be formed in molding member 150. The openings 160b may be through mold vias (TMVs) that extend through molding member 150. The openings 160b may be formed by photolithographic etching and/or laser cutting. A conductive layer, such as a metal layer, is deposited and planarized to fill each of the openings 160b with a conductive plug 770. The top surfaces of the molding member 150, the conductive plugs 770 and the lower semiconductor chip 130 may be coplanar and/or within 5 μm of a first plane.

Figure 59:
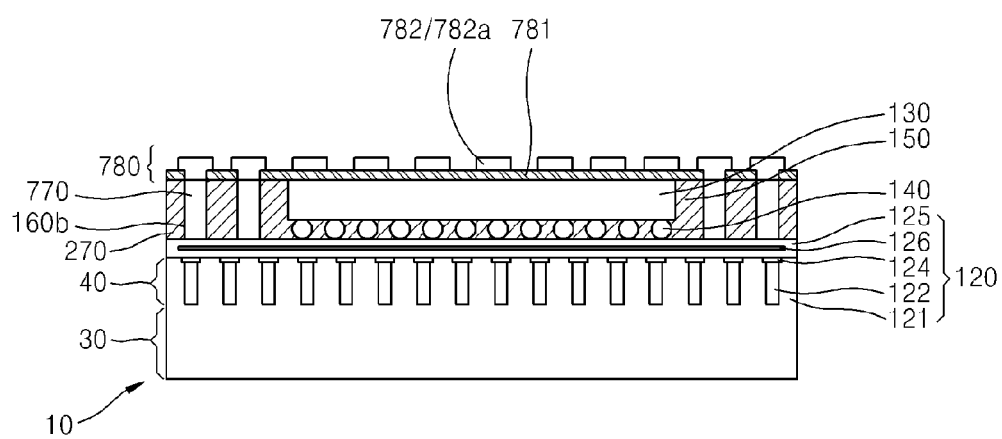

Referring to FIG. 59, a redistribution layer 780 is then formed on the top surfaces of the molding member 150, the conductive plugs 770 and the lower semiconductor chip 130. The redistribution layer may be formed by depositing an insulating layer 781, patterning the insulating layer 781 (e.g., through photolithography) to expose top portions of conductive plugs 770, depositing a conductive layer 782 and patterning the conductive layer 782 to provide pads 782a and a plurality of wiring connections from the conductive plugs to pads 782a. The pads 782a may be formed from the same conductive layer as the wiring connections of the redistribution layer 780. Although only one conductive layer 782 is shown in this embodiment, alternative embodiments contemplate multiple conductive layers may be formed as part of the redistribution layer 780 with corresponding insulating layers sandwiched between neighboring conductive layers.

Figure 60:
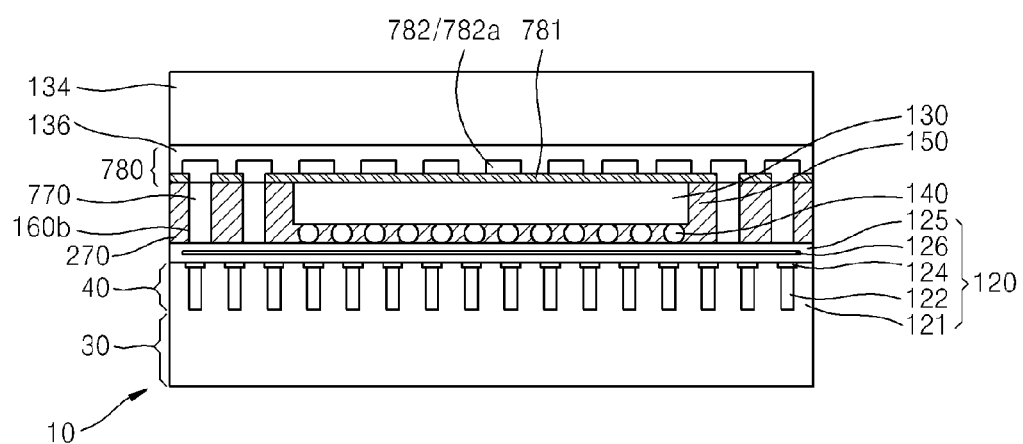

Referring to FIG. 60, an auxiliary substrate 134 is attached to the top surface of the redistribution layer 780 by a glue layer 136. The auxiliary substrate 134 may be the same as auxiliary substrate described with respect to FIG. 14.

Figure 61:
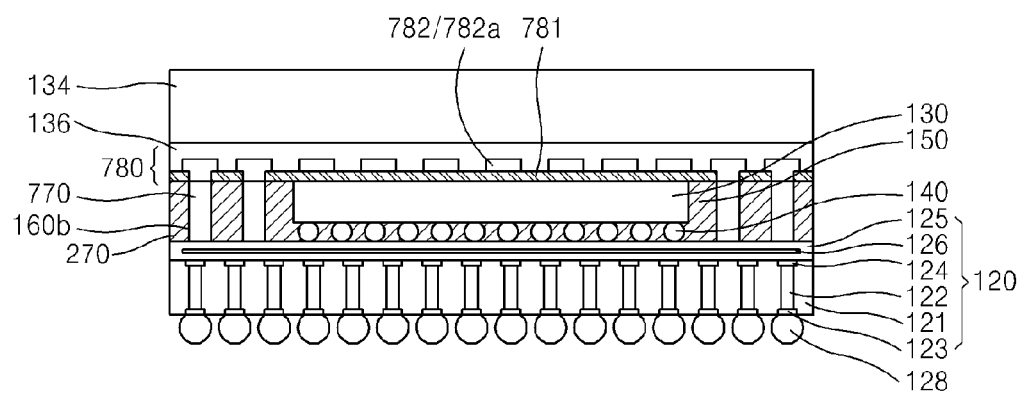

Referring to FIG. 61, the lower portion 130 of the interposer 120 may be removed in a manner described with respect to FIG. 15 (e.g., by grinding, CMP, and/or Smart Cut) and interposer connecting members 128 are attached in a manner described with respect to FIG. 16.

Figure 62:
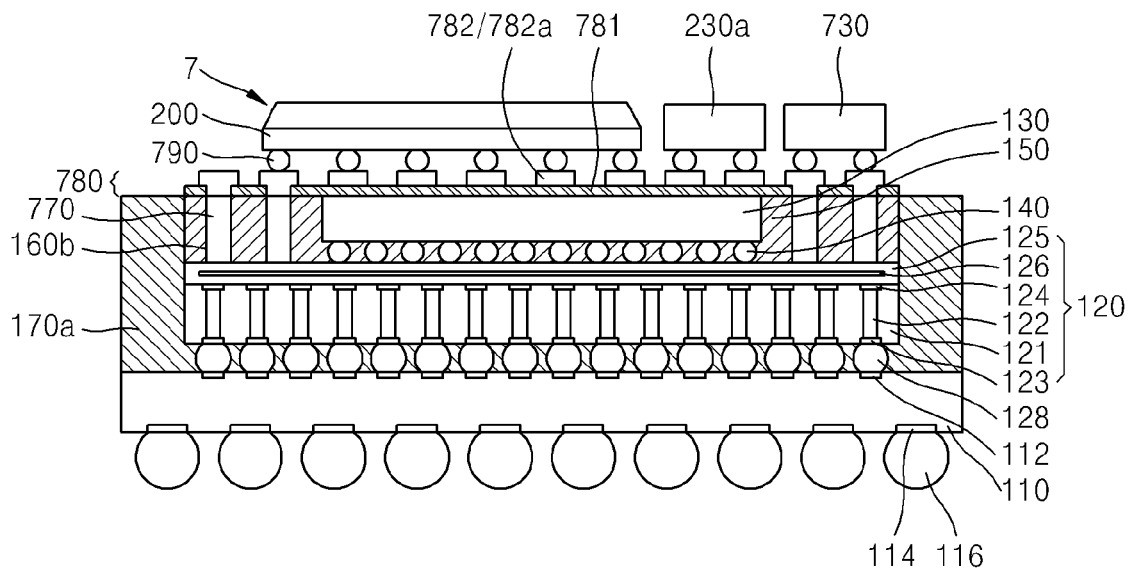

Referring to FIG. 62, the auxiliary substrate 134 and glue layer 136 may be removed and the interposer mounted to a lower base substrate 110 as described with respect to FIGS. 17 and 18. An exterior molding member 170a may be added as described with respect to FIG. 30. The alternative exterior molding members described herein or others may be added in the alternative. Then, electronic devices, such as one or more upper semiconductor packages 200, one or more upper semiconductor chip 230a without full encapsulating packaging, and/or one or more passive electronic components 730 may be connected to the pads 782a of the redistribution layer. Alternatively or in addition, one or more of the passive electronic components 703 may be directly connected to conductive plugs 770 without use of a redistribution layer 780. The passive electronic components may comprise passive electronic devices such as resistors, inductors and/or capacitors, for example. Each of these electronic devices may be connected to the pads 782a by bumps 790. Each of these electronic devices may have electrical connections with lower semiconductor chip 130 and/or with external package terminals in a manner the same as electrical pathways A, C, D and/or E described above with respect to FIG. 8.

Figure 63:
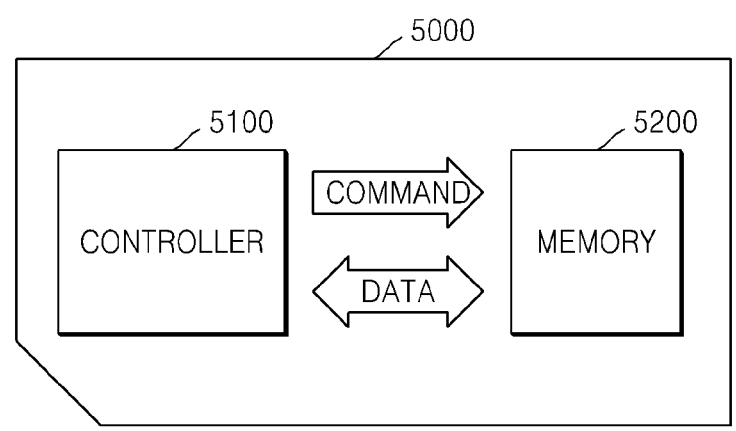
FIG. 63 is a block diagram of a memory card according to an embodiment.

FIG. 63 is a schematic block diagram of a card 5000, such as a memory card, according to an embodiment of the inventive concept.

Referring to FIG. 63, a controller 5100 and a memory 5200 may be arranged to exchange electrical signals with each other. For example, when a command is issued by the controller 5100, the memory 5200 may transmit data. The controller 5100 and/or the memory 5200 may each comprise one or more semiconductor chips as part of a single semiconductor package according to one of the embodiments described herein. For example, controller 5100 may correspond to lower semiconductor chip(s) 130 and memory 5200 may correspond to upper semiconductor chip(s) 230 in the above embodiments described herein (e.g., shown in FIGS. 7, 29, 30, 34-42, 46 and 53 and their alternatives). The memory 5200 may include a memory array (not shown) or a memory array bank (not shown). The card 5000 may be a fixed memory card used in a larger system, or may be a removable memory card, such as, for example, a memory stick card, a smart media (SM) card, a secure digital (SD) card, a mini SD card, or a multi media card (MMC).

Figure 64:
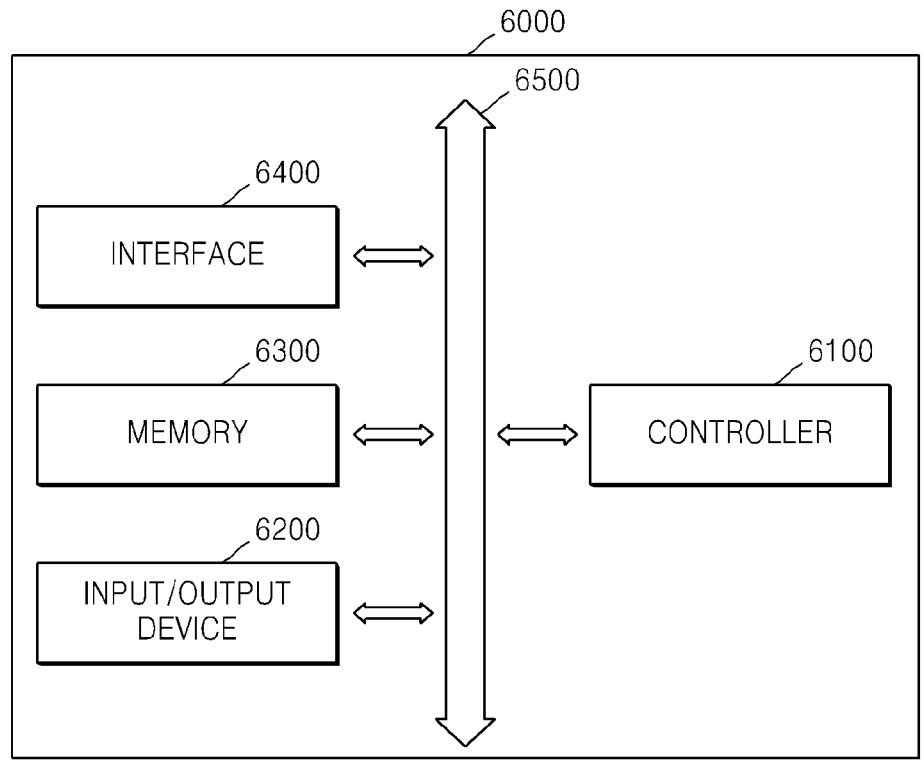
FIG. 64 is a schematic block diagram of a system according to an embodiment.

FIG. 64 is a schematic block diagram of a system 6000 according to an embodiment of the inventive concept.

Referring to FIG. 64, the system 6000 may include a controller 6100, an input/output (I/O) device 6200, a memory 6300, and an interface 6400. The system 6000 may be a mobile device that transmits or receives information. The mobile system may be a PDA, a portable computer, a web tablet, a wireless phone, a mobile phone, a digital music player, or a memory card. The controller 6100 may execute a program and provide control to the system 6000. The controller 6100 may be a microprocessor, a digital signal processor, a microcontroller, or a device similar to these devices. The I/O device 6200 may be used to input or output the data of the system 6000. The system 6000 may be connected to an external device, for example, a personal computer or a network, by using the I/O device 6200, and thus may exchange data with the external device. The I/O device 6200 may be a keypad, a keyboard, or a display. The memory 6300 may store a code and/or data for operating the controller 6100, and/or store data processed by the controller 6100. The controller 6100 and the memory 6300 may each comprise one or more semiconductor chip(s) as part of a single semiconductor package according to one of the embodiments disclosed herein. For example, controller 6100 may correspond to lower semiconductor chip(s) 130 and memory 6300 may correspond to upper semiconductor chip(s) 230 in the above embodiments described herein (e.g., shown in FIGS. 7, 29, 30, 34-42, 46 and 53 and their alternatives). The interface 6400 may be a data transmission path between the system 6000 and another external device. The controller 6100, the I/O device 6200, the memory 6300, and the interface 6400 may communicate with each other via a bus 6500. For example, the system 6000 may be used in a mobile phone, an MP3 player, a navigation system, a portable multimedia player (PMP), a solid state disk (SSD), or household appliances.

Figure 65:
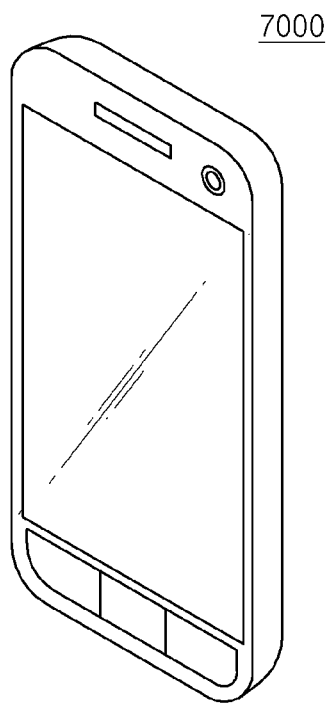
FIG. 65 is a perspective view of an electronic device to which semiconductor devices manufactured according to embodiments.

FIG. 65 is a perspective view of an electronic device to which semiconductor devices manufactured according to embodiments disclosed herein are applicable.

FIG. 65 illustrates a mobile phone 7000 to which the electronic system 6000 of FIG. 64 may be applied. The electronic system 6000 of FIG. 64 may be used in portable notebooks, MP3 players, navigation, SSDs, cars, or household appliances.

While the invention has been particularly shown and described with reference to exemplary embodiments thereof, it will be understood that various changes in form and details may be made therein without departing from the spirit and scope of the following claims.

What is claimed is:

1. A semiconductor package comprising:
a lower semiconductor package comprising:
an interposer formed of a semiconductor material or a glass material comprising a lower surface, an upper surface, lower terminals on a lower surface, upper terminals on an upper surface and through substrate vias extending through at least a substrate of the interposer and electrically connecting ones of the lower terminals of the interposer to corresponding ones of the upper terminals of the interposer;
a lower semiconductor chip mounted to the interposer, the lower semiconductor chip including chip pads electrically connected to at least some of the upper terminals of the interposer; and
a molding material surrounding sides of the lower semiconductor chip;
an upper semiconductor device stacked on the lower semiconductor package comprising:
a lower surface;
terminals at the lower surface; and
an integrated circuit electrically connected to at least some of the terminals on the lower surface; and
conductive bumps disposed on the upper surface of the interposer and extending to the lower surface of the upper semiconductor device and electrically connecting ones of the upper terminals on the upper surface of the interposer to corresponding ones of the terminals at the lower surface of the upper semiconductor device, each of the conductive bumps comprising a lower portion and an upper portion,
wherein the interposer is comprised of silicon, germanium, silicon-germanium, or gallium arsenide.

2. The semiconductor package of claim 1, further comprising:
a passive device comprising terminal pads connected to the conductive bumps.

3. The semiconductor package of claim 2, wherein the passive device comprises at least one of a capacitor, a resistor and an inductor.

4. The semiconductor package of claim 1, further comprising:
a dielectric layer on the lower semiconductor chip; and
a wiring pattern on the dielectric layer,
wherein the upper semiconductor device includes an upper semiconductor package comprising:
an upper package substrate comprising a lower surface, an upper surface, lower terminals on the lower surface, upper terminals on the upper surface in electrical communication with the lower terminals;
an upper semiconductor chip including the integrated circuit mounted to the upper package substrate, the upper semiconductor chip including chip pads electrically connected at least some of the lower terminals of the upper package substrate via the upper terminals; and wherein the upper portion of each of the conductive bumps is connected to a corresponding lower terminal on the lower surface of the upper package substrate,
wherein the upper portion of each of the conductive bumps is connected to a corresponding lower portion of the conductive bumps.

5. The semiconductor package of claim 4, wherein a size of the upper portion of the conductive bumps is larger than a size of the lower portion of the conductive bumps.

6. The semiconductor package of claim 1, the interposer comprises
a wiring pattern connecting upper terminals of the through substrate vias of the interposer to corresponding chip pads of the lower semiconductor chip.

7. The semiconductor package of claim 1, further comprising:
a printed circuit board including an upper surface and a lower surface; and
package terminals attached to the lower surface of the printed circuit board,
wherein the interposer is mounted to the printed circuit board at the upper surface of the printed circuit board.

8. The semiconductor package of claim 7, wherein the printed circuit board includes a redistribution wiring layer, including a first conductor which is electrically connected to a chip pad of the lower semiconductor chip through a first through substrate via of the interposer and connected to a chip pad of the upper semiconductor chip through a second through substrate via of the interposer, but is not connected to any conductive terminals on the lower surface of the printed circuit board, including not being connected to any of the package terminals on the lower surface of the printed circuit board.

9. The semiconductor package of claim 8, wherein the chip pad of the lower semiconductor chip is a data pad connected to a data buffer of the lower semiconductor chip and the chip pad of the upper semiconductor chip is a data pad connected to a data buffer of the upper semiconductor chip.

10. The semiconductor package of claim 8, wherein the chip pad of the lower semiconductor chip is an address pad connected to an address buffer of the lower semiconductor chip and the chip pad of the upper semiconductor chip is an address pad connected to an address buffer of the upper semiconductor chip.

11. The semiconductor package of claim 8, wherein the chip pad of the lower semiconductor chip is a clock pad connected to a clock buffer of the lower semiconductor chip and the chip pad of the upper semiconductor chip is a clock pad connected to a clock buffer of the upper semiconductor chip.

12. The semiconductor package of claim 7, further comprising a package molding material extending at least from the upper surface of the printed circuit board package substrate to the lower surface of the upper package substrate.

13. The semiconductor package of claim 7, further comprising a homogeneous molding on the exterior surface of the lower package, extending at least from a lower surface of the upper package to the upper surface of the printed circuit board package substrate.

14. The semiconductor package of claim 7, wherein the printed circuit board substrate is 220 um or less.

15. The semiconductor package of claim 7, wherein the printed circuit board substrate includes two wiring redistribution layers or less.

16. The semiconductor package of claim 1, wherein the lower semiconductor chip is mounted to the interposer with a face down configuration.

17. The semiconductor package of claim 16, wherein the conductive bumps are first conductive bumps, wherein the lower semiconductor chip includes chip pads at an active surface of the semiconductor chip facing the interposer, and the semiconductor package further comprises:
second conductive bumps extending from the active surface of the semiconductor chip to the interposer, connecting the chip pads of the lower semiconductor chip to corresponding ones of the upper terminals of the interposer, the second conductive bumps having a height of 20 um or less.

18. The semiconductor package of claim 17, wherein the second conductive bumps directly connect the chip pads of the lower semiconductor chip to corresponding ones of the upper terminals of the interposer.

19. The semiconductor package of claim 1, wherein the lower chip has a first surface facing the upper surface of the interposer and a second surface opposite the first surface, and the package further comprises:
an air gap between the second surface of the lower semiconductor chip and the lower surface of the upper package substrate.

20. The semiconductor package of claim 19, wherein the air gap has a thickness of 50 um or less.

21. The semiconductor package of claim 1, wherein the conductive bumps extend from the upper surface of the interposer to the lower terminals on the lower surface of the upper package substrate.

22. The semiconductor package of claim 21, wherein the conductive bumps have a height of 120 um or less.

23. The semiconductor package of claim 1, wherein the upper surface of the interposer has a root mean square surface roughness less than 1.3 nm.

24. The semiconductor package of claim 1, wherein the interposer includes a wiring redistribution layer.

25. The semiconductor package of claim 24, wherein the wiring redistribution layer includes a redistribution pattern including a first conductor that is electrically isolated from the lower semiconductor chip.

26. The semiconductor package of claim 24, wherein the wiring redistribution layer includes a redistribution pattern having a pitch between at least some of adjacent conductors of the redistribution pattern of 10 um or less.

27. The semiconductor package of claim 24, wherein the wiring redistribution layer includes a redistribution pattern having a pitch between at least some of adjacent conductors of the redistribution pattern of 5 um or less.

28. The semiconductor package of claim 1, wherein the CTE of the interposer is no greater than about twice the CTE of the lower semiconductor chip.

29. The semiconductor package of claim 1, wherein the CTE of the interposer is no greater than about 1.3 times the CTE of the lower semiconductor chip.

30. The semiconductor package of claim 1, wherein the CTE of the interposer is substantially equal to the CTE of the lower semiconductor chip.

31. The semiconductor package of claim 1,
wherein a first conductive node comprises a first lower terminal of the interposer, a first through substrate via of the interposer, a first upper terminal of the interposer, a first conductive bump disposed on the interposer, a first lower terminal on the lower surface of the upper package substrate, and a first upper terminal of the upper surface of the upper package substrate, and a Vdd chip pad of the upper semiconductor chip connected to provide a Vdd power supply to an internal power supply circuit of the upper semiconductor chip;

wherein a second conductive node comprises a second lower terminal of the interposer, a second through substrate via of the interposer, a second upper terminal of the interposer, a second conductive bump disposed on the interposer, a second lower terminal on the lower surface of the upper package substrate, a second upper terminal of the upper surface of the upper package substrate, a Vss chip pad of the upper semiconductor chip connected to provide a Vss power supply to the internal power supply circuit of the upper semiconductor chip, and a Vss chip pad of the lower semiconductor chip connected to provide a Vss power supply to an internal power supply circuit of the lower semiconductor chip, wherein a third conductive node comprises a third lower terminal of the interposer, a third through substrate via of the interposer, and a Vdd chip pad of the lower semiconductor chip connected to provide a Vdd power supply to the internal power supply circuit of the lower semiconductor chip, and wherein the first conductive node, the second conductive node and the third conductive node are each different from each other, wherein the first conductive node does not provide a Vdd power supply to the lower semiconductor chip, and wherein the third conductive node does not provide a Vdd power supply to the upper semiconductor chip.

32. The semiconductor package of claim 1, wherein a bulk material of the interposer is composed of a rigid material having a Young's modulus of 100 GPa or more.

33. A semiconductor package comprising:
an upper semiconductor package; and
a lower semiconductor package, the upper semiconductor package being stacked on the lower semiconductor package,
wherein the lower package comprises:
an interposer formed of a semiconductor material or a glass material comprising a lower surface, an upper surface, lower terminals on a lower surface, upper terminals on an upper surface and through substrate vias extending through at least a substrate of the interposer and electrically connecting respective ones of the lower terminals of the interposer to ones of the upper terminals of the interposer;
a lower semiconductor chip mounted to the interposer, the lower semiconductor chip including chip pads electrically connected to at least some of the upper terminals of the interposer;
conductive bumps disposed on the upper surface of the interposer adjacent to the lower semiconductor chip and electrically connected to at least some of the upper terminals of the interposer; and
a molding material surrounding sides of the lower semiconductor chip, wherein the upper semiconductor package comprises:
an upper package substrate comprising a lower surface, an upper surface, lower terminals on the lower surface, upper terminals on the upper surface in electrical communication with the lower terminals, the lower terminals of the upper package substrate being electrically connected to the conductive bumps; and
an upper semiconductor chip mounted to the upper package substrate, the upper semiconductor chip including chip pads electrically connected to at least some of the upper terminals of the upper package substrate,
wherein the interposer is comprised of silicon, germanium, silicon-germanium, or gallium arsenide.

34. The package of 33, wherein an upper surface of the molding material is coplanar with an upper surface of the lower semiconductor chip.

35. The package of claim 33, wherein an entire uppermost surface of the molding material and an entire uppermost surface of the lower chip lie within 5 um of a first plane.

36. The package of claim 33, wherein an upper surface of the molding material is flush with an upper surface of the lower semiconductor chip.

37. The package of claim 33,
wherein at least some of the conductive bumps are regularly spaced with a pitch of 0.4 mm or less.

38. The package of claim 33,
wherein the lower chip has a first surface facing the upper surface of the interposer and a second surface opposite the first surface, and
wherein a distance from the second surface of the lower chip to the upper surface of the interposer is 70 um or less.

39. A semiconductor package comprising:
an upper semiconductor package; and
a lower semiconductor package, the upper semiconductor package being stacked on the lower semiconductor package,
wherein the lower package comprises:
   an interposer comprising a lower surface, an upper surface, lower terminals on a lower surface, upper terminals on an upper surface and through substrate vias extending through at least a substrate of the interposer and electrically connecting respective ones of the lower terminals of the interposer to ones of the upper terminals of the interposer;
   a lower semiconductor chip mounted to the interposer, the lower semiconductor chip including chip pads electrically connected to at least some of the upper terminals of the interposer, the lower chip having a thickness of 50 um or less;
   conductive bumps disposed on the upper surface of the interposer adjacent to the lower semiconductor chip and electrically connected to at least some of the upper terminals of the interposer;
wherein the upper semiconductor package comprises:
   an upper package substrate comprising a lower surface, an upper surface, lower terminals on the lower surface, upper terminals on the upper surface in electrical communication with the lower terminals, the lower terminals of the upper base substrate being electrically connected to the conductive bumps; and
   an upper semiconductor chip mounted to the upper package substrate, the upper semiconductor chip including chip pads electrically connected to at least some of the upper terminals of the upper package substrate,
wherein the interposer is comprised of silicon, germanium, silicon-germanium, or gallium arsenide.

* * * * *